(12) United States Patent
Ooishi

(10) Patent No.: US 7,313,014 B2
(45) Date of Patent: Dec. 25, 2007

(54) THIN FILM MAGNETIC MEMORY DEVICE AND SEMICONDUCTOR INTEGRATED CIRCUIT DEVICE INCLUDING THE SAME AS ONE OF CIRCUIT BLOCKS

(75) Inventor: Tsukasa Ooishi, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/188,089

(22) Filed: Jul. 25, 2005

(65) Prior Publication Data

US 2006/0002216 A1      Jan. 5, 2006

Related U.S. Application Data

(62) Division of application No. 10/441,016, filed on May 20, 2003, now Pat. No. 6,928,015.

(30) Foreign Application Priority Data

Jun. 25, 2002 (JP) ............................. 2002-184916
Oct. 25, 2002 (JP) ............................. 2002-311463

(51) Int. Cl.
    *G11C 11/00* (2006.01)
(52) U.S. Cl. ...................... 365/158; 365/173
(58) Field of Classification Search ................. 365/158, 365/173
    See application file for complete search history.

(56) References Cited

U.S. PATENT DOCUMENTS 6,104,633 A      8/2000  Abraham et al.
6,317,376 B1    11/2001  Tran et al.
6,324,093 B1    11/2001  Perner et al.
6,795,335 B2     9/2004  Hidaka
6,807,086 B2 *  10/2004  Kajiyama ................... 365/157

FOREIGN PATENT DOCUMENTS

CN          1345071 A          4/2002

OTHER PUBLICATIONS

"A 10ns Read and Write Non-Volatile Memory Array Using a Magnetic Tunnel Junction and FET Switch in Each Cell", Scheuerlein et al., IEEE ISSCC Digest of Technical Papers, TA7.2, Feb. 2000, pp. 94-95, 128-129, 409-410.
"Nonvolatile RAM based on Magnetic Tunnel Junction Elements", Durlam et al., IEEE ISSCC Digest of Technical Papers, TA7.3, Feb. 2000, pp. 96-97, 130-131, 410-411.
Chinese Office Action issued in Chinese Application No. CN 031487629, dated Mar. 30, 2007.

* cited by examiner

*Primary Examiner*—Hoai V. Ho
(74) *Attorney, Agent, or Firm*—McDermott Will & Emery LLP

(57) ABSTRACT

Shape dummy cells that are designed to have the same dimensions and structures as MTJ memory cells are additionally provided in the peripheral portion of an MTJ memory cell array in which normal MTJ memory cells for storing data are arranged in a matrix. The MTJ memory cells and the shape dummy cells are sequentially arranged so as to have a uniform pitch throughout the entirety. Accordingly, non-uniformity between MTJ memory cells in the center portion and in border portions of the MTJ memory cell array, respectively, after manufacture due to high and low densities of the surrounding memory cells can be eliminated.

6 Claims, 35 Drawing Sheets

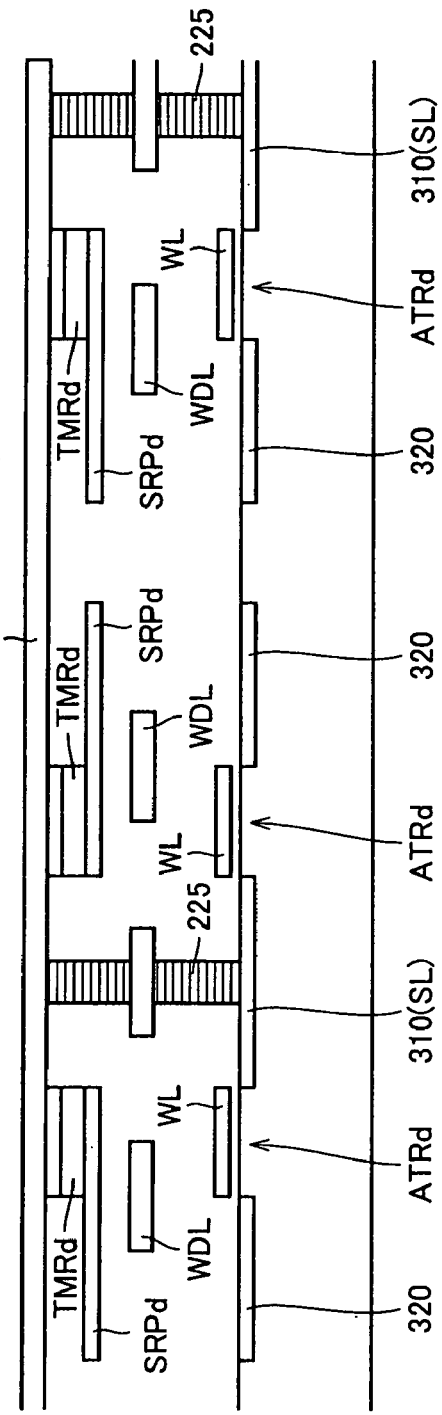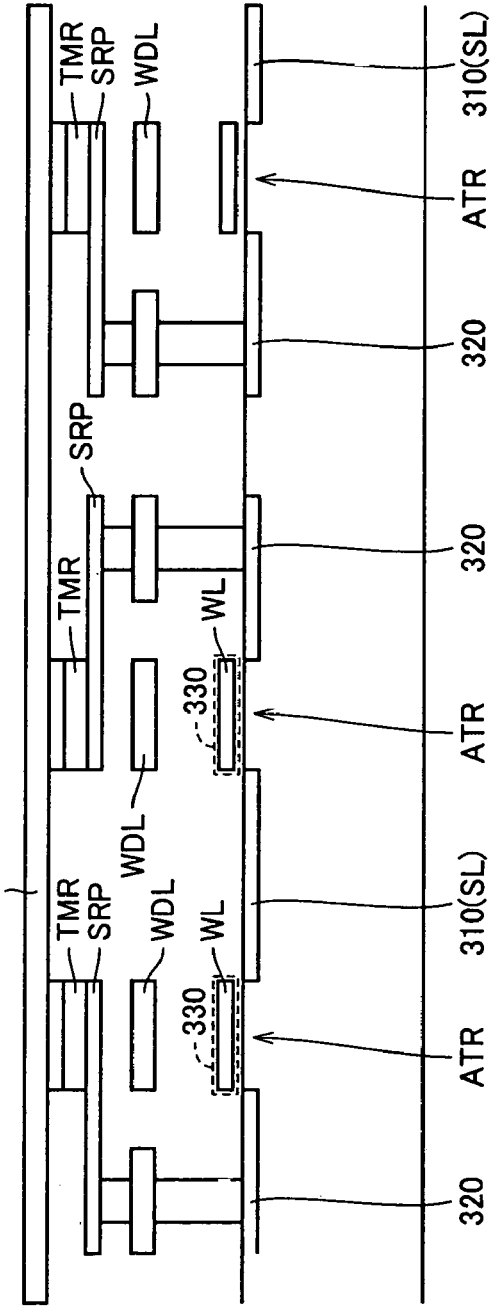
FIG.13A  REGION 200 PORTION
FIG.13B  NORMAL MEMORY CELL PORTION 725  727  726  710

311#  PTR  321#

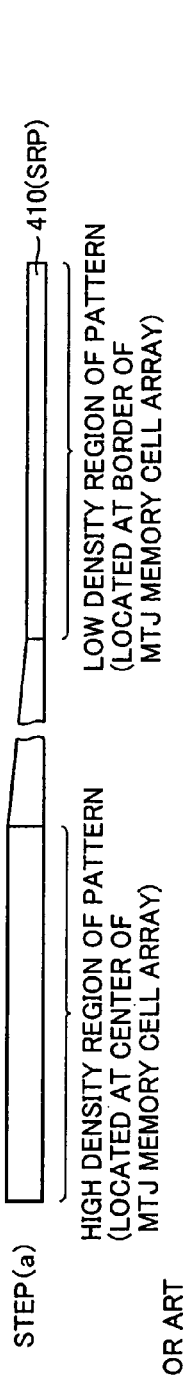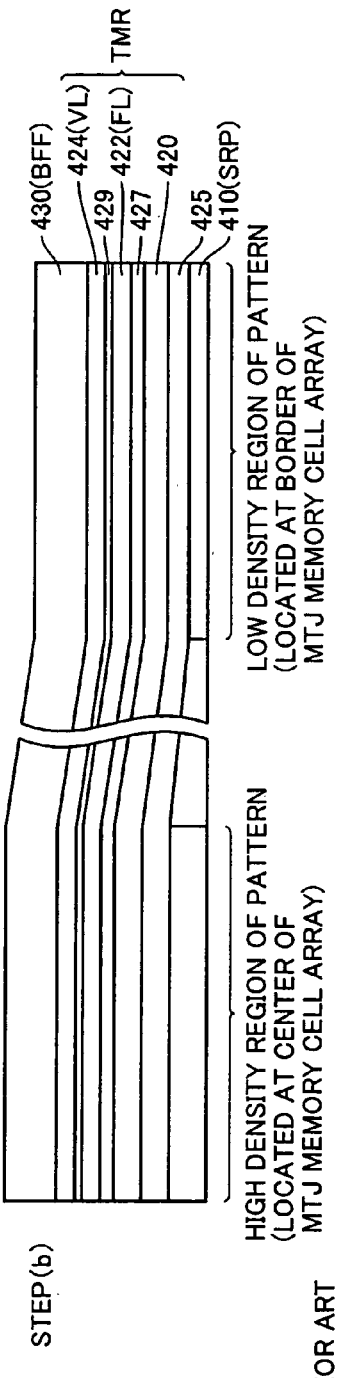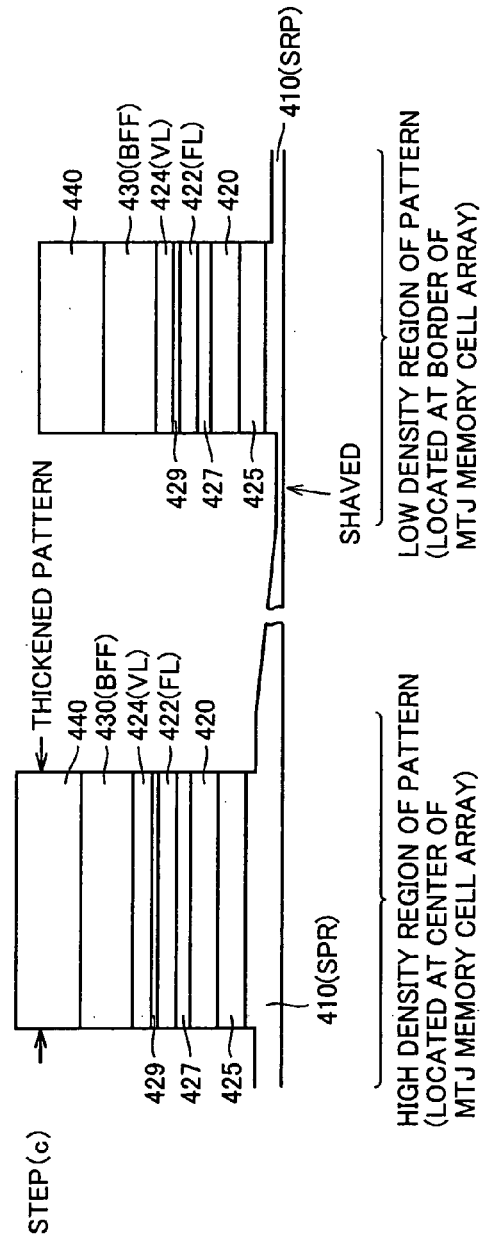
FIG.45A PRIOR ART
FIG.45B PRIOR ART
FIG.45C PRIOR ART

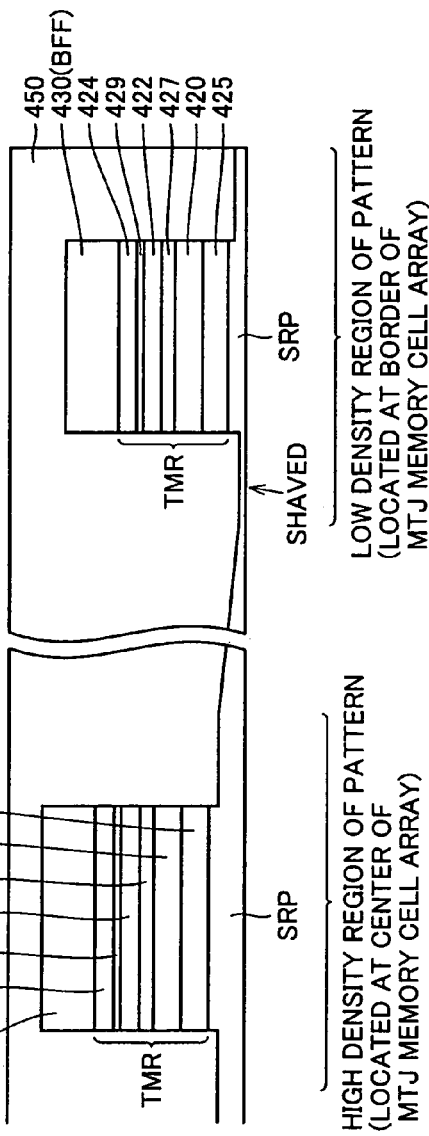
FIG.45D PRIOR ART STEP(d)
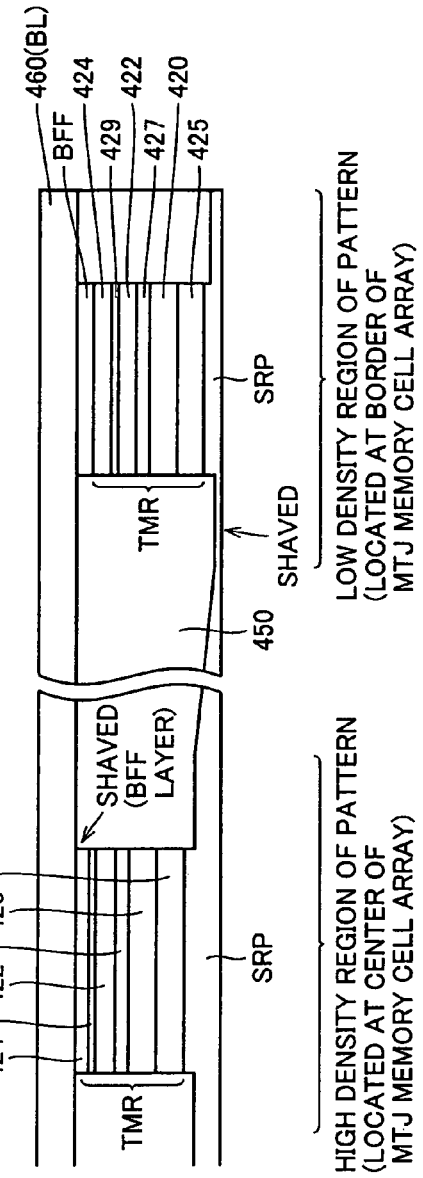
FIG.45E PRIOR ART STEP(e)

THIN FILM MAGNETIC MEMORY DEVICE AND SEMICONDUCTOR INTEGRATED CIRCUIT DEVICE INCLUDING THE SAME AS ONE OF CIRCUIT BLOCKS

RELATED APPLICATION

This application is a divisional of application Ser. No. 10/441,016 filed May 20, 2003, now U.S. Pat. No. 6,928,015.

BACKGROUND OF THE INVENTION

1. Field of the Invention

The present invention relates to a thin film magnetic memory device, and more particularly to a thin film magnetic memory device provided with a memory cell having a magnetic tunnel junction (MTJ) and a semiconductor integrated circuit device including the thin film magnetic memory device as one of circuit blocks.

2. Description of the Background Art

MRAM (Magnetic Random Access Memory) devices have obtained attention as memory devices that can store nonvolatile data while consuming low power. An MRAM device is a memory device using a plurality of thin film magnetic materials formed in a semiconductor integrated circuit for storing nonvolatile data and for allowing random access to the respective thin film magnetic materials.

In particular, rapid progress in the performance of MRAM devices due to the use of a thin film magnetic material, wherein a magnetic tunnel junction is utilized, as a memory cell has been announced in recent years in, for example, "A ions Read and Write Non-Volatile Memory Array Using a Magnetic Tunnel Junction and FET Switch in each Cell" by Roy Scheuerlein, et al., 2000 IEEE ISSCC Digest of Technical Papers, TA7.2 and in "Nonvolatile RAM based on Magnetic Tunnel Junction Elements" by M. Durlam, et al., 2000 IEEE ISSCC Digest of Technical Papers, TA7.3.

FIG. 39 is a schematic diagram showing the configuration of a memory cell (hereinafter, simply referred to as an MTJ memory cell) having a magnetic tunnel junction.

With reference to FIG. 39, the MTJ memory cell includes a tunneling magneto-resistance element TMR wherein the electric resistance changes in accordance with the data level of the memory data that has been magnetically written in and an access transistor ATR. Access transistor ATR is connected between a bit line BL and a source line SL so as to be in series with tunneling magneto-resistance element TMR. Typically, a field-effect transistor is utilized as access transistor ATR.

A bit line BL for allowing a data write current and a data read current to flow at the time of data write and data read, respectively, a write digit line WDL for allowing a data write current to flow at the time of data write, a word line WL for indicating data read and a source line SL for pulling tunneling magneto-resistance element TMR down to ground voltage GND at the time of data read are provided as wires directly affecting the MTJ memory cell.

FIG. 40 is a schematic diagram for describing the data write operation to the MTJ memory cell.

With reference to FIG. 40, tunneling magneto-resistance element TMR has a magnetic layer FL (hereinafter, simply referred to as a fixed magnetic layer FL) having a fixed direction of magnetization and a magnetic layer VL hereinafter, simply referred to as a free magnetic layer VL) that is magnetized in the direction in accordance with a data write magnetic field generated by a data write current. A tunneling barrier TB formed of an insulating film is provided between fixed magnetic layer FL and free magnetic layer VL. Free magnetic layer VL is magnetized in the same direction as, or in the opposite direction to, (positive direction or negative direction) fixed magnetic layer FL in accordance with the level of memory data to be written in.

The electric resistance of tunneling magneto-resistance element TMR changes in accordance with the relative relationships between fixed magnetic layer FL and free magnetic layer VL in regard to the direction of magnetization. Concretely, the electric resistance is reduced in the case where the directions of magnetization for fixed magnetic layer FL and free magnetic layer VL are the same in comparison with the case wherein the directions of magnetization for fixed magnetic layer FL and free magnetic layer VL are opposite to each other.

A strap SRP formed of a conductive material is formed as a lower layer of tunneling magneto-resistance element TMR in order to electrically couple tunneling magneto-resistance element TMR and access transistor ATR.

Word line WL is inactivated at the time of data write so that access transistor ATR is turned off. In this condition, a data write current for magnetizing free magnetic layer VL is made to flow in the direction in accordance with the level of write data through bit line BL and through write digit line WDL, respectively. That is to say, the direction of magnetization of free magnetic layer VL is determined by the direction of the data write current flowing through bit line BL and through write digit line WDL, respectively.

FIG. 41 is a conceptual diagram showing the relationship between the data write current and the condition of magnetization of the MTJ memory cell.

With reference to FIG. 41, lateral axis H (EA) indicates a magnetic field applied to free magnetic layer VL within tunneling magneto-resistance element TMR in the easy axis direction. On the other hand, longitudinal axis H (HA) indicates a magnetic field influencing free magnetic layer VL in the hard axis direction. Magnetic fields H (EA) and H (HA), respectively, correspond to two magnetic fields generated by currents flowing through bit line BL and through write word line WWL, respectively.

The direction of fixed magnetization of fixed magnetic layer FL is along the easy axis while free magnetic layer VL is magnetized in the (same) direction parallel to fixed magnetic layer FL or in the (opposite) direction anti-parallel to fixed magnetic layer FL along the easy axis in the MTJ memory cell. In the following, the electric resistances of tunneling magneto-resistance element TMR corresponding to the two magnetic directions of free magnetic layer VL, respectively, are denoted as R1 and R0 (here R1>R0) in the present specification. The MTJ memory cell can store data of one bit ("1" and "0") corresponding to these two magnetic directions of free magnetic layer VL.

The magnetic directions of free magnetic layer VL can be rewritten only in the case where the sum of applied magnetic fields H (EA) and H (HA) reach to the region outside of the asteroid characteristics curves shown in FIG. 41. That is to say, in the case where the applied data write magnetic field has an intensity corresponding to a region inside of the asteroid characteristic curves, the magnetic direction of free magnetic layer VL does not change.

As shown in the asteroid characteristic curves, the magnetization threshold value required to switch the magnetic direction along the easy axis can be lowered by applying a magnetic field in the direction of the hard axis to free magnetic layer VL.

In the case where the operational point at the time of data write is set as in the example of FIG. 41, the data write magnetic field in the direction of the easy axis is set so that the intensity thereof becomes $H_{WR}$ in the MTJ memory cell, which is the object for data write. That is to say, the values of the data write currents flowing through bit line BL and through write word line WWL are set so that this data write magnetic field $H_{WR}$ can be obtained. In general, data write magnetic field $H_{WR}$ is shown as the sum of switching magnetic field $H_{SW}$ required for switching of the direction of magnetization and the amount of margin $\Delta H$. That is to say, the equation $H_{WR}=H_{SW}+\Delta H$ holds.

FIG. 42 is a conceptual diagram for describing data read from the MTJ memory cell.

With reference to FIG. 42, access transistor ATR turns on in response to the activation of word line WL at the time of data read. Thereby, tunneling magneto-resistance element TMR is electrically coupled to bit line BL under the condition wherein tunneling magneto-resistance element TMR is pulled down to ground voltage GND. In this condition, a data read current Is is made to flow through a current path that includes bit line BL and tunneling magneto-resistance element TMR and, thereby, a change in voltage in accordance with the electric resistance of tunneling magneto-resistance element TMR, that is to say, in accordance with the level of the storage data of the MTJ memory cell, can be effectuated in bit line BL. In the case where, for example, data read current Is is started to be supplied after bit line BL has been precharged to a predetermined voltage, the storage data of the MTJ memory cell can be read by sensing the voltage of bit line BL.

FIG. 43 is a structural diagram of the MTJ memory cell fabricated in a semiconductor substrate.

With reference to FIG. 43, access transistor ATR formed in a semiconductor main substrate SUB has source/drain regions 310 and 320, which are n-type regions, as well as a gate 330. Source/drain region 310 is electrically coupled to source line SL via a metal film formed in a contact hole 341.

Write digit line WDL is formed in a metal wire layer provided as a layer above source line SL. Tunnel magnetic resistance element TMR is arranged on the upper layer side of write digit line WDL. Tunnel magnetic resistance element TMR is electrically coupled to source/drain region 320 of access transistor ATR via strap SRP and via a metal film formed in contact hole 340. Strap SRP is provided in order to electrically couple tunneling magneto-resistance element TMR to access transistor ATR and is formed of a conductive material.

Bit line BL is provided on the upper layer side of tunneling magneto-resistance element TMR and is electrically coupled to tunneling magneto-resistance element TMR via a buffer layer BFF. As described above, it is necessary to make data write currents flow through both bit line BL and write digit line WDL at the time of data write. On the other hand, word line WL is activated to be, for example, in the high voltage condition so that access transistor ATR is turned on at the time of data read. Thereby, the tunneling magneto-resistance element that has been pulled down to ground voltage GND via access transistor ATR is electrically coupled to bit line BL.

Bit line BL, through which a data write current and a data read current are made to flow, as well as write digit line WDL, through which a data write current is made to flow, are formed using a metal wire layer. On the other hand, word line WL is provided in order to control the gate voltage of access transistor ATR and, therefore, it is not necessary to make a large current flow. Accordingly, generally, from the point of view of enhancement of integration, word line WL is formed of a polysilicon layer or of a polycide layer in the same wire layer as is gate 330 without the additional provision of an independent metal wire layer.

On the other hand, a variety of system LSIs (Large Scale Integrated Circuits) have been proposed in recent years wherein a memory device, such as a dynamic random access memory (DRAM) or a static random access memory (SRAM), serving as one circuit block, as well as a circuit block having a logic function are mounted, in a mixed manner, on the same chip. Accordingly, in the case where the MRAM device is used in such a system LSI, it becomes necessary to adapt the structure of the MRAM device.

FIG. 44 is a schematic diagram for describing the entirety of the general configuration of a system LSI on which an MRAM device is mounted.

With reference to FIG. 44, a plurality of system LSIs 350 formed on the same wafer is cut along dicing lines, shown by thick lines, and divided into interval LSI chips. Each system LSI 350 includes a plurality of circuit blocks. These circuit blocks include an MRAM circuit block 360 having a function as an MRAM device as well as a peripheral circuit block. The peripheral circuit block is formed of a logic circuit 370 for directing the operation of MRAM circuit block 360 and an interface (I/F) circuit 365, such as an A/D (analog/digital) converter, for exchange of information and data between circuit blocks inside of system LSI 350 or between the system LSI and the outside thereof.

A memory cell array (hereinafter also referred to as "MTJ memory cell array") wherein MTJ memory cells, as shown in FIGS. 39 to 43, are arranged in an integrated manner is arranged in MRAM circuit block 360. In FIG. 44, for example, an MTJ memory cell array is arranged in the hatched region.

MTJ memory cells are formed only in an MTJ memory cell array portion in MRAM circuit block 360 inside of system LSI 350 in the above described manner and, therefore, areas of high and low density of MTJ memory cells occur within a chip as a result of such placement. That is to say, MTJ memory cells are arranged in sequence in the center portion of the MTJ memory cell array, wherein the density is high, while the periphery portion of the MTJ memory cell array adjoins a region wherein MTJ memory cells are not arranged and, therefore, the density becomes low.

A problem arises wherein uniform manufacture of MTJ memory cells within a memory cell array becomes difficult because areas of high and low density occur when a plurality of MTJ memory cells is arranged in the same chip. In the following, this problem is described in detail.

FIGS. 45A to 45E are conceptual diagrams for describing the non-uniformity of the dimensions, forms and structures caused at the time of manufacture of MTJ memory cells due to high and low densities of MTJ memory cells. As is clear from the description below, such non-uniformity is noteworthy in, in particular, a tunneling magneto-resistance element TMR wherein a magnetic tunnel junction is formed.

With reference to FIG. 45A, a strap layer 410 that has been deposited is processed in accordance with the designed pattern formation and a strap SRP, shown in FIG. 43, is formed in step (a). Polysilicon or tungsten is used for strap layer 410.

Processing of strap layer 410 is, in general, carried out by means of etching in accordance with the design pattern. At the time of etching, however, the film at the time of removal of the resist after etching in a region (hereinafter also referred to as "low density region of the pattern") having a low density of MTJ memory cells tends to become thin in comparison with that in a region (hereinafter also referred to as "high density region of the pattern") having a high density of MTJ memory cells. As a result of this, non-uniformity occurs in the thickness of the finished strap SRP. Here, the high density region of the pattern corresponds to the center of the MTJ memory cell array while the low density region of the pattern corresponds to the border portion of the MTJ memory cell array.

Next, with reference to FIG. 45B, magnetic layers for forming tunneling magneto-resistance element TMR are formed in step (b) on strap SRP that has formed. That is to say, magnetic layers 420, 422 and 424 are layered, with buffer layers 425, 427 and 429 intervened therebetween, as layers above strap SRP formed in step (a). Magnetic layer 422 corresponds to fixed magnetic layer FL shown in FIG. 40 and magnetic layer 424 corresponds to free magnetic layer VL shown in FIG. 40. Magnetic layer 420 is formed of antiferromagnetic material which fixes the direction 6f magnetization of fixed magnetic layer FL. Buffer layers 425, 427 and 429 are formed of, for example, polysilicon.

Furthermore, a buffer layer 430 for forming buffer layer BFF, shown in FIG. 43, is formed on magnetic layer 424. As described above, buffer layer 430 is formed using a conductive material in order to electrically couple tunneling magneto-resistance element TMR and a metal wire that corresponds to bit line BL arranged as a layer above tunneling magneto-resistance element TMR.

As shown in the figure, non-uniformity between the heights of the magnetic layers and buffer layers formed over the high density region of the pattern and the heights of the magnetic layers and buffer layers formed over low density region of the pattern occurs as a result of step (b). This is caused by the non-uniformity in the film thickness of strap SRP occurring in step (a).

Next, with reference to FIG. 45C, a resist film 440 is additionally applied to form a layer above the buffer layers and the magnetic layers layered in step (b) and is selectively removed in accordance with the structural pattern (memory cell pattern) of the MTJ memory cells in step (c). As a result or this, resist film 440 remains in the form corresponding to the memory cell pattern.

The buffer layers and the magnetic layers layered in step (b) are microscopically processed in accordance with the memory cell pattern by means of over etching along the remaining resist film 440. Thereby, tunneling magneto-resistance element TMR, shown in FIGS. 39 to 43, is formed. At the time of over etching, however, strap SRP, which has been formed as a thin layer, is further shaved in the low density region of the pattern and, in some cases, there is a possibility that strap SRP pattern may disappear.

In addition, the region to be removed and the region that is to remain in resist film 440 are, in general, selected by transcribing a mask pattern embodying the memory cell pattern to the resist film by means of exposure to light. Accordingly, in the "positive-type," for example, wherein the resist film in the exposed portion remains, the width of the remaining resist film tends to be thicker than in the originally designed pattern due to interference and reflection of light used to expose the resist corresponding to the MTJ memory cells in the periphery in the low density region of the pattern. Contrarily, such reflection and interference of light do not occur in the low density region of the pattern and, therefore, the width of the remaining resist film becomes relatively thin. As a result of this, non-uniformity in the planar memory cell form occurs between the high density region of the pattern and the low density region of the pattern in the above described manner.

With reference to FIG. 45D, an interlayer insulating film 450 is formed over tunneling magneto-resistance element TMR that has been processed in accordance with the memory cell pattern in step (d) shown next.

Next, with reference to FIG. 45E, a planarization process by means of chemical mechanical polishing (CMP) is carried out on interlayer insulating film 450 and buffer layer 430 in step (e) and, after that, a metal wire layer 460 is formed. Metal wire layer 460 is formed of, for example, a Cu wire and corresponds to bit line BL shown in FIGS. 39 to 43. As described above, bit line BL is electrically coupled to tunneling magneto-resistance element TMR by means of buffer layer BFF.

There is a risk, however, wherein buffer layer 430 in an MTJ memory cell in the high density region of the pattern may be excessively shaved due to the effects of a step that occurs between the high density region of the pattern and the low density region of the pattern at the time of polishing of buffer layer 430 in the planarization process. Thereby, there is a danger of defective electrical coupling (fluctuation in electric resistance) between tunneling magneto-resistance element TMR and bit line BL as well as a danger of negative effects to the magnetic layers of which tunneling magneto-resistance element TMR is formed.

As described above, in the case where a region having a high density of MTJ memory cells and region having a low density of MTJ memory cells exist in a mixed manner within the same chip, a certain degree of non-uniformity in the forms and dimensions of MTJ memory cells inevitably occurs between these regions. Accordingly, a design that takes such a problem into consideration becomes necessary for an MRAM device and a system LSI, or the like, wherein an MRAM device and other devices are mounted in a mixed manner.

In addition, the steps of magnetization of fixed magnetic layer FL in a predetermined direction, shown in FIGS. 39 to 43, are always included in a manufacturing process for an MRAM device. Accordingly, it is necessary for the improvement of the manufacturing process to make the magnetic field application apparatus utilized in such magnetization steps compact and efficient.

Furthermore, as shown in FIG. 42, data write to an MTJ memory cell is carried out by application of a magnetic field that exceeds a predetermined intensity. Accordingly, there is a risk wherein erroneous data write may take position due to the occurrence of magnetic noise in a memory cell other than the selected memory cell that has been selected as the object of data write.

In particular, there is a high risk of erroneous data write to a group of non-selected memory cells belonging to the same row or the same column as the selected memory cell due to an overlap of magnetic noise because either the easy axis (EA) or the hard axis (HA) of this group of non-selected memory cells is subject to a data write magnetic field of a predetermined intensity. Accordingly, it is necessary to take into consideration layout rules for wire groups that become the source of such magnetic noise in an MRAM device.

SUMMARY OF THE INVENTION

An object of the present invention is to make uniform the dimensions, shapes and structures of MTJ memory cells which become access targets in a thin film magnetic memory device and to provide a semiconductor integrated circuit device including the thin film magnetic memory device.

Another object of the present invention is to make compact a magnetic field application apparatus used in the manufacturing process of a thin film magnetic memory device.

Furthermore, still another object of the present invention is to provide a thin film magnetic memory device having wire design rules capable of suppressing the erroneous data write due to magnetic noise from a group of wires.

A thin film magnetic memory device according to the present invention includes a memory cell array in which a plurality of magnetic memory cells are sequentially arranged, wherein each magnetic memory cell includes a magnetic memory element having a plurality of magnetic layers at least one of which is magnetized in the direction in accordance with storage data. The thin film magnetic memory device further includes a plurality of shape dummy cells sequentially arranged with the plurality of magnetic memory cells outside of the memory cell array, wherein each shape dummy cell includes a dummy magnetic memory element designed to have the same structure and dimensions as the magnetic memory element.

Accordingly, a main advantage of the present invention is that variation in the density, being high or low, of magnetic memory cells between areas in the center portion and in border portions of the memory cell array can be eliminated by arranging shape dummy cells in the peripheral portion of the memory cell array in a thin film magnetic memory device. As a result, the uniformity of the dimensions, shapes and structures of the magnetic memory cells can be attained within the memory cell array.

A semiconductor integrated circuit device according to another configuration of the present invention includes a plurality of circuit blocks, wherein each circuit block includes a magnetic memory cell array in which a plurality of magnetic memory cells is arranged. Each magnetic memory cell has a magnetic memory element having a plurality of magnetic layers at least one of which is magnetized in the direction in accordance with storage data, and the plurality of magnetic memory cells is arranged so that the easy axis of the magnetic memory element in each magnetic memory cell is oriented in the same direction relative to the plurality of circuit blocks.

The direction (easy axis) in which magnetic memory cells are arranged is oriented in the same direction relative to the plurality of circuit blocks in such a semiconductor integrated circuit device and, therefore, the respective magnetic memory cells can be collectively and efficiently magnetized in the magnetization process of the magnetic memory cells, which is inevitably included in the manufacturing process of the semiconductor integrated circuit device.

A thin film magnetic memory device according to another configuration of the present invention includes a memory cell array in which a plurality of magnetic memory cells are sequentially arranged, wherein each memory cell includes a magnetic memory element having a plurality of magnetic layers at least one of which is magnetized in the direction in accordance with storage data. The thin film magnetic memory device further includes a data write wire that allows a data write current to pass through the data write wire so as to generate a data write magnetic field applied to the magnetic memory elements and with a plurality of wires in addition to the data write wire, wherein the data write wire and the plurality of wires are arranged in a layout that the sum of magnetic fields generated by currents passing through the plurality of wires, respectively, becomes smaller than a predetermined magnetic field.

Accordingly, the arrangement of these wires is determined by taking into consideration the amount of magnetic noise from wires other than the group of wires which directly affect the magnetic memory cells and, therefore, erroneous data write due to magnetic noise can be suppressed.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 13A and 13B are cross sectional views along lines in the column direction for describing the structure of a dummy column region shown in FIG. 11;

FIGS. 45A to 45E are conceptual diagrams for describing the non-uniformity of the dimensions, forms and structures caused at the time of manufacture of MTJ memory cells due to areas of high and low density of the MTJ memory cells.

DESCRIPTION OF THE PREFERRED EMBODIMENTS

Figure 1:
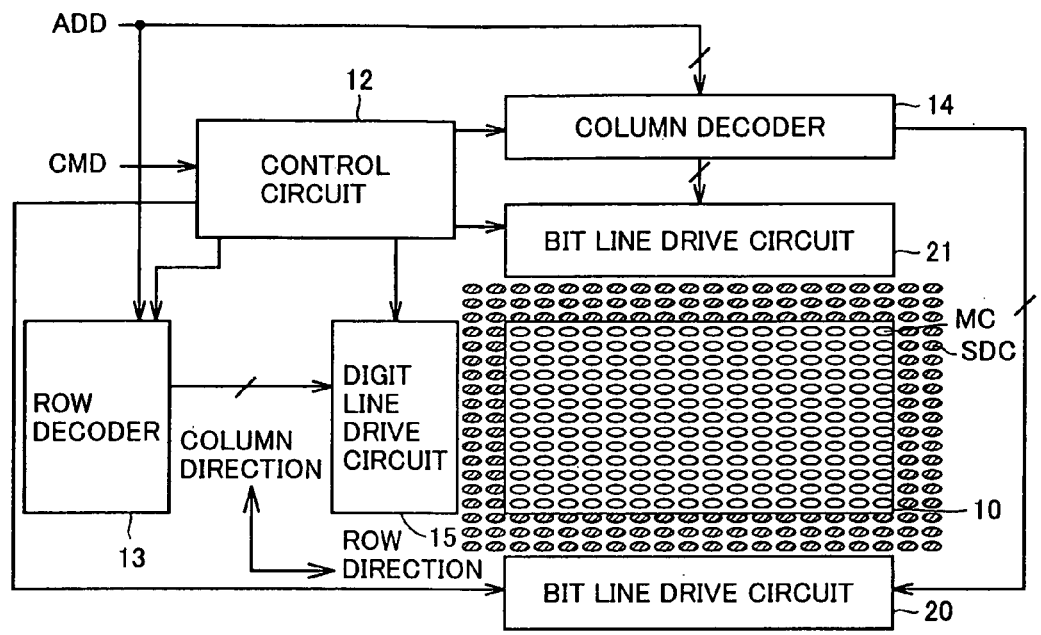
FIG. 1 is a schematic block diagram for describing the entirety of the configuration of an MRAM device according to an embodiment of the present invention.

In the following, the embodiments of the present invention are described in detail with reference to the drawings. Here, the same symbols indicate the same, or the corresponding, parts in the drawings.

First Embodiment

A configuration for ensuring the uniformity of the memory cell pattern (memory cell dimensions, forms and structures) within a memory array wherein MTJ memory cells for data storage are arranged is described in a first embodiment.

With reference to FIG. 1, an MRAM device according to the embodiment of the present invention is provided with an MTJ memory cell array 10 wherein MTJ memory cells MC for data storage are arranged in sequence in a matrix. Here, in the following, MTJ memory cells arranged within MTJ memory cell array 10 that becomes an access object in accordance with an address signal ADD is specifically referred to as "normal memory cells" in order to be distinguished from the shape dummy cells described below in the present specification.

The MRAM device is further provided with a control circuit 12 for controlling the entire operation of the MRAM device in response to a control signal CMD, a row decoder 13 for carrying out a row selection of the normal memory cells by decoding the row address indicated by address signal ADD, a column decoder 14 for carrying out a column selection of the normal memory cells by decoding the column address indicated by address signal ADD, a digit line drive circuit 15 for controlling a supply of a data write current and bit line drive circuits 20 and 21.

Though not shown in the drawing, each memory cell MC has the same structure as the MTJ memory cell described with reference to FIGS. 39 to 43 and includes tunneling magneto-resistance element TMR provided as a magnetic memory element having a free magnetic layer (VL in FIG. 39) magnetized in the direction in accordance with storage data and access transistor ATR provided as an access element for controlling the passage of current to tunneling magneto-resistance element TMR at the time of data read. A normal memory cell MC is selected in accordance with address signal ADD so as to be an access object.

Figure 2:
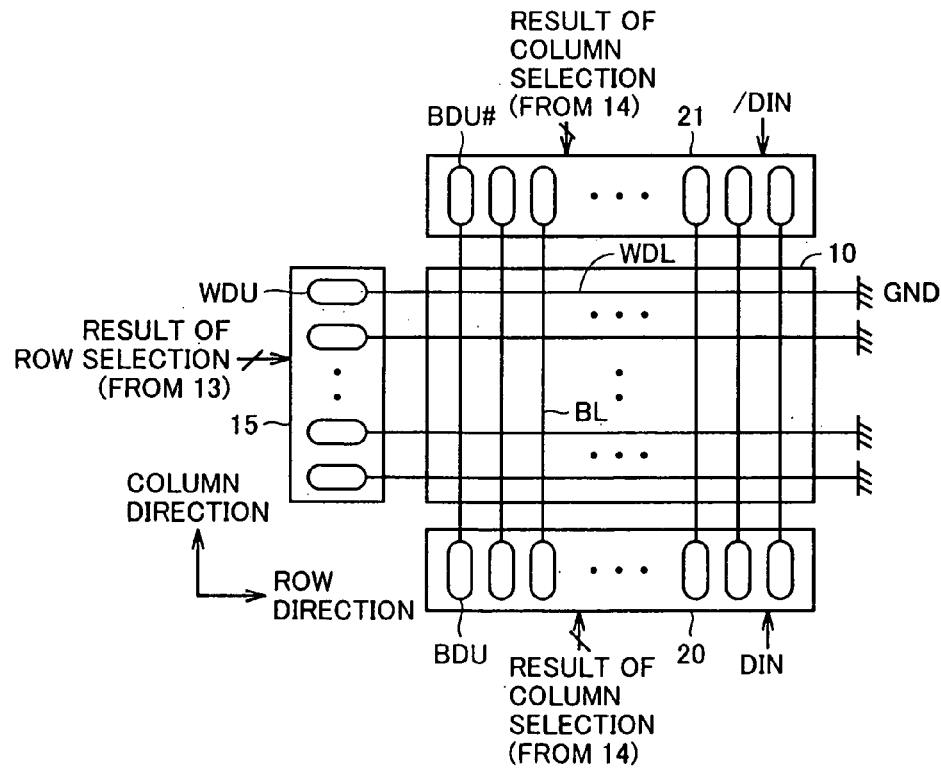
FIG. 2 is a block diagram showing a layout of signal wires used for data write arranged in an MTJ memory cell array.

With reference to FIG. 2, digit lines WDL are provided so as to correspond to the respective rows (hereinafter, also referred to as "memory cell rows") of the normal memory cells while bit lines BL are arranged so as to correspond to the respective columns (hereinafter, also referred to as "memory cell columns") of the normal memory cell in MTJ memory cell array 10. Furthermore, though not show in the drawings, word lines WL and source lines SL shown in FIGS. 39 to 43 are arranged so as to correspond to the respective memory cell rows.

Digit line drive circuit 15 has a write digit line drive unit WDU for controlling the voltage on one end of write digit line WDL in accordance with the result of column selection from row decoder 13. The other end of each write digit line WDL (located on side opposite to write digit line drive unit WDU) is coupled to ground voltage GND in a fixed manner, regardless of the result of row selection.

Write digit line drive unit WDU corresponding to a selected row couples the corresponding write digit line, that is to say, one end of the write digit line in the selected row, to, for example, a power supply voltage Vcc in digit line drive circuit 15. Thereby, a predetermined data write current is supplied to the write digit line in the selected column in the direction from power supply voltage Vcc to ground voltage GND. A magnetic field generated by the data write current flowing through write digit line WDL is oriented in the direction along hard axis (HA) in normal memory cell MC.

On the other hand, each write digit line drive unit WDU connects one end of the corresponding write digit line to ground voltage GND in a non-selected row. Therefore, a data write current is not supplied to the write digit line in a non-selected row, unlike in the selected row.

Bit line drive circuit 20 includes a bit line drive unit BDU provided so as to correspond to one end of each bit line BL and bit line drive circuit 21 includes a bit line drive unit BDU# provided so as to correspond to the other end of each bit line BL.

Each bit line drive unit BDU controls the voltage at one end of the corresponding bit line BL in accordance with the result of column selection from column decoder 14 and the level of write data DIN. Contrarily, each bit line drive unit BDU# controls the voltage at the other end of the corresponding bit line BL in accordance with the result of the column selection from column decoder 14 and the level of inverted write data /DIN.

At the time of data write, the respective ends of the bit line in the selected column are set at power supply voltage Vcc and ground voltage GND in accordance with the level of write data DIN. At the time of data write of the H level, for example, one end of the bit line in the selected column is connected to power supply voltage Vcc by means of the corresponding bit line drive unit BDU while the other end of the bit line in the selected column is connected to ground voltage GND by means of the corresponding bit line drive unit BDU#. Contrarily, at the time when write data DIN is at the L level, one end of the bit line in the selected column is connected to ground voltage GND by means of the corresponding bit line drive unit BDU while the other end of the bit line of the selected column is connected to power supply voltage Vcc by means of the corresponding bit line drive unit BDU#.

On the other hand, the respective ends of bit line BL are connected to ground voltage GND by means of the corresponding bit line drive units BDU and BDU# in a non-selected column. Accordingly, a data write current does not flow through the bit line in a non-selected column.

At the time of data read, bit line drive units BDU and BDU# disconnect both ends of bit line BL from each of power supply voltage Vcc and from ground voltage GND. At the time of data read, a data read current is supplied to the bit line BL electrically connected to the selected memory cell by means of a data read circuit, not shown.

Figure 42:
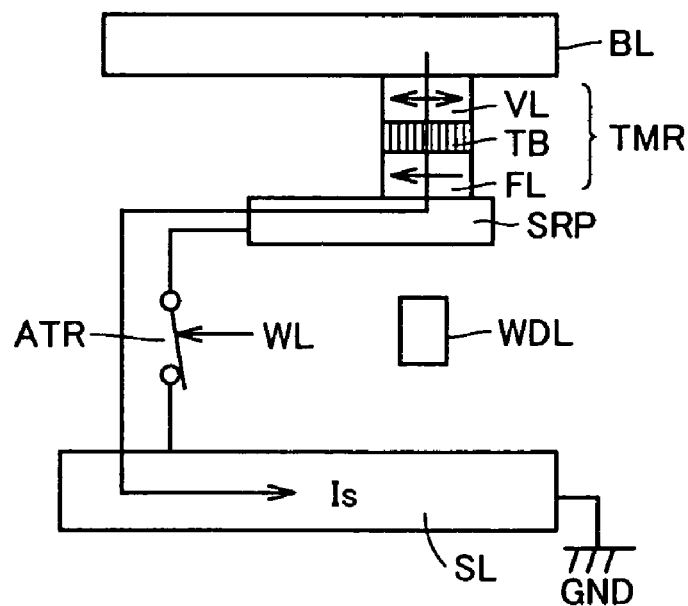
FIG. 42 is a conceptual diagram for describing data read from an MTJ memory cell.
Figure 43:
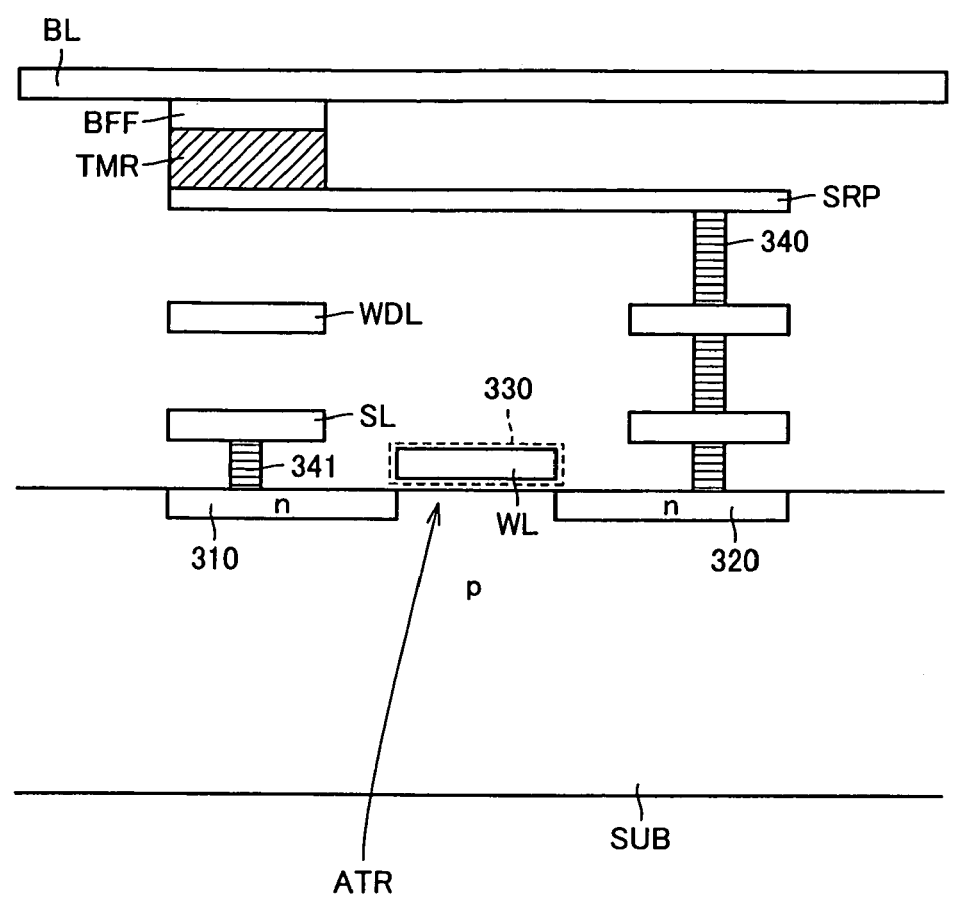
FIG. 43 is a structural diagram of an MTJ memory cell fabricated in a semiconductor substrate.

Here, FIGS. 1 and 2 show only circuits involved in data write in a representative manner and the data read circuit, not shown, described in FIG. 42 is further provided for implementation of the data read operation of an MTJ memory cell. Such a data read circuit has, for example, a function of supplying a data read current to bit line BL at the time of data read and a function of sensing a current passing through bit line BL according to the electric resistance of the selected memory cell.

Again with reference to FIG. 1, shape dummy cells SDC are further provided so as to be in sequence with the layout pattern of memory cells MC in the peripheral region of MTJ memory cell array 10 in the configuration according to the first embodiment of the present invention. That is to say, normal memory cells MC and shape dummy cells SDC are arranged in a sequential manner so as to have a uniform pitch throughout. Though shape dummy cells SDC are essentially designed to have the same structures and dimensions as normal memory cells MC, it is not necessary to make them have an identical structure, as is clear from the description below.

Though FIG. 1 illustrates the configuration wherein shape dummy cells SDC are formed in two separate groups of two columns each and two separate groups of three rows each, the number of shape dummy cells SDC used is not specifically limited.

In such a configuration, shape dummy cells SDC located in the outer area are arranged in the "low density region of the pattern," shown in FIGS. 45A to 45E while normal memory cells MC arranged in the peripheral portion (border portion) of the MTJ memory cell array are arranged in the "high density region of the pattern" in FIGS. 45A to 45E.

Figure 3:
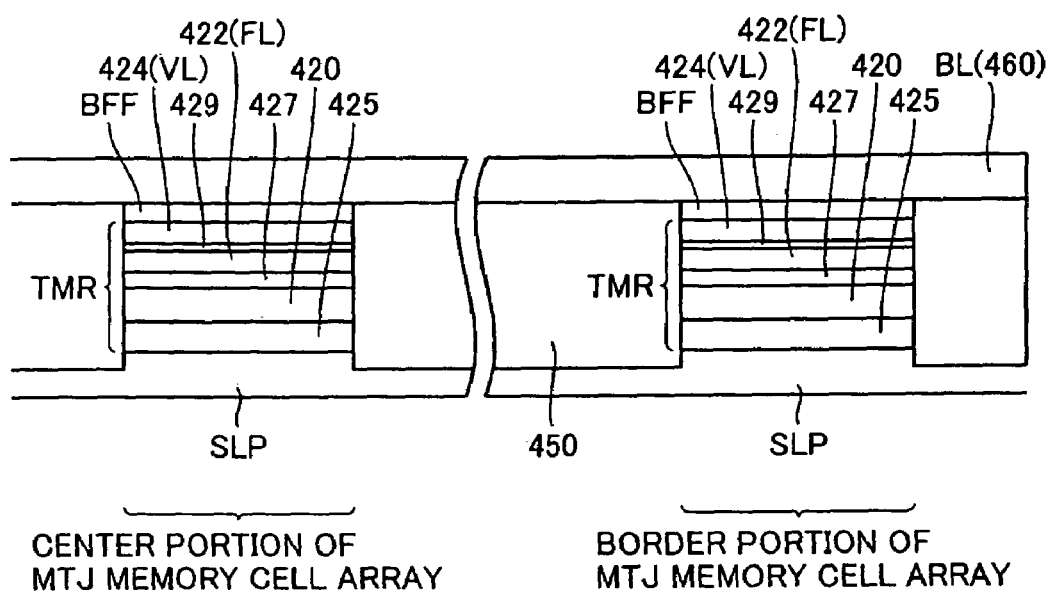
FIG. 3 is a conceptual diagram for describing the uniformity of an MTJ memory cell in the MRAM device according to the embodiment of the present invention.

Accordingly, all normal memory cells MC forming MTJ memory cell array 10 can be uniformly manufactured, as shown in FIG. 3, by means of provision of the above described shape dummy cells SDC. The memory cell pattern, that is to say, the dimensions, forms and structures, of the normal memory cells in the center portion of the MTJ memory cell array and of the normal memory cells located in the border portions of the MTJ memory cell array is made uniform with respect to straps SRP, tunneling magneto-resistance elements TMR and buffer layer BFF.

Figure 4:
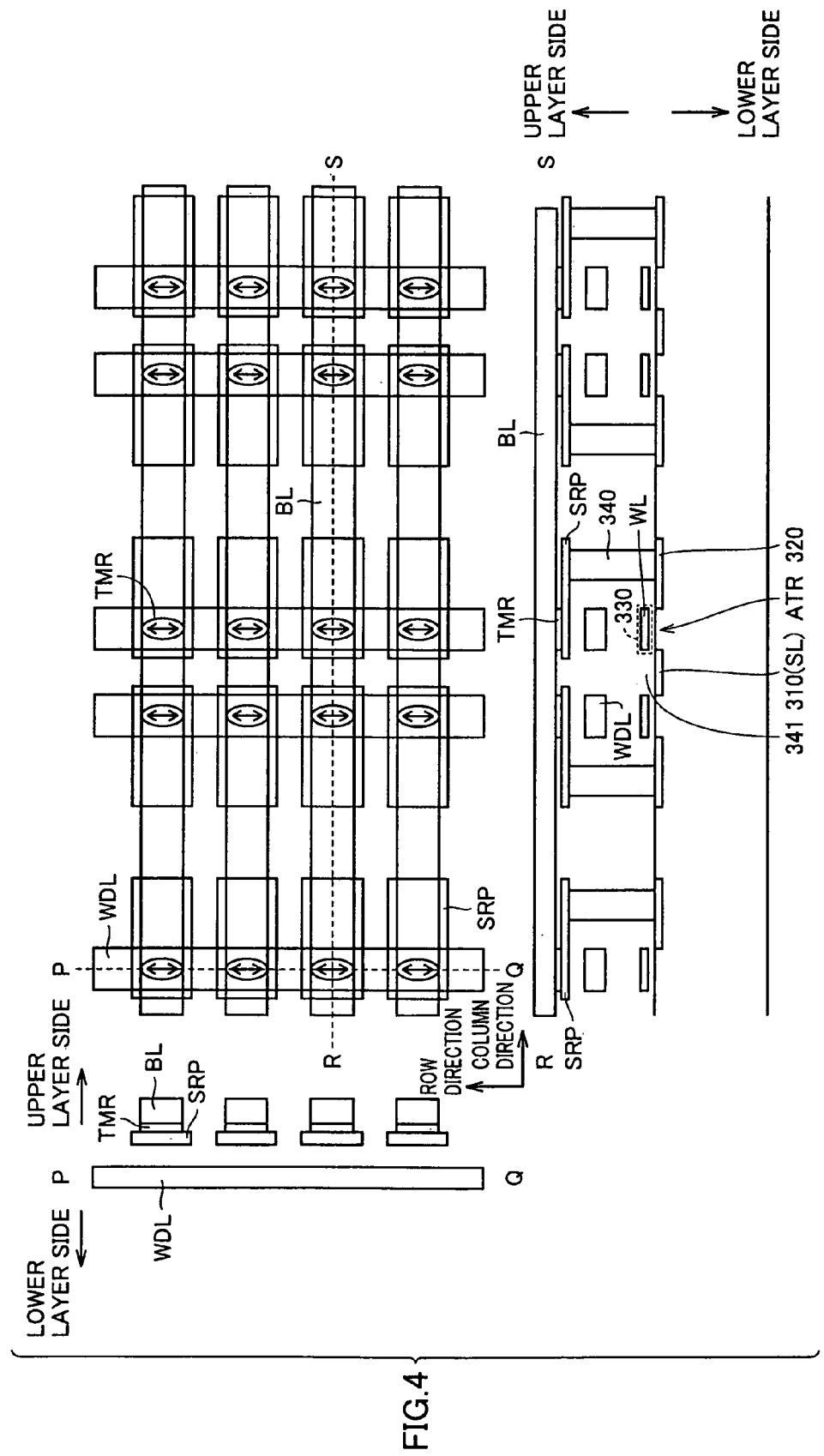
FIG. 4 is a diagram showing the detail of the layout of signal wires corresponding to normal memory cells and dummy structural cells.

FIG. 4 is a diagram showing a layout of normal memory cells and dummy structural cells as well as corresponding signal lines in detail.

A plan view of MTJ memory cells arranged in sequence in a matrix and of the corresponding wire group is shown in the center portion of FIG. 4. FIG. 4 shows a layout of MTJ memory cells of five rows by four columns in a representative manner. With reference to this plan view, five write digit lines WDL, respectively, corresponding to five memory cell rows and four bit lines, respectively, corresponding to four memory cell columns are arranged in the row direction and in the column direction. Furthermore, source lines SL, not shown, are arranged in the row direction.

Tunnel magnetic resistance elements TMR are arranged at the respective points of intersection of bit lines BL and write digit lines WDL. Access transistors are formed on the lower layer side of tunneling magneto-resistance elements TMR.

FIG. 4 further shows a cross sectional view along line P-Q and a cross sectional view along line R-S in the plan view.

With reference to the cross sectional view along line R-S, an active layer forming source/drain regions 310 of access transistors ATR is provided so as to extend in the row direction so that the active layer is shared by access transistors ATR of the same row. That is to say, this active layer is coupled to ground voltage GND so as to work as source line SL.

Source/drain regions 320 are electrically coupled to strap SRP via contact holes 340. A word line WL extending in the row direction is arranged in a gate region 330 of access transistors ATR. In addition, write digit line WDL extending in the row direction is arranged in a middle layer between word line WL and strap SRP.

In addition, the cross sectional view along line P-Q in FIG. 4 shows a cross section along write digit line WDL. Here, the cross sectional view along line P-Q illustrates only the upper layer side of write digit line WDL.

A data write current for data write to a tunneling magneto-resistance element TMR flows through write digit line WDL, which is arranged in a region directly beneath tunneling magneto-resistance elements TMR. Accordingly, tunneling magneto-resistance elements TMR electrically coupled to straps SRP and bit lines BL are arranged in a layer above write digit line WDL.

MTJ memory cells, of which the number is greater than the number of memory cells required as access objects, are arranged, for example, in sequence at a uniform pitch and, thereby, shape dummy cells SDC can be provided. In this case, a group of extra MTJ memory cells located in the periphery region is manufactured as shape dummy cells SDC. In this case, respective normal memory cells MC and shape dummy cells SDC have identical structures and shape dummies are provided for tunneling magneto-resistance elements TMR, for access transistors ATR, for bit lines BL, for digit lines WDL, for word lines WL and for source lines SL, respectively.

Here, as described below in detail, though it is not necessary for the structure of shape dummy cells SDC to completely agree with that of respective normal memory cells MC, it is necessary to provide shape dummies for at least the tunneling magneto-resistance element TMR portions wherein there is the highest risk of non-uniformity.

Figure 5:
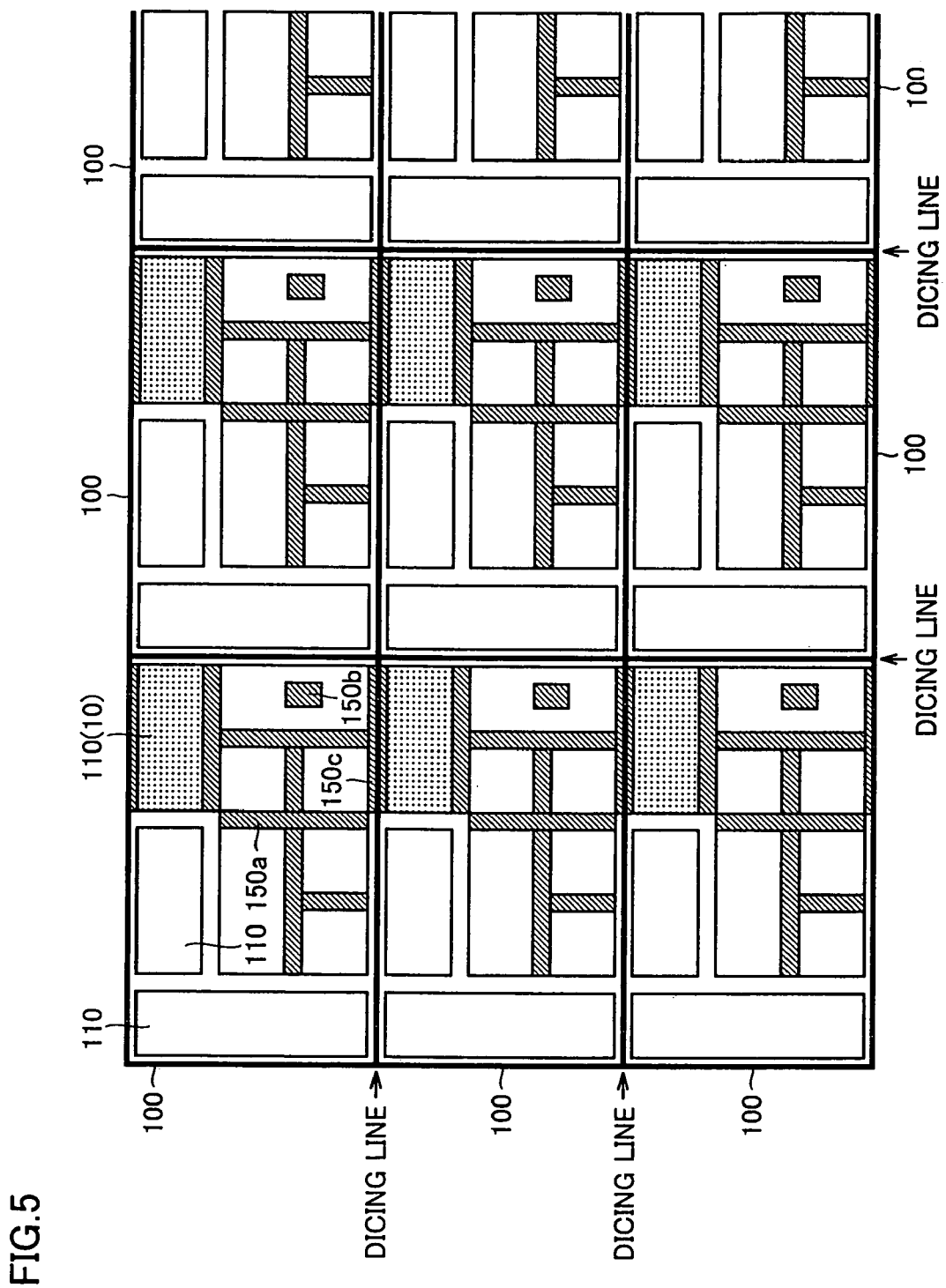
FIG. 5 is a conceptual diagram for describing a layout of shape dummy cells in a system LSI in which an MRAM device is incorporated according to a first embodiment.

FIG. 5 is a conceptual diagram for describing a layout of shape dummy cells in a system LSI in which an MRAM device according to the first embodiment is incorporated.

Figure 44:
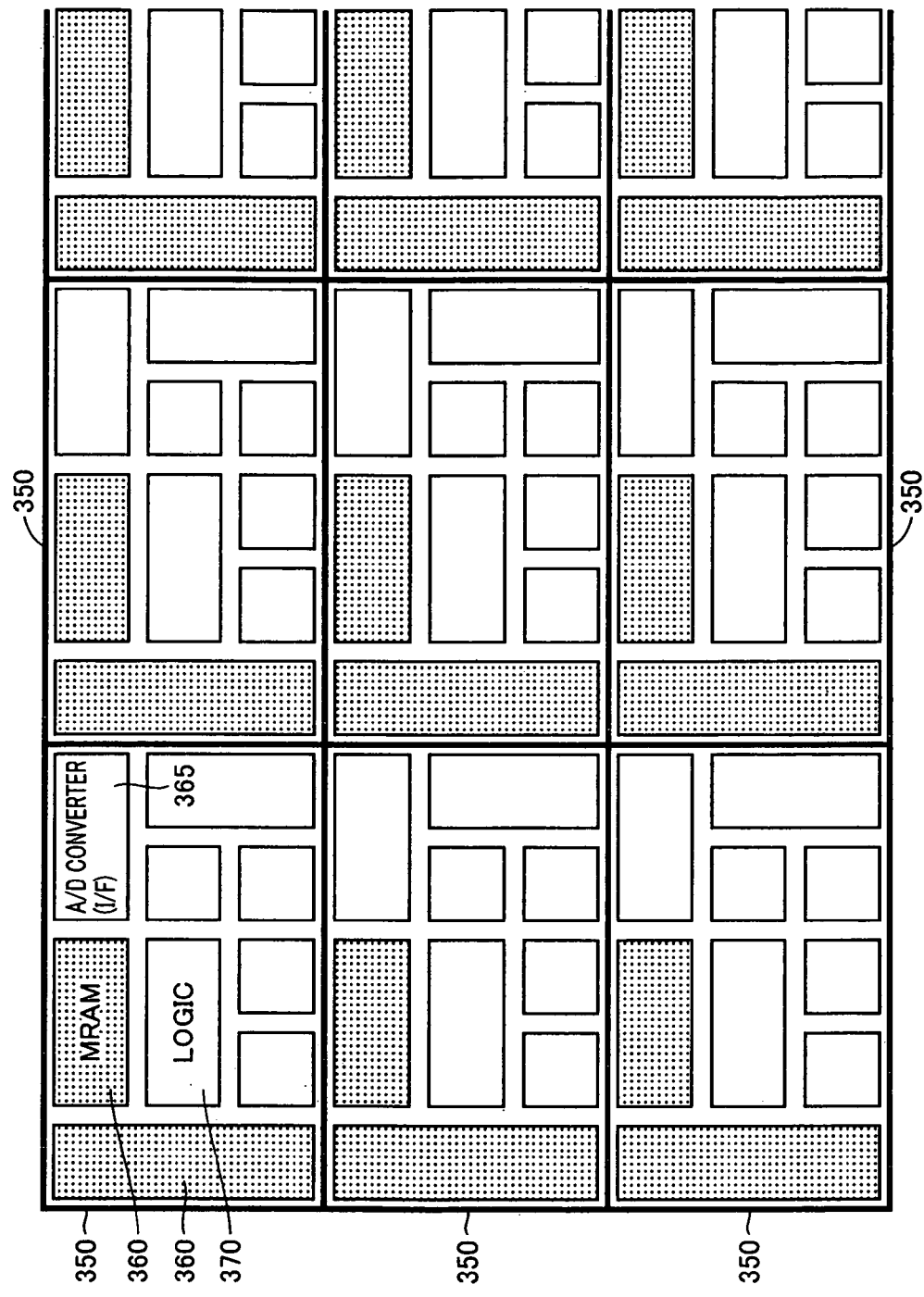
FIG. 44 is a schematic diagram for describing the entirety of the general configuration of a system LSI on which an MRAM device is mounted.

With reference to FIG. 5, system LSIs 100, shown as typical examples of semiconductor integrated circuit devices on which MRAM devices according to the first embodiment are mounted, are provided with pluralities of circuit blocks 110. The plurality of system LSIs 100 is manufactured in the same wafer and is cut along dicing lines shown by thick lines in the figure and divided into individual LSI chips in the same manner as in FIG. 44.

At least one of circuit blocks 110, making up a plurality, is designed as an MRAM circuit block in each system LSI 100 and an MTJ memory cell array, as shown in FIG. 1, is provided inside of the MRAM circuit block. A structure having, at least, a plurality of layers with the same structure as the plurality of MTJ memory cells, is arranged in the MTJ memory cell array. Accordingly, shape dummy cells provided to ensure the uniformity of the MTJ memory cells can be arranged in a region 150a between circuit blocks, in a region 150b within another circuit block, in a region 150c bordering another system LSI along a dicing line, or the like.

In particular, region 150c along a dicing line is a vacant region wherein no circuit elements, or the like, for forming a circuit block are arranged and, therefore, increase in chip area can be avoided in the case where shape dummy cells are arranged in this region. In addition, in the case where shape dummy cells are arranged within a circuit block other than the MRAM circuit block, dispersion into areas of high and low density of MTJ memory cells can be reduced over the entirety of the chip.

Circuit blocks, other than the MRAM circuit block, include a logic circuit block for generating operational instructions (control signal CMD, address signal ADD, and the like, in FIG. 1) for the MRAM circuit block, an operational circuit block for carrying out a predetermined graphic process operation, or the like, in response to read data from the MRAM or input data from the outside, an interface circuit block for transmitting data and commands to and from the outside, and the like.

In such a configuration, the memory cell pattern of the normal memory cells that become access objects is made uniform so that a system LSI provided with an MRAM device having stable data maintenance characteristics as a circuit block can be implemented.

First Modification of First Embodiment

Though a case is shown in the first embodiment wherein shape dummy cells SDC are used in an MTJ memory cell array having a general configuration, as shown in FIGS. 1 and 3, shape dummy cells SDC can be used in the same manner in other memory cell array configurations.

Figure 6:
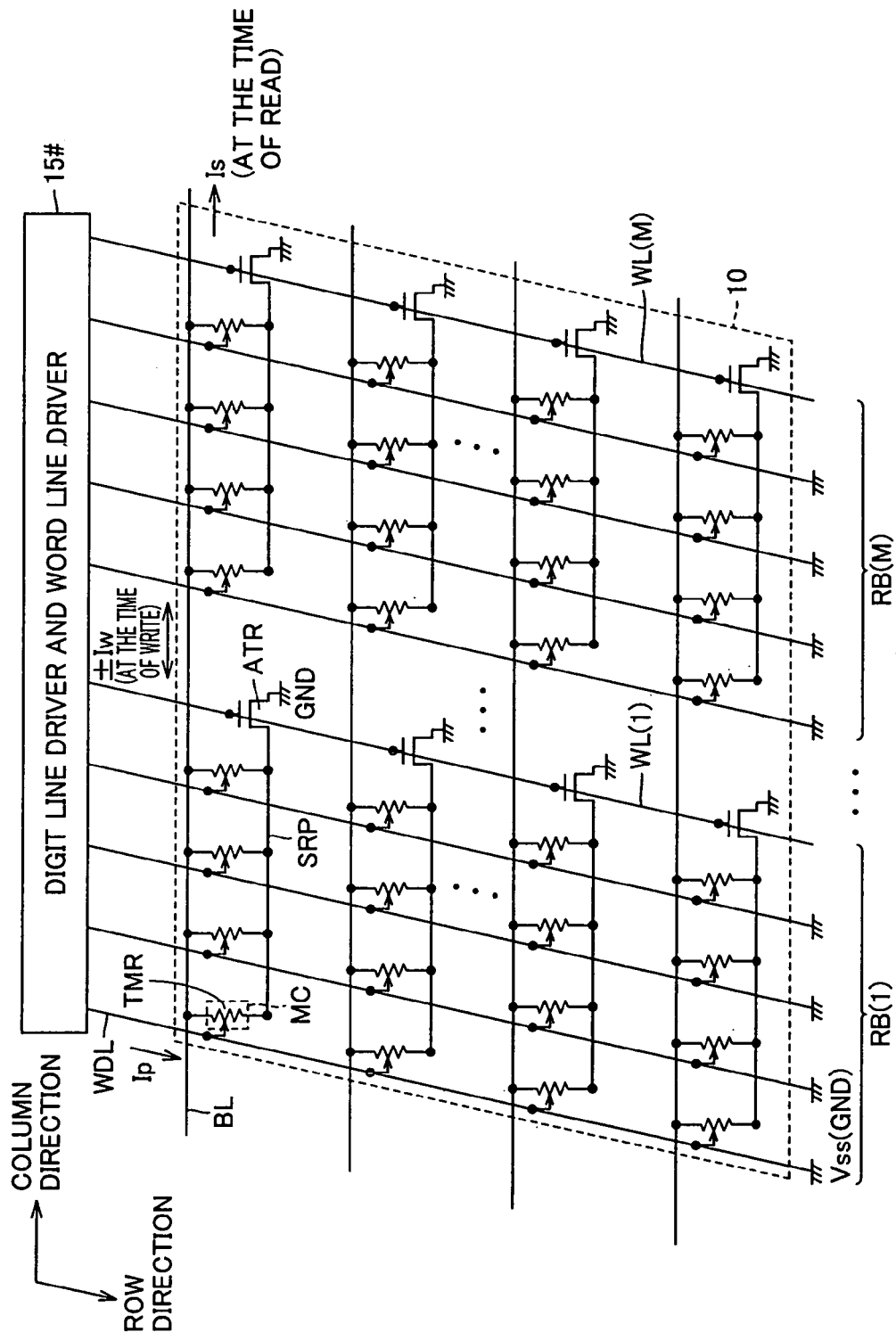
FIG. 6 is a circuit diagram showing an example of a configuration of an MTJ memory cell array according to a first modification of the first embodiment.

With reference to FIG. 6, a plurality of MTJ memory cells MC (tunneling magneto-resistance elements TMR) arranged in a matrix in MTJ memory cell array 10 is divided into a plurality of row blocks RB(1) to RB(M) (M: integer of 2, or greater) in the row direction in a first modification of the first embodiment. Each of row blocks RB(1) to RB(M) has L memory cell rows (L: integer of at least 2). FIG. 2 shows an example having a configuration wherein L=4. Here, in the following, row blocks RB(1) to RB(M) are generically and simply referred to as row blocks RB.

Straps SRP arranged as signal lines in the column direction are provided so as to correspond to row blocks RB(1) to RB(M), respectively, in each memory cell column. Furthermore, an access transistor ATR is arranged so as to correspond to each strap SRP. That is to say, M access transistors ATR and M straps SRP, respectively, are arranged in each memory cell column so as to correspond to the row groups.

Four (L) tunneling magneto-resistance elements TMR belonging to the same row block are coupled to the same strap SRP in each memory cell column. That is to say, each strap SRP and access transistor ATR pair is shared in the same memory cell column by L tunneling magneto-resistance elements TMR corresponding to the same row block.

Furthermore, a plurality of word lines WL(1) to WL(M) are arranged so as to correspond to row blocks RB(1) to RB(M), respectively. The respective gates of access transistors ATR, making up a plurality, corresponding to the same row block are coupled to the corresponding word line. For example, the respective gates of access transistors ATR corresponding to row block RB(1) are coupled to common word line WL(1), as shown in FIG. 2. Each access transistor ATR is electrically coupled to a corresponding strap SRP and a fixed voltage Vss (for example, ground voltage GND).

In addition, bit lines BL are arranged in the column direction so as to correspond to the respective memory cell columns while write digit lines WDL are arranged in the row direction so as to correspond to respective memory cell rows.

At the time of data read, one word line from among word lines WL(1) to WL(M) corresponding to the selected memory cell is selectively activated in accordance with the result of row selection. The strap (hereinafter also referred to as "selected strap") coupled to the selected memory cell is coupled to fixed voltage Vss due to the activation of word line WL. As a result of this, L tunneling magneto-resistance elements TMR, including the selected memory cell, connected to the above selected strap (hereinafter also referred to as "selected memory cell group") make connections between corresponding bit line BL and fixed voltage Vss.

Accordingly, at the time of data read, data read current Is flows through bit line BL in the selected column in accordance with the electric resistance of the entirety of the selected memory cell group. Therefore, current passing through one selected memory cell (electric resistance) included in this selected memory cell group is sensed according to data read in the MRAM device provided with the MTJ memory cells shown in FIG. 6, which is carried out in a so-called "self-reference read" manner wherein no reference cells are provided based on data read current Is passing through the above selected memory cell group.

More concretely, predetermined data is forcibly written in to the selected memory cell in a one-time data operation so that read data is confirmed as a result of comparison of the data read currents before and after write of this predetermined data and, furthermore, the confirmed read data is again written in to the selected memory cell and, thereby, the above described self-reference read can be carried out, as disclosed in, for example, U.S. Pat. No. 6,317,376B1.

On the other hand, supply of the data write current to write digit line WDL and to bit line BL at the time of data write is carried out in the same manner as in the MTJ memory cell array, shown in FIGS. 1 to 3, and, therefore, detailed descriptions thereof are not repeated.

Figure 7:
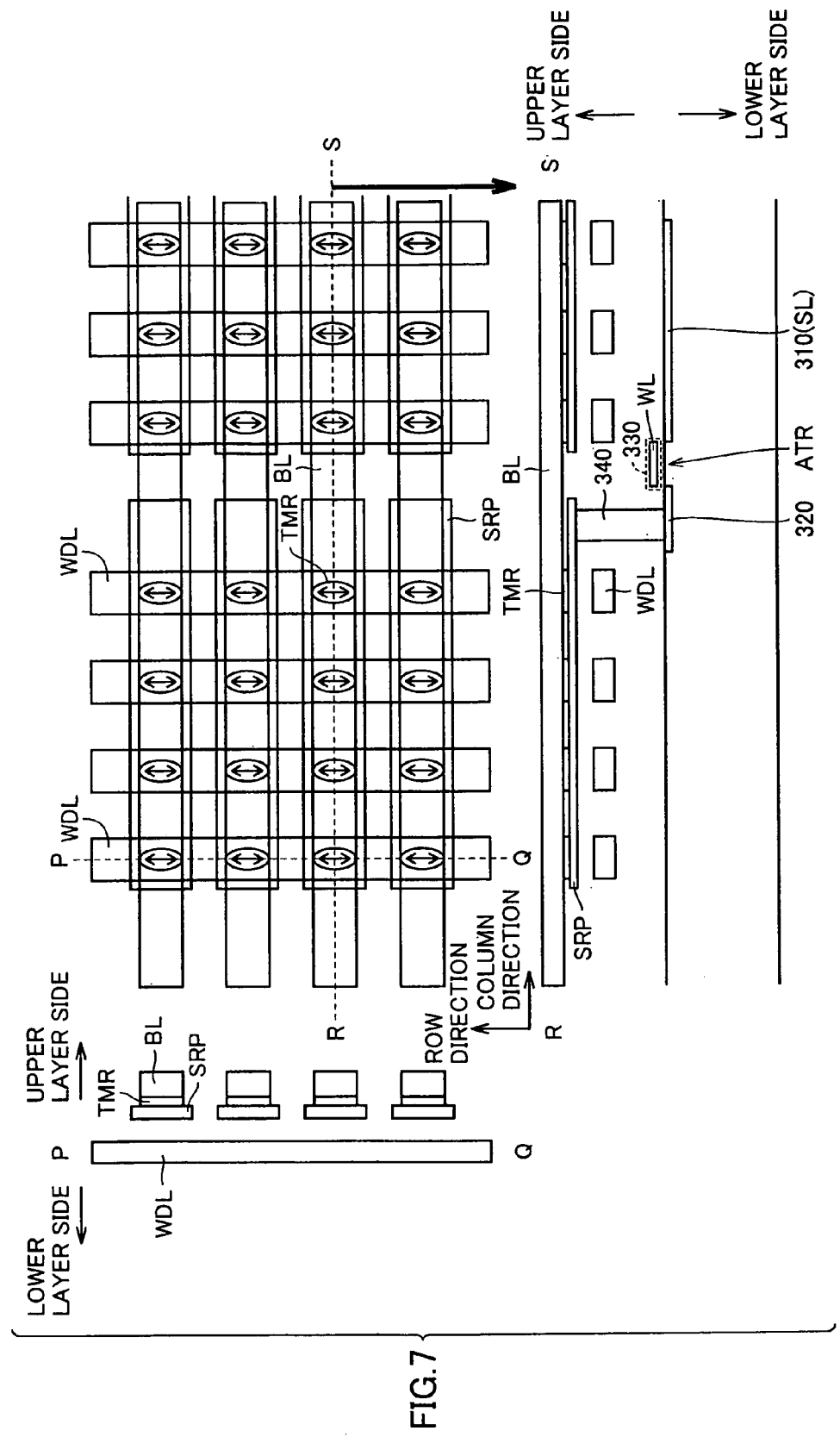
FIG. 7 is a plan view and cross sectional view for describing the detail of the configuration of the MTJ memory cell array shown in FIG. 6.

FIG. 7 is a plan view and a cross sectional view for describing the configuration of the MTJ memory cell array shown in FIG. 6 in detail.

With reference to FIG. 7, the layout of an MTJ memory cell array according to the first modification of the first embodiment differs from the configuration according to the first embodiment in the layout of strap SRP and of access transistor ATR as is understood by comparison with FIG. 4. That is to say, tunneling magneto-resistance elements TMR, which function as MTJ memory cells, are arranged so as to correspond to the points of intersection of bit lines BL and write digit lines WDL, respectively, while each strap SRP is arranged so as to be shared by four (L) tunneling magneto-resistance elements TMR in each memory cell column.

With reference to the cross sectional view along line R-S in FIG. 7, the active layer that corresponds to source/drain regions 310 of access transistors ATR is arranged so as to extend in the row direction in the same manner as in FIG. 4 and works as source line SL. Source/drain regions 320 are electrically coupled to straps SRP, which are coupled to pluralities of tunneling magneto-resistance elements TMR, via contact holes 340.

Furthermore, word lines WL are arranged so as to extend in the row direction in gate regions 330 of access transistors ATR in the same manner as in FIG. 4. In addition, write digit lines WDL are arranged so as to extend in the row direction in the middle layer between word lines WL and straps SRP. In addition, the cross sectional view along line P-Q in FIG. 7 is the same as the cross sectional view along line P-Q in FIG. 4 and, therefore, detailed descriptions thereof are not repeated.

As described above, straps SRP are shared by a plurality of tunneling magneto-resistance elements in the configuration of the MTJ memory cell array according to the first modification of the first embodiment and, thereby, the number of access transistors ATR arranged in the MTJ memory cell array can be reduced so as to reduce the area.

In such a configuration, extra memory cell rows and memory cell columns (in units of row blocks RB) are provided so that MTJ memory cells, including extra MTJ memory cells provided as shape dummy cells SDC, are manufactured in sequence and, thereby, the memory cell pattern of the normal memory cells can be made uniform in the MTJ memory cell array in the same manner as in the first embodiment.

In addition, in a system LSI provided with an MRAM circuit block having the MTJ memory cell array according to according to the first modification of the first embodiment, it is possible to position shape dummy cells SDC in regions corresponding to those described in FIG. 5. The layout of shape dummy cells according to the present invention can be used in the same manner as described above, regardless of the configuration of the memory cell array.

Second Modification of First Embodiment

An example of the layout of shape dummy cells in the case where the MTJ memory cell array is broken down into a plurality of blocks is shown in a second modification of the first embodiment.

Figure 8:
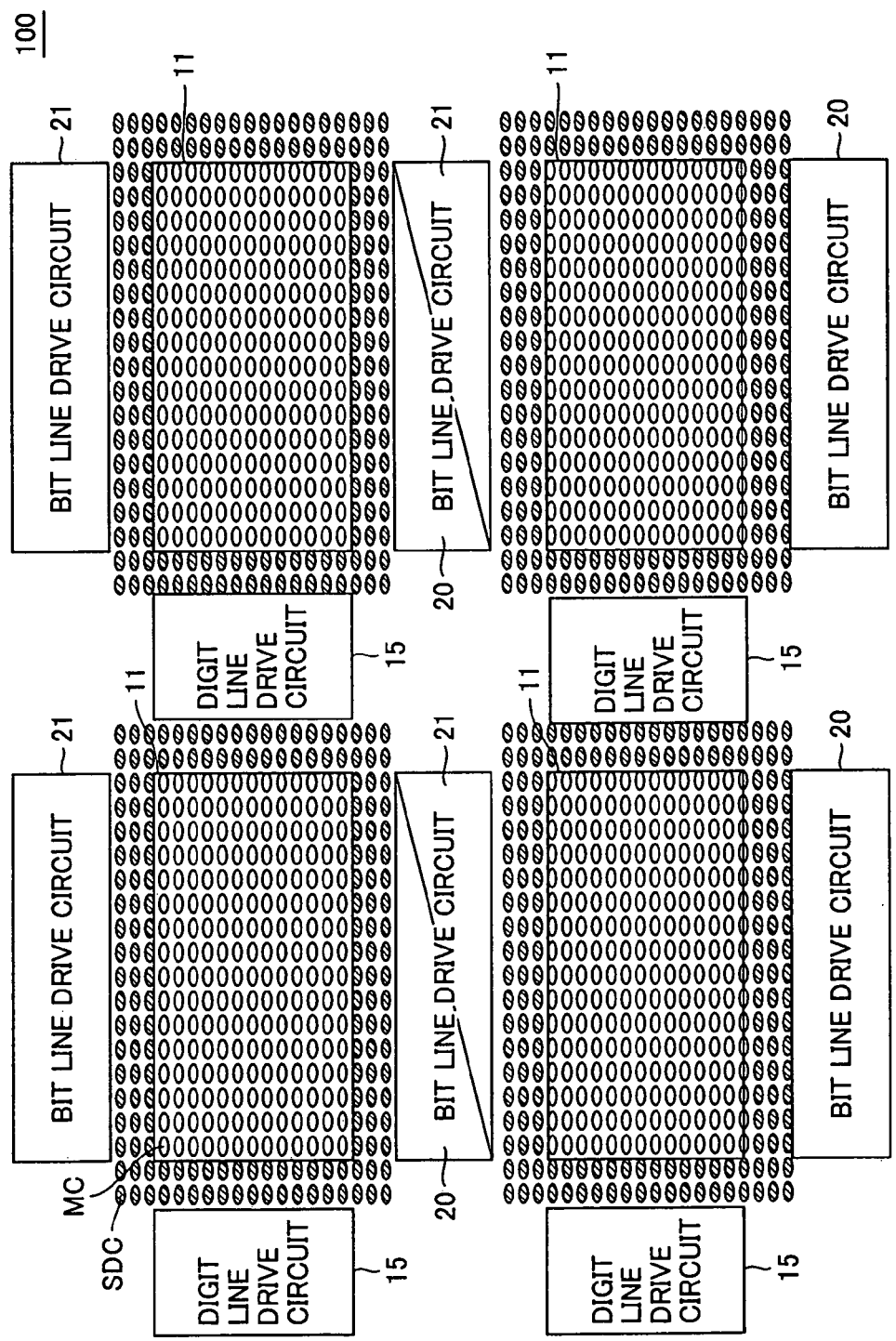
FIG. 8 is a conceptual diagram showing a layout of shape dummy cells according to a second modification of the first embodiment.

With reference to FIG. 8, MTJ memory cell array 10 is arranged so as to be divided into a plurality of memory blocks 11 in the second modification of the first embodiment. Normal memory cells MC are arranged in a matrix in each memory block 11. Correspondingly, digit line drive circuits 15 and bit line drive circuits 20 and 21 are arranged so as to be divided to correspond to memory blocks 11, respectively. Here, the configuration of the MTJ memory cell array is not specifically limited and the configurations shown in FIG. 4 and in FIG. 7 can be used.

Shape dummy cells SDC are arranged so as to be in sequence with normal memory cells MC in the row direction and in the column direction in respective memory blocks 11 in the configuration the second modification of the first embodiment. That is to say, shape dummy cells SDC are independently arranged for every memory block 11.

Accordingly, normal memory cells MC and shape dummy cells SDC are formed in a matrix with a uniform pitch in each memory block 11. As a result of this, respective normal memory cells MC located in the center portion and in the peripheral portion of each memory block 11 can be manufactured so as to have a uniform memory cell pattern, as shown in FIG. 4.

Second Embodiment

In a second embodiment, a more efficient placement system of shape dummy cells SDC is described.

Figure 9:
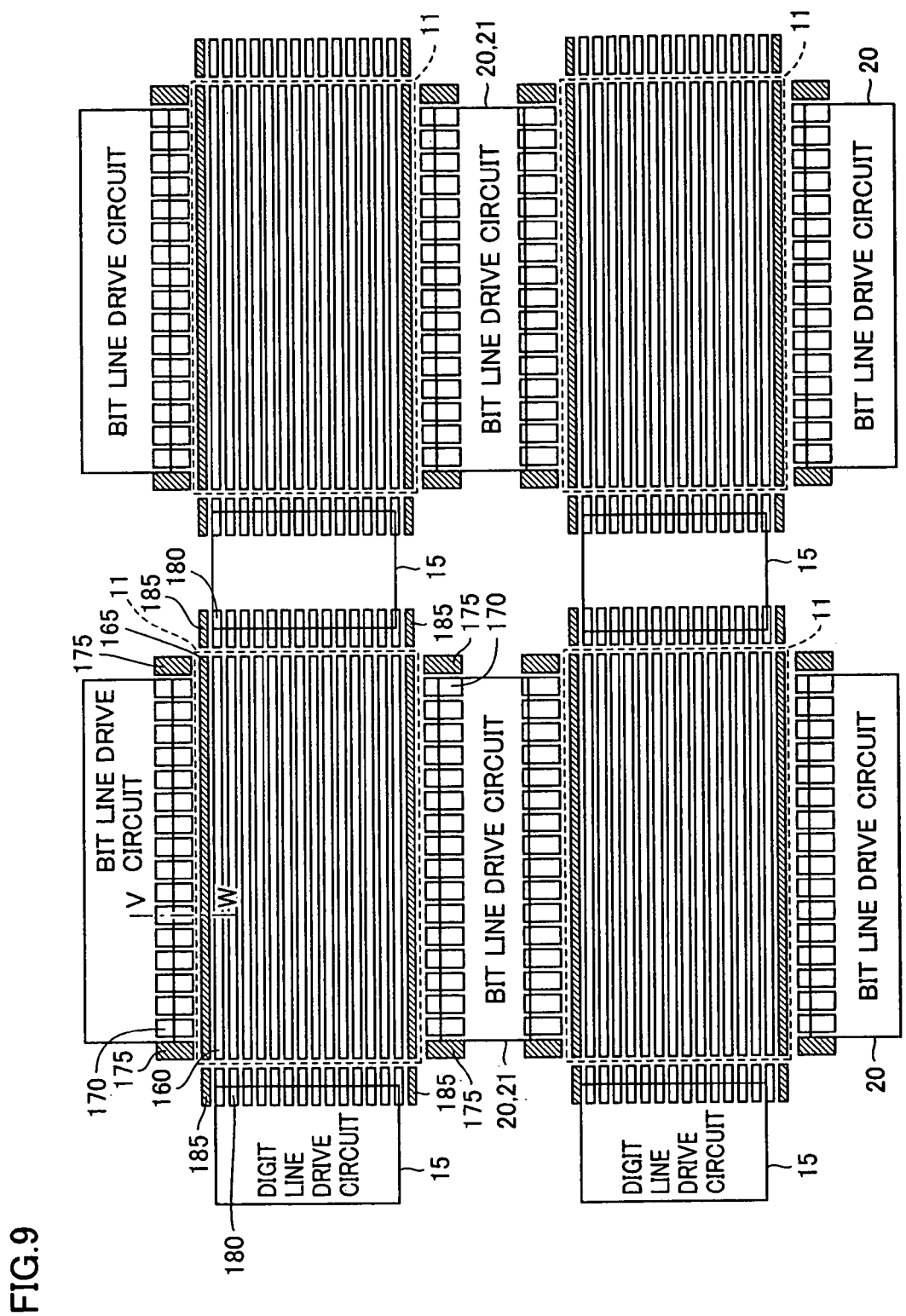
FIG. 9 is a conceptual diagram showing a layout of shape dummies according to a second embodiment.

FIG. 9 is a conceptual diagram showing a layout of shape dummies according to the second embodiment.

With reference to FIG. 9, transistor patterns 180 for forming transistor groups in the configurations of write digit line drive units WDU as shown in FIG. 2 are provided for every memory cell row in digit line drive circuits 15. Transistor patterns 170 for forming transistor groups in the configurations of bit line drive units BDU and BDU# are provided for every memory cell column in bit line drive circuits 20 and 21 in the same manner as above. In addition, as described above, diffusion layers 160 corresponding to source lines SL are formed so as to extend in the row direction in the memory blocks.

In the configuration according to the second embodiment, shape dummies are provided in the transistor groups of the peripheral circuits in addition to shape dummy cells SDC provided for normal memory cells MC. Furthermore, each shape dummy cell SDC does not necessarily have the same structure as that of normal memory cell MC.

Concretely, as for diffusion layers 160 provided for source lines SL, a dummy active region 165 making up a row is provided in sequence with rows of diffusion layers 160 in a periphery region of in each memory block 11. Dummy structural patterns 175 and 185, making up one column or one row, are provided for transistor patterns 170 and 180.

Figure 10:
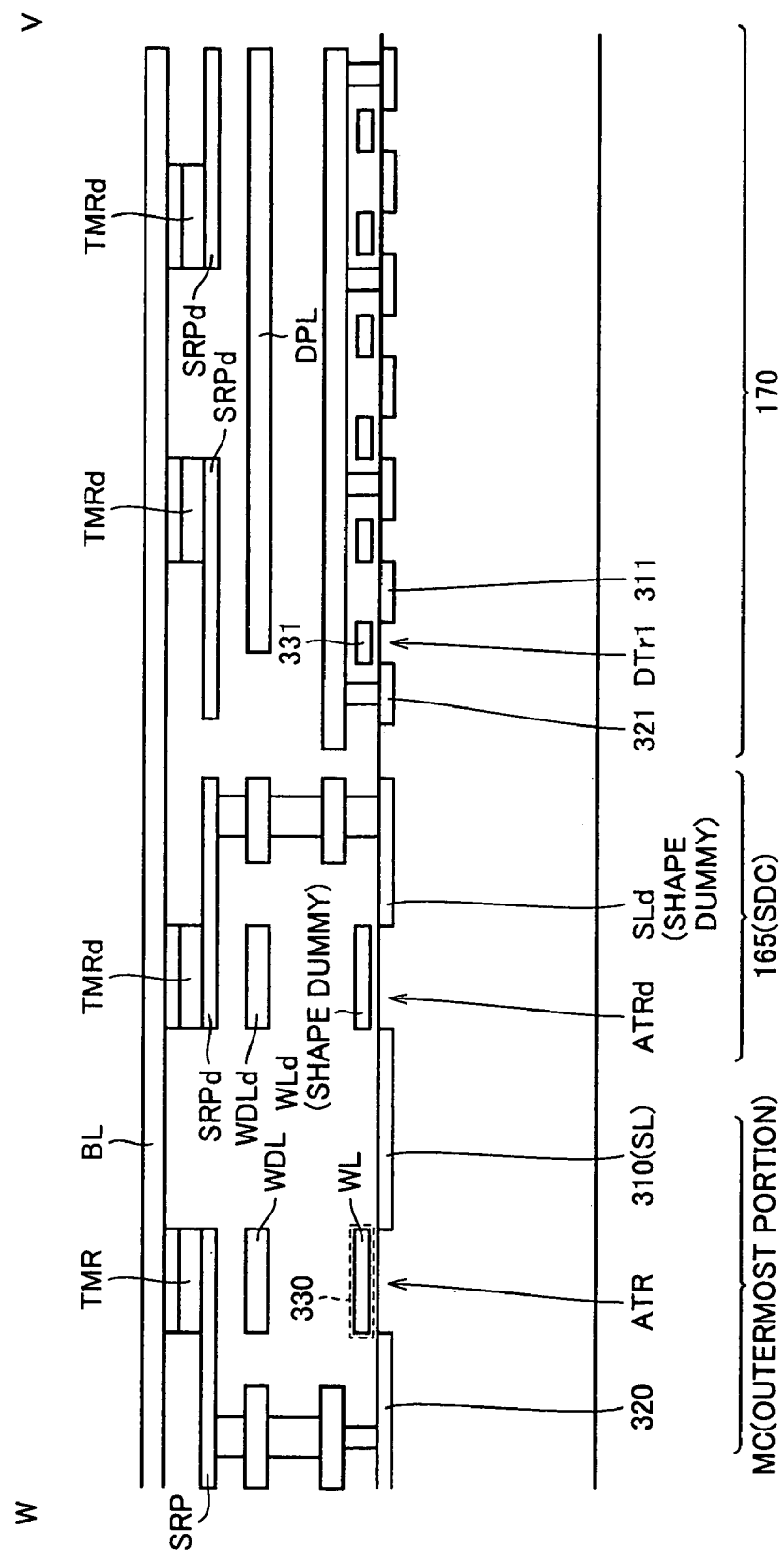
FIG. 10 is a cross sectional view along line V-W of FIG. 9.

FIG. 10 is a cross sectional view along line V-W in FIG. 9.

With reference to FIG. 10, a normal memory cell MC located at an outermost portion of memory block 11 is shown on the W side in the cross section along line V-W as described above, normal memory cell MC has a tunneling magneto-resistance element TMR and an access transistor ATR.

A shape dummy ATRd of the access transistor is provided using a diffusion layer provided in dummy active region 165. Shape dummy ATRd has the same structure and dimensions as access transistor ATR in a normal memory cell. In particular, a diffusion layer provided as a shape dummy SLD of source line SL is formed so as to extend in the row direction.

Respective shape dummies WDLd and TMRd of write digit line WDL and tunneling magneto-resistance element TMR are provided in layers above shape dummy ATRd in accordance with the same structures and dimensions as normal memory cell MC. As a result of this, shape dummy cells SDC having the same structures as normal memory cells MC are arranged in dummy active region 165. Accordingly, the forms and dimensions of access transistors ATR, word lines WL, source lines SL and write digit lines WDL can be made uniform within a memory block due to the provision of the shape dummies.

A plurality of driver transistors forming bit line drive units BDU and BDU# is arranged in transistor pattern 170. FIG. 10 shows a driver transistor DTr1 having source/drain regions 311 and 321 as well as a gate region 331 in a representative manner. A power supply wire DPL, or the like, for driver transistors is arranged in a layer above a plurality of driver transistors.

Furthermore, a shape dummy TMRd of a tunneling magneto-resistance element TMR and shape dummy SRPd of a strap SRP are arranged in an upper layer portion of transistor pattern 170. As a result of this, a wire group, that is to say, shape dummies of source line SL, word line WL and write digit line WDL making up one row is provided for normal memory cells MC. Contrarily, shape dummies making up three rows, which includes a greater number of dummies, of tunneling magneto-resistance elements TMR and of straps SRP, wherein the risk of non-uniformity in the forms of normal memory cells MC is greater, are provided for normal memory cells MC.

In such a configuration, the area penalty due to the provision of shape dummies is restricted and, in addition, it becomes possible to efficiently position shape dummies in order to ensure the uniformity of normal memory cells MC. Here, a portion including shape dummies in the row direction is described with reference to FIGS. 9 and 10 and it is possible to design the shape dummies in the column direction in the same manner.

In addition, with reference to FIGS. 9 and 10, the provision of shape dummies in the case where the configuration and the MTJ memory cell array shown in FIG. 8 are broken down into a plurality of memory blocks 11 is described and it is possible to apply the same configuration to a MTJ memory cell array having a configuration that is not divided into memory blocks, as shown in FIG. 1.

Modification of Second Embodiment

As for a modification of the second embodiment, a configuration is described wherein the lowering of the resistance of source line SL formed in diffusion layers and the uniform manufacture of normal memory cells are both possible.

Figure 11:
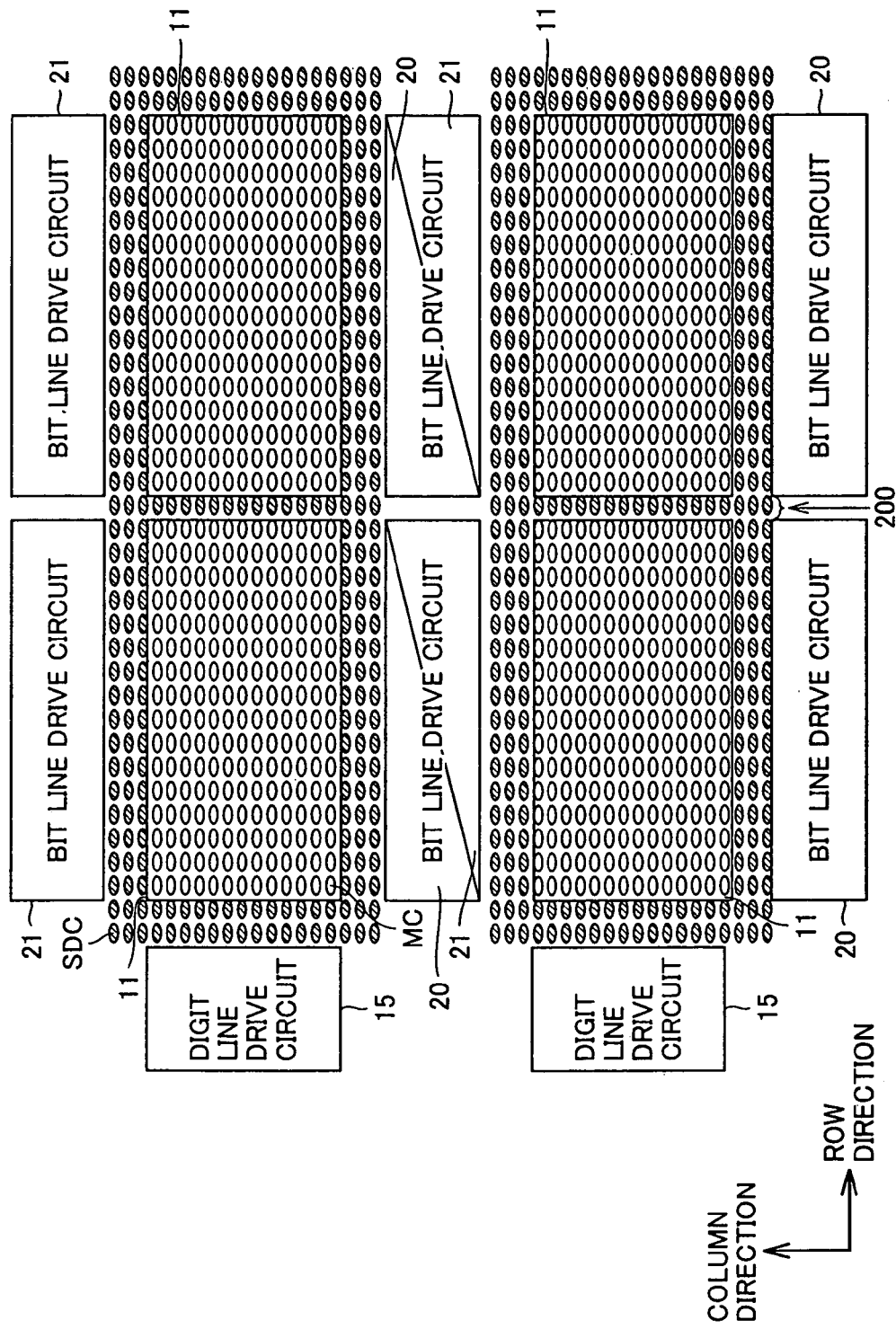
FIG. 11 is a first conceptual diagram showing a layout of shape dummies according to a modification of the second embodiment.
Figure 12:
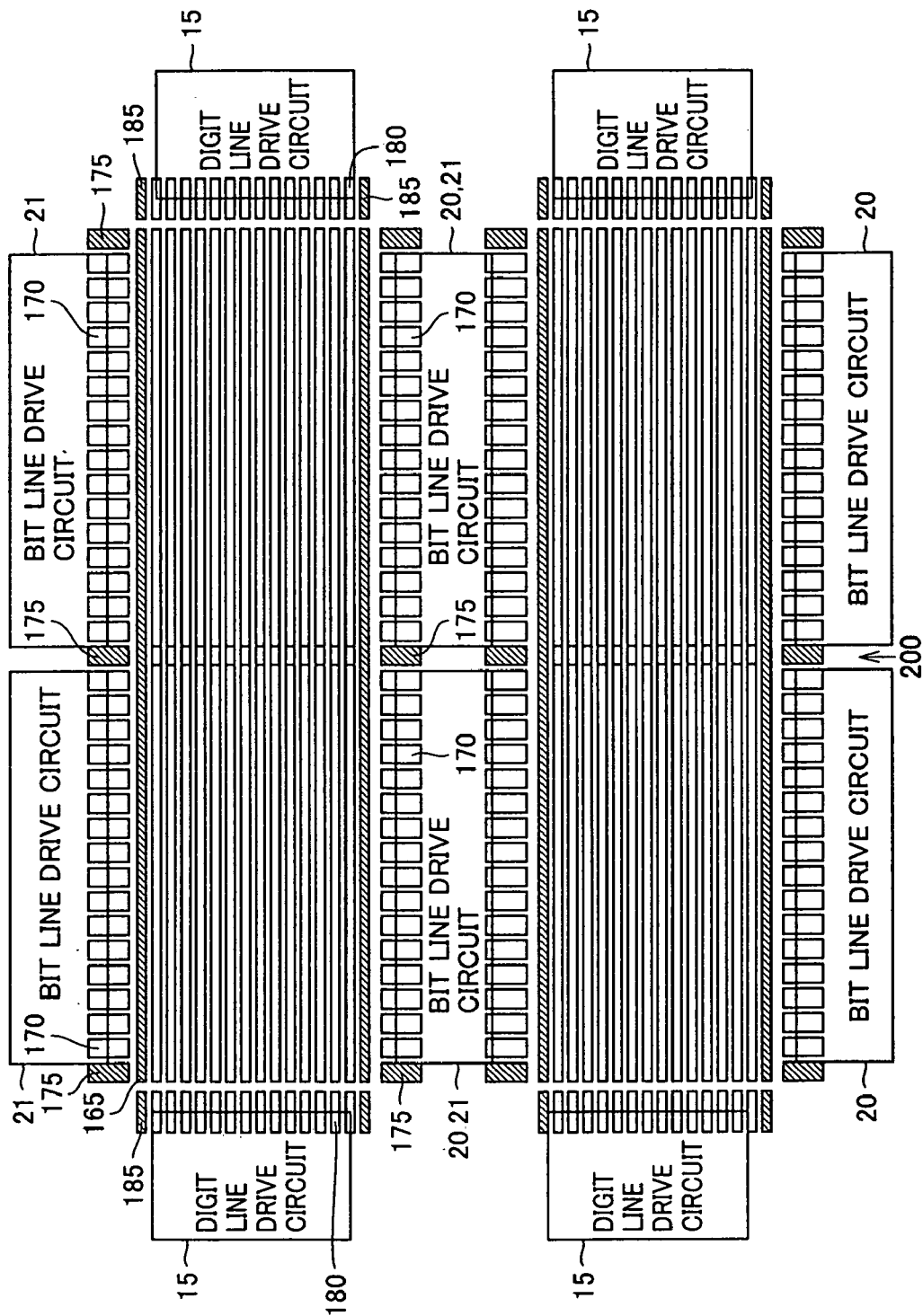
FIG. 12 is a second conceptual diagram showing a layout of shape dummies according to the modification of the second embodiment.

FIGS. 11 and 12 are conceptual diagrams showing a layout of shape dummies according to the modification of the second embodiment.

With reference to FIG. 11, a dummy column region 200 is arranged in a region corresponding to the border portion between memory blocks 11. The other parts of the configuration are the same as in FIG. 8 and, therefore, detailed descriptions thereof are not repeated.

With reference to FIG. 12, shape dummies 165, 175 and 185 are arranged in the configuration according to the modification of the second embodiment in the same manner as in the configuration according to the second embodiment shown in FIG. 9. The parts of the structure other than dummy column region 200 are the same as in FIGS. 9 and 10 and, therefore, detailed descriptions thereof are not repeated.

Next, the configuration of a dummy column portion in the memory array region is described in detail with reference to FIGS. 13A and 13B.

FIGS. 13A and 13B are cross sectional views in the column direction for describing the structure of dummy column region 200. FIG. 13A shows a cross sectional view of dummy column region 200 while FIG. 13B shows a cross sectional view of a portion wherein normal memory cells are arranged in the column direction.

With reference to FIG. 13B, access transistors ATR (including source lines SL and word lines WL), write digit lines WDL, straps SRP, tunneling magneto-resistance elements TMR and bit line BL are formed, in this order starting from the bottom, in the normal memory cell portion in the same manner as in the cross section along line R-S shown in FIG. 3.

Contrarily, a wire 210 for shunting that extends in the column direction is arranged in dummy column region 200, shown in FIG. 13A, using the same metal wire layer as bit lines BL. Furthermore, shape dummies TMRd and SRPd of the tunneling magneto-resistance elements TMR and of the straps are provided in layers below the metal wire.

Shape dummies ATRd of the access transistors are arranged on the lower layer side so as to share word lines WL and source lines SL (diffusion layers) arranged so as to extend in the row direction with access transistors ATR in the normal memory cell portion in the same manner as in the above. That is to say, word lines WL and source lines SL are arranged in sequence with the normal memory cell portion in dummy column region 200. Write digit lines WDL are also arranged in sequence with the normal memory cell portion in the same manner. As a result of this, the sequential layout of MTJ memory cells is ensured even when dummy column region 200 is provided and, therefore, normal memory cells MC can be uniformly manufactured.

Furthermore, metal films are formed in contact holes 225 provided for electrically coupling source lines SL and wires 210 for shunting in dummy column region 200. As a result of this, source lines SL formed in diffusion layers are connected to metal wire 210 for shunting so that the lowering of resistance can be achieved. Thereby, it becomes possible to increase the speed of operation at the time of data read.

As described above, the lowering of the resistance of source lines SL is achieved and, in addition, shape dummies for uniform manufacture of normal memory cells MC and corresponding wire groups can be efficiently arranged in the configuration according to the modification of the second embodiment.

Third Embodiment

In a third embodiment, the configuration of a magnetic field application apparatus utilized in a manufacturing process for an MRAM device is described. As described above, a magnetization process for magnetizing fixed magnetic layers FL, shown in FIGS. 39 to 43, in a predetermined direction becomes necessary in a manufacturing process for an MRAM device.

Figure 14:
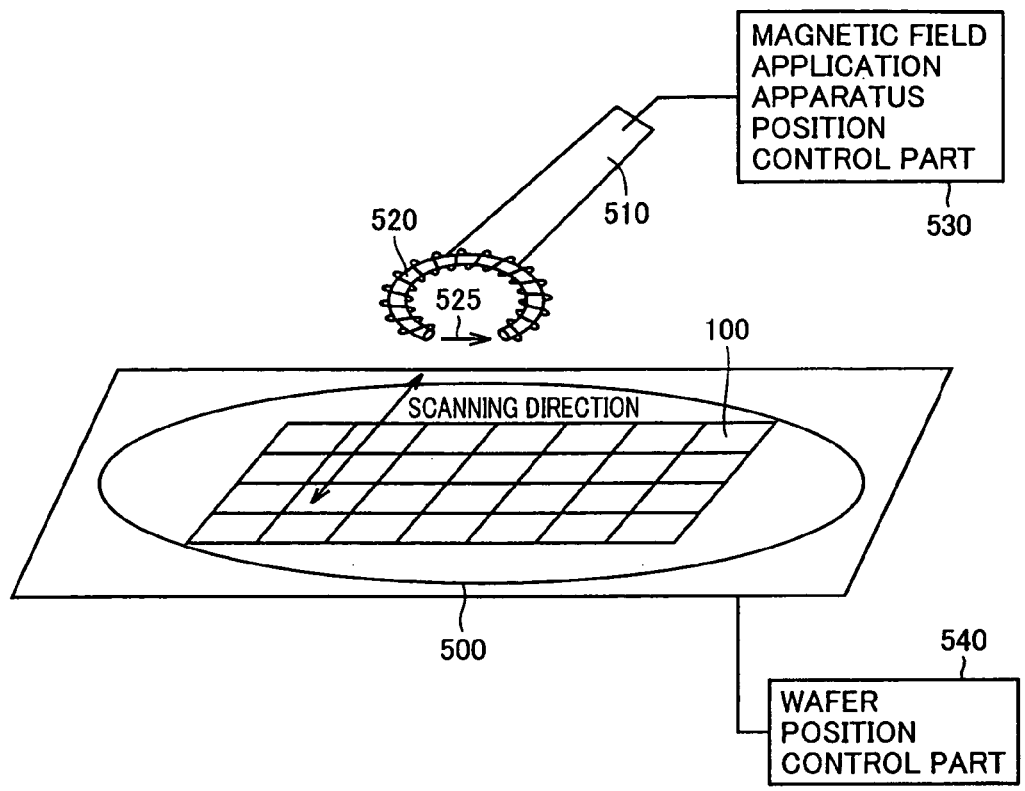
FIG. 14 is a conceptual diagram showing the configuration of a magnetic field application apparatus according to a third embodiment.

With reference to FIG. 14, a magnetic field application apparatus 510 according to the third embodiment has a solenoid coil 520 formed to have a loop form in which a portion is left out. Magnetic field application apparatus 510 supplies a predetermined current to solenoid coil 520 and, thereby, a predetermined magnetic field 525 can be generated in a gap portion resulting from the left out portion of solenoid coil 520 in accordance with this predetermined current. That is to say, predetermined magnetic field 525 can be microscopically adjusted by the current supplied to solenoid coil 520.

On the other hand, the surface of wafer 500 includes a plurality of chips 100 wherein MRAM devices or system LSIs that become magnetization objects are formed. Furthermore, At least one of a magnetic field application apparatus position control part 530 for carrying out position control of magnetic field application apparatus 510 and a wafer position control part 540 for carrying out position control of wafer 500 is provided so as to obtain a configuration wherein at least one of magnetic field application apparatus 510 and wafer 500 can be scanned.

Figure 15:
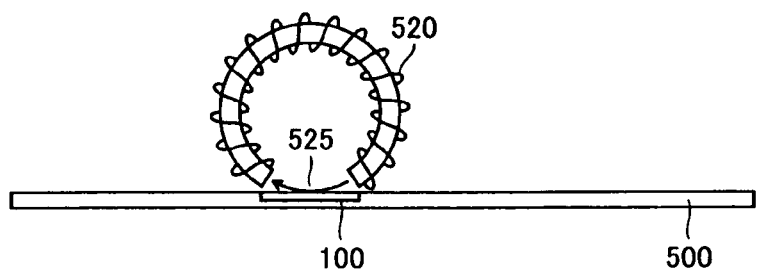
FIG. 15 is a conceptual diagram for describing a magnetization process of a chip by means of the magnetic field application apparatus shown in FIG. 14.

FIG. 15 is a conceptual diagram for describing the magnetization process of a chip using the magnetic field application apparatus shown in FIG. 14.

With reference to FIG. 15, the magnetization process for chip 100 on wafer 500 is carried out by means of predetermined magnetic field 525 generated in the gap portion of solenoid coil 520. Accordingly, the gap portion of solenoid coil 520 is made to approach chip 100 that becomes an object of the magnetization process and, thereby, the magnetization process can be carried out by means of predetermined magnetic field 525.

Such a magnetization process is carried out by controlling the relative positional relationship between magnetic field application apparatus 510 and wafer 500 using at least one of magnetic field application apparatus position control part 530 and wafer position control part 540 shown in FIG. 14. That is to say, an arbitrary chip 100 can be moved close to the gap portion of solenoid coil 520.

As described above, a mechanism is obtained wherein a predetermined magnetic field utilized in the magnetization process is generated in the gap portion of solenoid coil 520 and, thereby, magnetization can be carried out in chip 100 units, instead of in wafer 500 units. As a result of this, it becomes possible to make magnetic field application apparatus 510 compact in size, regardless of the size of wafers 500. In other words, in the case where a similar magnetization process is carried out in wafer 500 units, the magnetic field application apparatus becomes large in size and, furthermore, an adjustment becomes necessary in the magnetic field application apparatus in accordance with the diameter of wafers 500, though the collective magnetization of a plurality of chips 100 is possible.

As described above, it becomes possible to make the magnetic field application apparatus compact in size and to selectively apply a magnetic field to the chips, making up a plurality, on the same wafer in the configuration according to the third embodiment.

Modification of Third Embodiment

In a modification of the third embodiment, the configuration of a magnetic field application apparatus for applying a magnetic field to a plurality of wafers is described.

Figure 16:
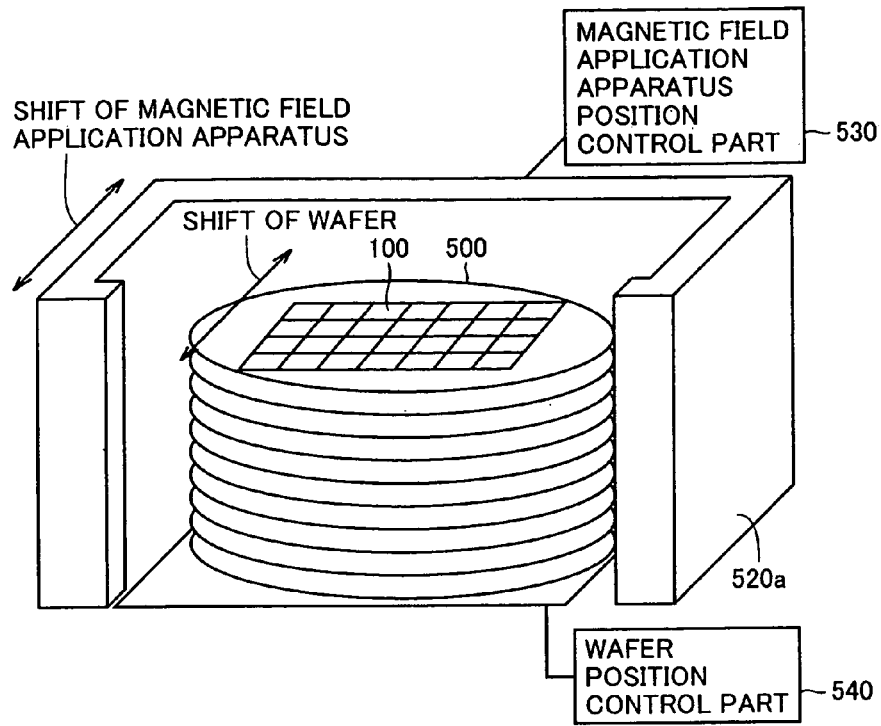
FIG. 16 is a conceptual diagram showing a first example of a magnetic field application apparatus according to a modification of the third embodiment.
Figure 17:
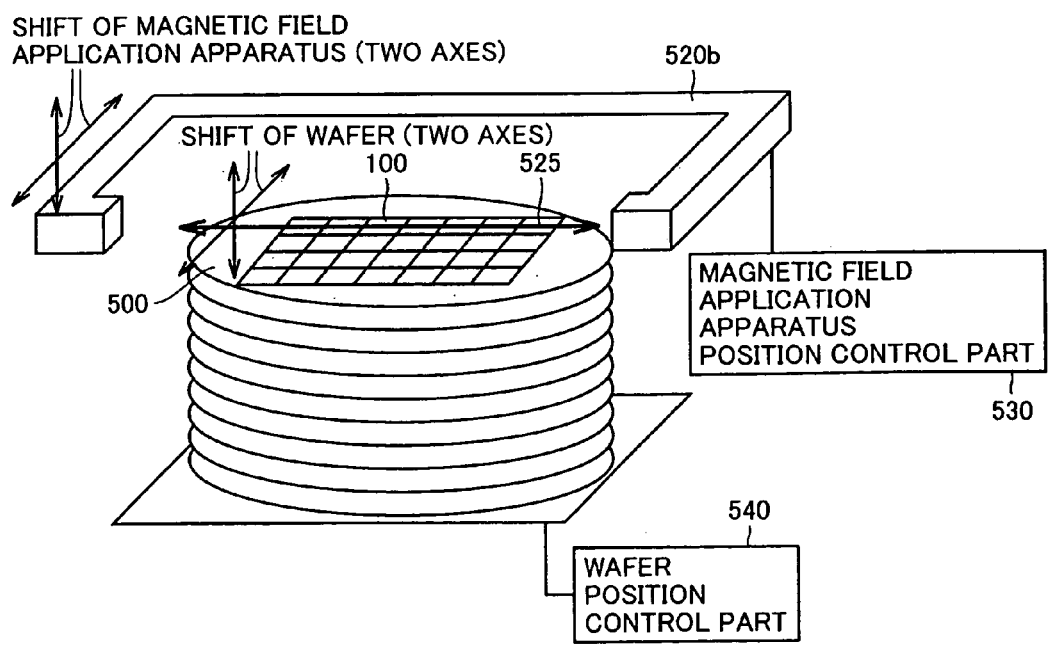
FIG. 17 is a conceptual diagram showing a second example of a magnetic field application apparatus according to the modification of the third embodiment.

FIGS. 16 and 17 are conceptual diagrams showing an example of the configuration of a magnetic field application apparatus according to the modification of the third embodiment.

With reference to FIG. 16, the magnetic field application apparatus according to the modification of the third embodiment is provided with a solenoid coil 520a having a gap portion greater than the diameter of wafers 500. Solenoid coil 520a is formed so as to have a thickness that allows a predetermined magnetic field to be simultaneously applied to a plurality of wafers 500 in a stack.

In such a configuration, at least one of a magnetic field application apparatus position control part 530 and a wafer position control part 540 is provided in the same manner as in FIG. 14 and, thereby, either wafers 500 or solenoid coil 520a is moved so that a predetermined magnetic field 525 can be simultaneously applied to a plurality of wafers. Accordingly, the throughput of the magnetization process for MRAM devices is increased and productivity is increased.

Alternately, as shown in FIG. 17, a configuration can be provided wherein predetermined magnetic field 525 is applied by another type of solenoid coil 520b that is thinner than the above. That is to say, m the configuration according to FIG. 17, solenoid coil 520b is formed to have a thickness that allows the application of a predetermined magnetic field to a portion of the plurality of wafers 500 in the stack.

In the configuration according to FIG. 17, solenoid coil 520b is moveable in two axis directions by means of magnetic field application apparatus position control part 530 while wafers 500 are moveable in the two axis directions in the same manner by means of wafer position control part 540. In addition, only one of magnetic field application apparatus position control part 530 and wafer position control part 540 is arranged in the configuration in the same manner as in FIGS. 15 and 16.

In such a configuration, a plurality of chips on the same wafer can be simultaneously magnetized and it becomes possible to reduce the size of the magnetic field application apparatus in comparison with that shown in FIG. 16.

Fourth Embodiment

In a fourth embodiment, a design method for making possible the efficient implementation of the magnetization process described in the third embodiment to a system LSI provided with a plurality of MTJ memory cell arrays.

Figure 18:
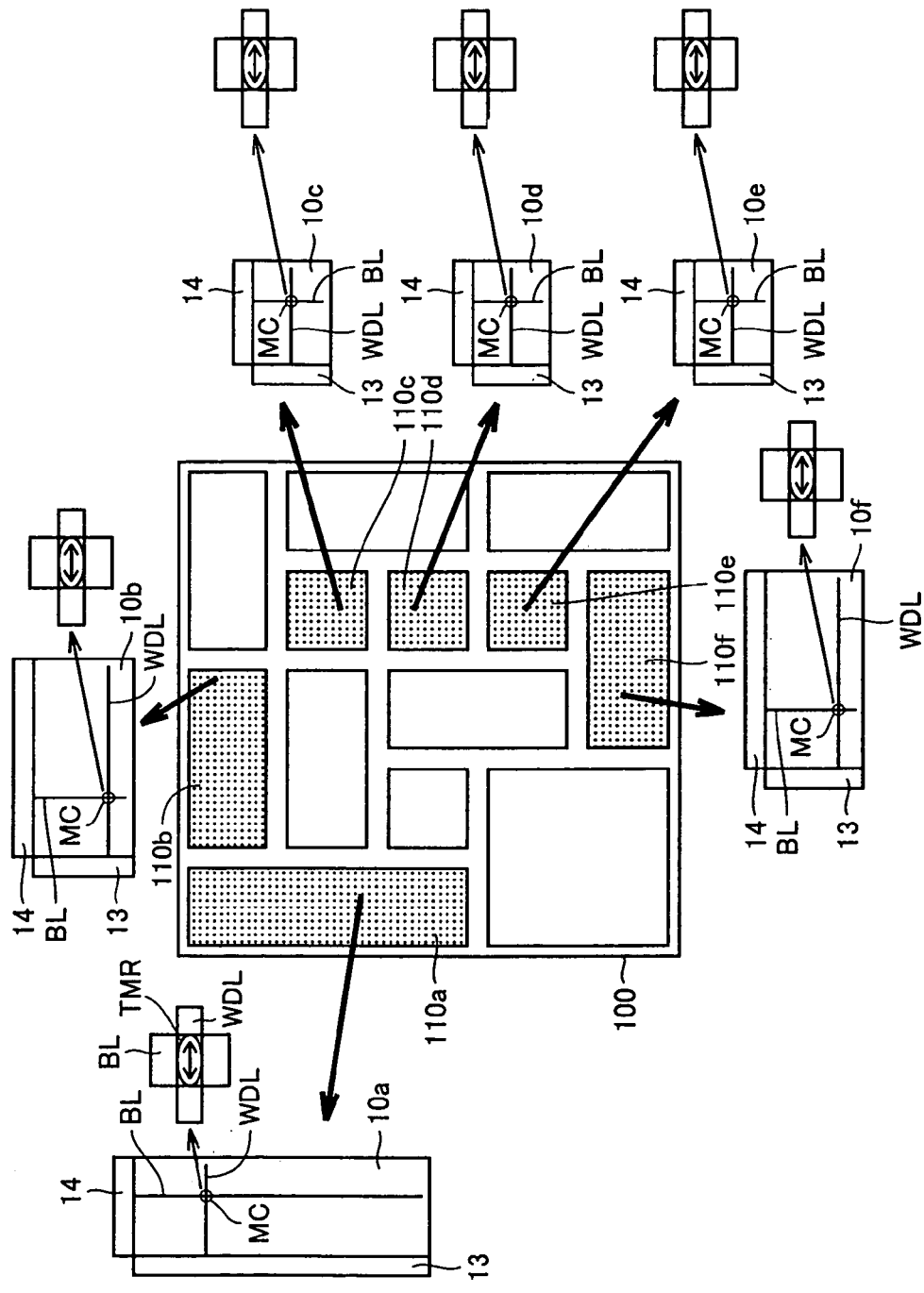
FIG. 18 is a schematic diagram showing a first example according to a fourth embodiment of a semiconductor integrated circuit device provided with a plurality of MTJ memory cell arrays.

With reference to FIG. 18, a system LSI 100, shown as the first example of the configuration of a semiconductor integrated circuit device according to the fourth embodiment, is provided with a plurality of MRAM circuit blocks 110a to 110f. MRAM circuit blocks 110a to 110f, respectively, include MTJ memory cell arrays 10a to 10f, wherein the MTJ memory cells are arranged in the matrix, formed in the same manner as is MTJ memory cell array 10, shown in FIG. 1.

Peripheral circuit portions are arranged in each of MTJ memory cell arrays 10a to 10f in the same manner as described in FIG. 1 and FIG. 18 shows a layout of row decoder 13 and column decoder 14 in a representative manner. The configuration according to the fourth embodiment does not necessarily require the provision of dummy structural cells for each of MTJ memory cell arrays 10a to 10f.

As described above, a normal memory cell MC, which is an MTJ memory cell, is provided with a tunneling magneto-resistance element TMR that is magnetized in either the positive direction or the negative direction along easy axis (EA) in accordance with the level of write data. In addition, a bit line BL for providing a data write magnetic field in the easy axis direction and a write digit line WDL for generating a magnetic field in the hard axis direction are provided to each normal memory cell MC. That is to say, a data write current is selectively made to flow through bit line BL in a direction differing according to the level of the write data at the time of data write while a data write current is selectively made to flow through write digit line WDL in a fixed direction, regardless of the level of the write data.

In system LSI 100, row decoder 13 and column decoder 14 for selecting write digit line WDL and bit line BL, respectively, are stably arranged in each of MRAM circuit blocks 110a to 110f. In the example of FIG. 18, row decoder 13 is arranged on the left side of each of the corresponding MTJ memory cell arrays while column decoder 14 is arranged on the upper side of each of the corresponding MTJ memory cell arrays.

In such a configuration, the directions of currents flowing through write digit lines WDL and bit lines BL at the time of data write as well as the directions of write digit lines WDL and bit lines BL become the same in each of the MRAM circuit blocks 110a to 110f. As a result of this, the layout pattern of memory cells is determined so that the easy magnetization axes of the MTJ memory cells (tunneling magneto-resistance elements TMR) are oriented in the same direction in each of the plurality of MTJ memory cell arrays 10a to 10f arranged in the same system LSI 100 (that is to say, in the same chip).

In such a configuration, fixed magnetic layers FL in tunneling magneto-resistance elements TMR of a plurality of MTJ memory cells formed on the same system LSI 100, that is to say, in the same chip, can be collectively magnetized in the configuration according to the fourth embodiment. Here, such a magnetization process can be efficiently carried out by using the magnetic field application apparatus shown in the third embodiment or in the modification thereof.

Figure 19:
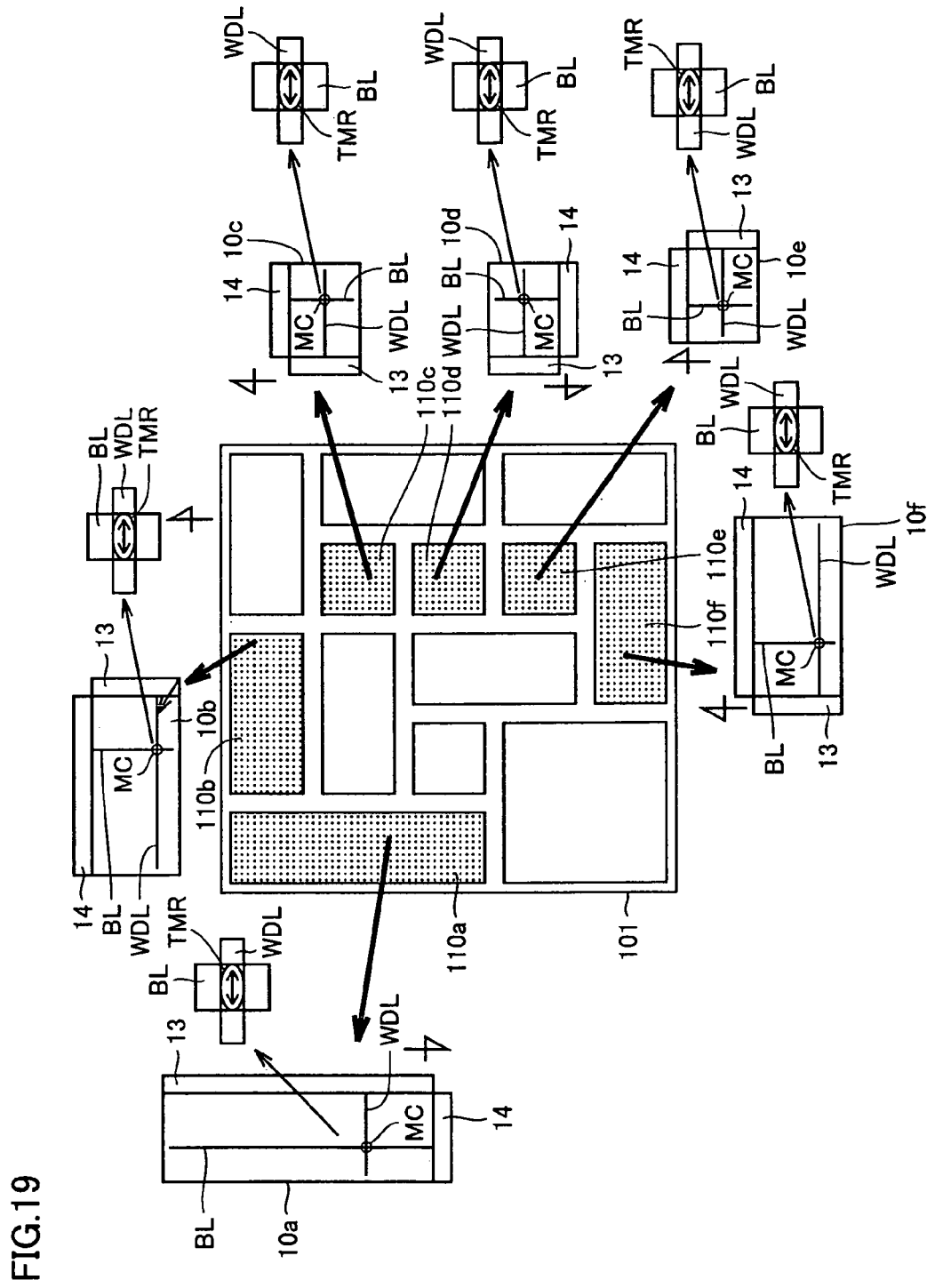
FIG. 19 is a schematic diagram showing a second example according to the fourth embodiment of a semiconductor integrated circuit device provided with a plurality of MTJ memory cell arrays.

FIG. 19 shows an example of a layout of memory cells in system LSI 101 according to the second example of the configuration of the semiconductor integrated circuit device according to the fourth embodiment.

MTJ memory cells having a line symmetric and point symmetric form (also referred to as a "fully symmetric form") such as a rectangle or an ellipse, are arranged in each of MTJ memory cell arrays 10a to 10f in system LSI 101.

There is no limitation in the rotational direction of the magnetic poles of tunneling magneto-resistance element TMR (free magnetic layer VL) at the time of data write in an MTJ memory cell in a fully symmetric form and, therefore, there is no specific limitation to the combinations of directions of data write currents that flow through bit line BL and write digit line WDL, respectively. Accordingly, as shown in FIG. 19, the layout pattern of memory cells is determined in each of MTJ memory cell arrays 10a to 10f in the same chip so that the easy magnetization axes of MTJ memory cells (tunneling magneto-resistance elements TMR) are oriented in the same direction by placing write digit lines WDL and bit lines BL in the same direction.

In other words, row decoder 13 and column decoder 14 can be freely arranged as long as write digit lines WDL and bit lines BL are oriented in the same direction in an MTJ memory cell of a fully symmetric form so that the freedom of layout design increases. That is to say, in the example of the configuration of FIG. 19, row decoder 13 for selecting write digit line WDL can be arranged on either the left side or right side of the corresponding MTJ memory cell while column decoder 14 for selecting bit line BL can be arranged on either the upper side or lower side of the corresponding MTJ memory cell.

FIGS. 20A to 20D are conceptual diagrams showing a variation of the form of the MTJ memory cell.

Figure 20A:
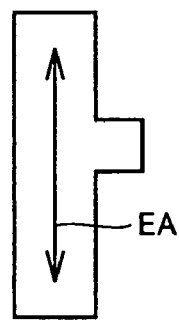
FIGS. 20A to 20D are conceptual diagrams showing a variation of the form of the MTJ memory cell.

FIG. 20A shows an MTJ memory cell in the form of a rectangle having a protrusion in order to achieve the stabilization of magnetization characteristics. In such an MTJ memory cell, the easy axis is in the direction parallel to the long sides of the rectangle. In some cases in a system LSI wherein is arranged an MTJ memory cell with a form that is neither point symmetric nor line symmetric (also referred to as "asymmetric form"), such as the above, the rotational direction of the magnetic poles is restricted in tunneling magneto-resistance element TMR at the time of data write. Even in such a case, MTJ memory cells can be arranged in each MTJ memory cell array so that the easy magnetization axes of the MTJ memory cells (tunneling magneto-resistance elements TMR) are oriented in the same direction by implementing the layout shown in FIG. 18. Though not shown, boomerang-shaped or L-shaped MTJ memory cells can be used as MTJ memory cells in asymmetric forms.

Figure 20B:
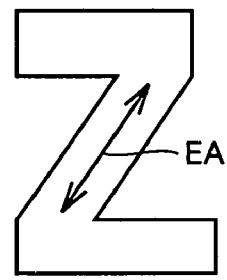
Figure 20C:
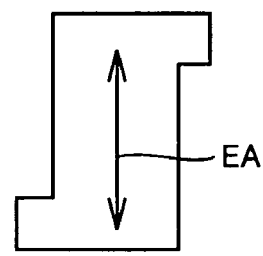

FIGS. 20B and 20C examples of MTJ memory cells having forms that are point symmetric but are not line symmetric (also referred to as "point symmetric form"). In these MTJ memory cells, the easy magnetization axes are in the direction parallel to the long sides of the figures. In the MTJ memory cells in point symmetric forms, the rotational direction of the magnetic poles in tunneling magneto-resistance elements TMR can be limited at the time of data write. That is to say, there is a possibility that it may become necessary to set the direction of the data write current through write digit line WDL relative to the direction of the data write current in bit line BL at each level of the write data.

Figure 21:
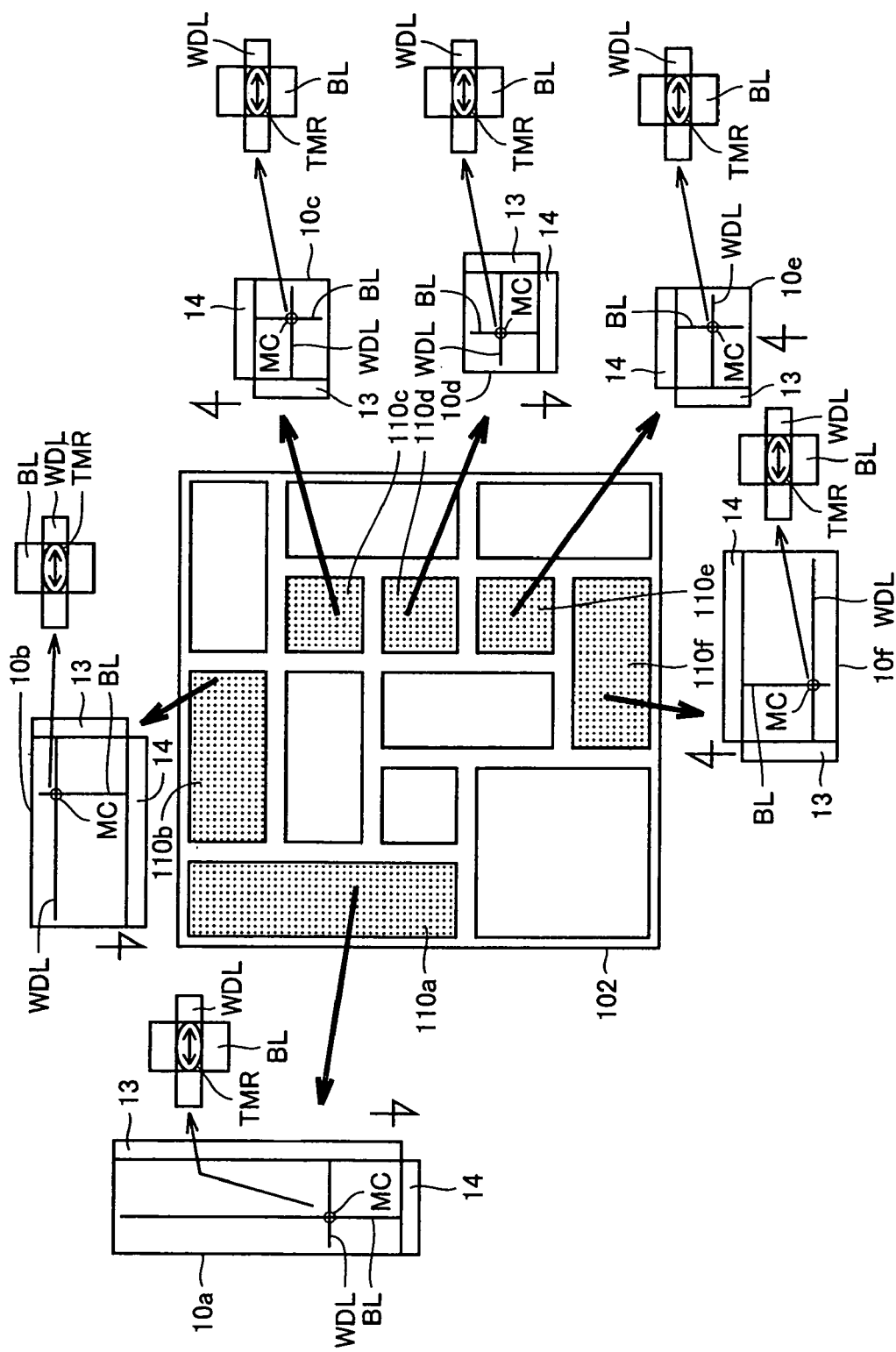
FIG. 21 is a schematic diagram showing a third example according to the fourth embodiment of the semiconductor integrated circuit device provided with a plurality of MTJ memory cell arrays.

FIG. 21 shows a system LSI 102 that includes an MTJ memory cell having a point symmetric form as a semiconductor integrated circuit device according to the third example of the configuration of a semiconductor integrated circuit device according to the fourth embodiment.

System LSI 102 has a configuration that takes into consideration the limitation of direction of the data write current in the above described MTJ memory cell in a point symmetric form. That is to say, the directions of row decoder 13 and column decoder 14 relative to a plurality of MTJ memory cell arrays 10a to 10f arranged in the same chip is limited to either of two types (directions in which MTJ memory cell arrays 10a and 10f, respectively, are arranged in FIG. 19), which are point symmetric with each other.

In such a configuration, the direction of the data write current through write digit line WDL relative to the direction of the data write current through bit line BL is set at each level of the write data and, in addition, Write digit line WDL and bit line BL are oriented in the same direction so that the easy magnetization axes of the MTJ memory cells (tunneling magneto-resistance elements TMR) can be oriented in the same direction in layout of each MTJ memory cell array.

Here, in the case that the rotational direction of the magnetic poles is not limited in tunneling magneto-resistance element TMR at the time of data write it is possible to position, even in an MTJ memory cell in a point symmetric form, row decoder 13 and column decoder 14 with the same freedom as shown in FIG. 18.

Figure 22:
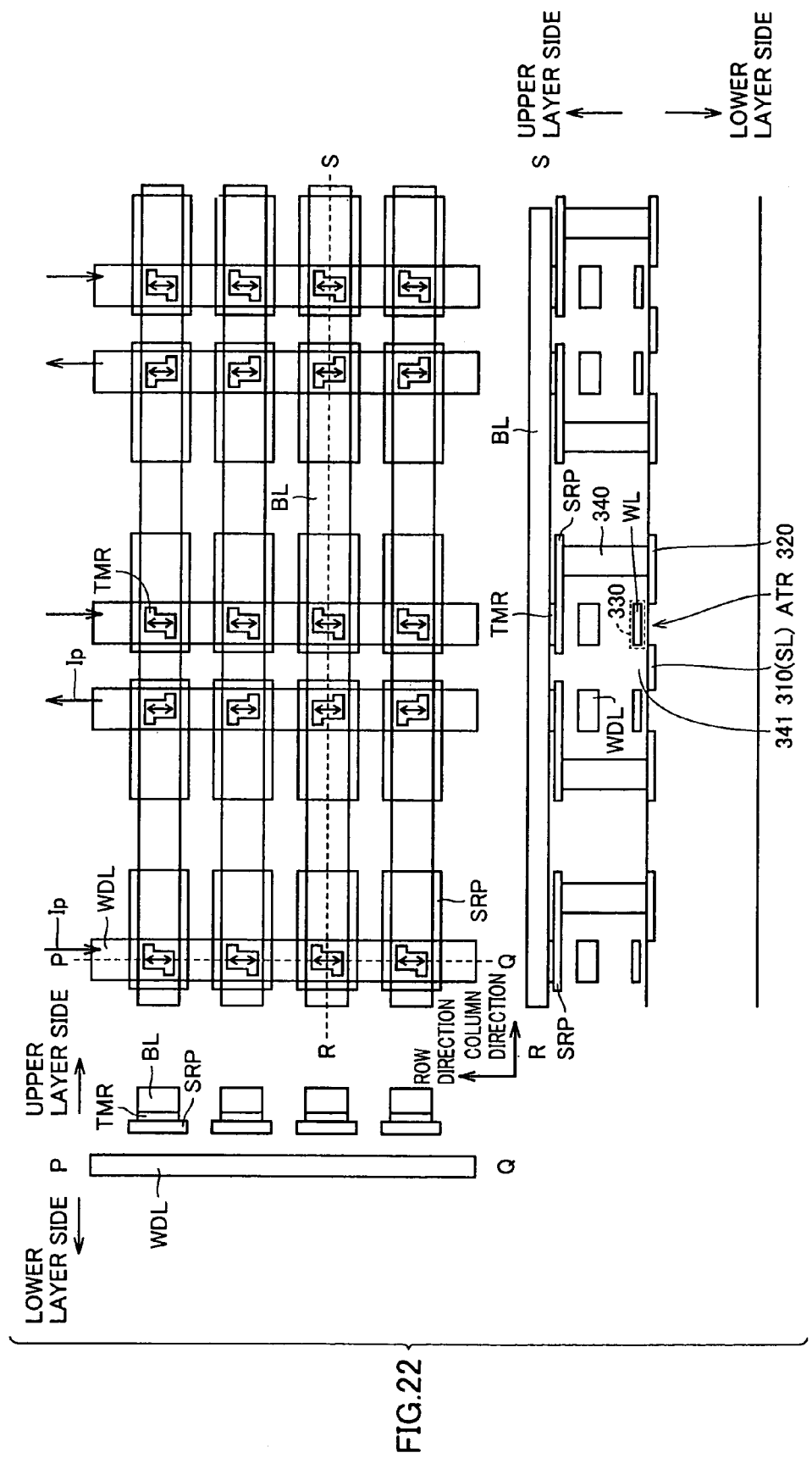
FIG. 22 is a diagram showing an efficient layout of MTJ memory cells in a point symmetric form.

In particular, it is possible to efficiently position MTJ memory cells in a point symmetric form within an MTJ memory cell array in the manner shown in FIG. 22.

FIG. 22 is a diagram showing an efficient outline of MTJ memory cells having a point symmetric form in an MTJ memory cell array.

With reference to FIG. 22, MTJ memory cells in a point symmetric form arranged in sequence are shown in a plan view and in a cross sectional view in the same manner in FIG. 4. In the configuration of FIG. 22, only the form of memory cells in the plan view differs from that in FIG. 4, and the outline of the signal wire groups and cross sectional structures of the MTJ memory cells are the same as in FIG. 4.

The MTJ memory cells having point symmetric form are arranged so that their easy magnetization axes are oriented in the same direction throughout the entirety of MTJ memory cell array and, in addition, within the same chip while the MTJ memory cells corresponding to adjacent write digit lines WDL are arranged in directions opposite to each other so as to be in a line symmetric relationship with each other within the MTJ memory cell array. Contrarily, the MTJ memory cells corresponding to the same write digit line WDL are arranged in the same direction as each other.

As described above, it is not necessary to control the direction of data write current Ip through write digit line WDL in accordance with write data and, therefore, it is sufficient to provide a driver for the write digit line (corresponding to write digit line drive unit WDU shown in FIG. 2) in either one of the two ends of write digit line WDL. Accordingly, such drivers are arranged at alternating ends of write digit lines WDL and it becomes difficult to make the layout efficient.

In the case that such an efficient layout of right digit line drivers is implemented, there is a risk that the data write characteristics may become non-uniform when the MTJ memory cells in a point symmetric form are oriented in the same direction so that the rotational directions of the magnetic poles in tunneling magneto-resistance elements TMR in every other write digit line WDL become opposite to each other. Accordingly, as for the MTJ memory cells in a point symmetric form, the alternating layout shown in FIG. 22 allows the achievement of the stabilization of the data write characteristics as well as an efficient layout of write digit line drivers.

Furthermore, rotation of the magnetic poles in response to a magnetic field applied from adjacent write digit line WDL becomes difficult because of the placement of MTJ memory cells in a point symmetric form in different directions and, thereby, the occurrence of erroneous data write can be restricted.

Figure 20D:
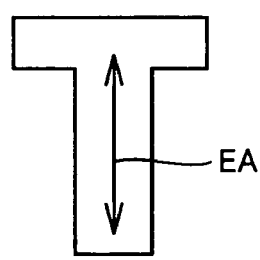

Here, as for the form of the MTJ memory cells, forms that are line symmetric but not point symmetric (also referred to as "line symmetric forms"), such as the T-shape shown in FIG. 20D or U-shaped, not shown, may be used. An outline that is the same as any of those in FIGS. 18, 19 and 21 may be used for MTJ memory cells in a line symmetric form so that an arrangement wherein the easy magnetization axes of the MTJ memory cells (tunneling magneto-resistance elements TMR) are oriented in the same direction can be used in accordance with the restrictions in the rotational directions of the magnetic poles of tunneling magneto-resistance elements TMR.

That is to say, in the configuration according to the fourth embodiment, the layout pattern of memory cells is designed so that the easy axis of the each MTJ memory cell (tunneling magneto-resistance elements TMR) is oriented in the same direction for each of a plurality of MTJ memory cell arrays arranged in the same chip. Thereby, the magnetization process of fixed magnetic layers FL in tunneling magneto-resistance elements TMR can be made efficient for the plurality of MTJ memory cells on this chip.

Here, it is not necessary to magnetize the fixed magnetic layers in a predetermined direction for MTJ memory cells wherein data is not stored in accordance with the magnetic direction, such as those arranged as mere shape dummies or those arranged as OTP (One-Timing-Programming) elements wherein data is permanently stored according to the existence of tunneling film breakdown resulting from the application of an electric field, as disclosed in U.S. Pat. No. 6,324,093B1, even in the case of MTJ memory cells arranged on the same chips. Accordingly, it is not necessary to specifically limit the direction of these MTJ memory cells. In other words, the direction of the plurality of MTJ memory cells (easy axis direction), wherein data is stored in accordance with the direction of magnetization, is oriented within the same chip according to the configuration of the fourth embodiment and, thereby, the purpose of making the magnetization process for fixed magnetic layers FL efficient can be achieved.

Here, the above configuration can be used for a system LSI (semiconductor integrated circuit device) provided with other function blocks in addition to an MRAM circuit block and, in addition, it can be used for an MRAM device (semiconductor memory device) that contains a plurality of MTJ memory cell arrays. As a result of this, it becomes possible to make efficient the manufacturing process for a semiconductor device containing a plurality of MTJ memory cell arrays within the same chip.

Fifth Embodiment

In a fifth embodiment, wire design rules in an MRAM device for preventing erroneous data write due to magnetic noise are described.

Figure 23:
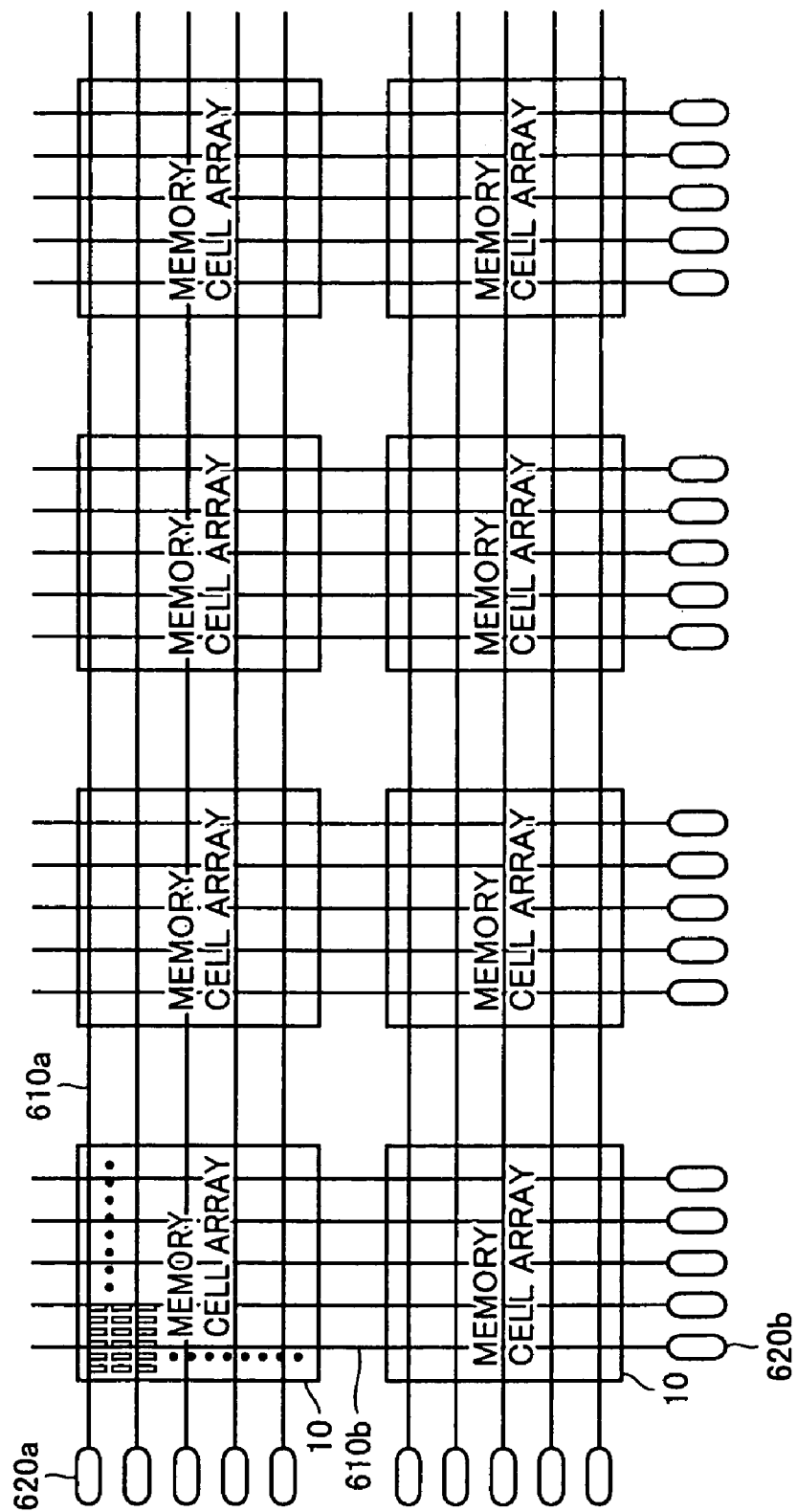
FIG. 23 is a conceptual diagram for describing a magnetic noise source that affects a memory cell array.

FIG. 23 is a conceptual diagram for describing magnetic noise sources that affect memory arrays. Wires arranged so as to correspond to other internal circuits 620a and 620b exist in a system LSI, or the like, on which an MRAM device is mounted. Wires 610a and 610b, from among the above described wires, provided in the same direction as bit lines BL or write digit lines WDL in the upper, or lower, region of a memory cell array 10 are representative magnetic noise sources. Wires 610a and 610b generally indicate a power supply line (wire), a signal line (wire), a data line (wire), and the like, through which constant, or transient, currents flow.

Figure 24:
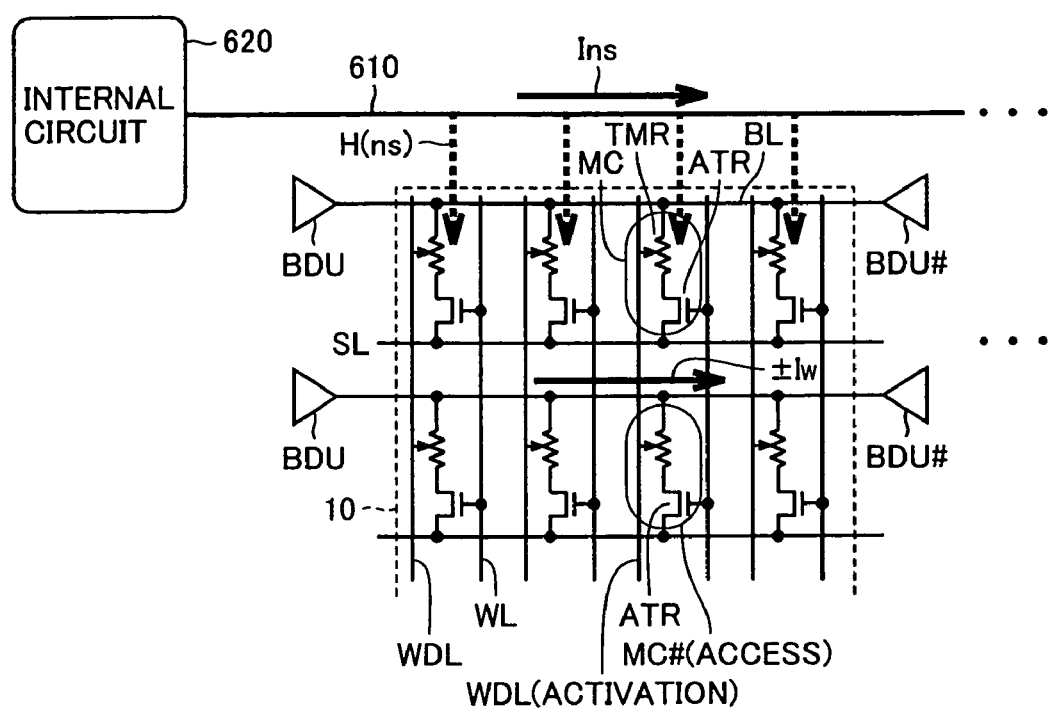
FIG. 24 is a conceptual diagram for describing the effect of magnetic noise on MTJ memory cells from a wire.

FIG. 24 is a conceptual diagram for describing the effects of magnetic noise from a wire connected to MTJ memory cells.

With reference to FIG. 24, write digit lines WDL and bit lines BL are arranged to supply a data write current to a plurality of normal memory cells MC arranged within MTJ memory cell array 10. As described above, data write currents are supplied to write digit line WDL and to bit line BL, respectively, corresponding to memory cell MC# selected as the access object. Concretely, a current in a predetermined direction is supplied to write digit line WDL in the selected row for generating a magnetic field along the hard axis (HA) in the memory cell group of the selected row. In addition, a current in a direction in accordance with the write data is supplied to bit line BL in the selected column by bit line drivers BDU and BDU# for generating a magnetic field along the easy axis (EA) in the memory cell group of the selected column.

Thereby, predetermined data write magnetic fields are applied to selected memory cell MC# in both the easy axis (EA) direction and in the hard axis (HA) direction. As a result of this, the sum of these data write magnetic fields reaches to a region outside of the asteroid characteristics curves shown in FIG. 41 and, thereby, data is written into selected memory cell MC#.

Wire 610 in the vicinity of the MTJ memory cell array represents, for example, wires 610a and 610b, shown in FIG. 23, and represents the wires other than the wires for generating data write magnetic fields, that is to say, other than bit lines BL and write digit lines WDL.

Such a constant, or transient, current Ins (hereinafter also referred to as "noise current") passing through wire 610 generates magnetic noise H(ns). That is to say, magnetic noise H(ns) caused by noise current Ins affects each normal memory cell MC. As a result of this, the risk of erroneous data write is enhanced, in particular, in non-selected memory cells in the proximity of wire 610 belonging to the same memory cell column or to the same memory cell row as selected memory cell MC#.

Figure 25:
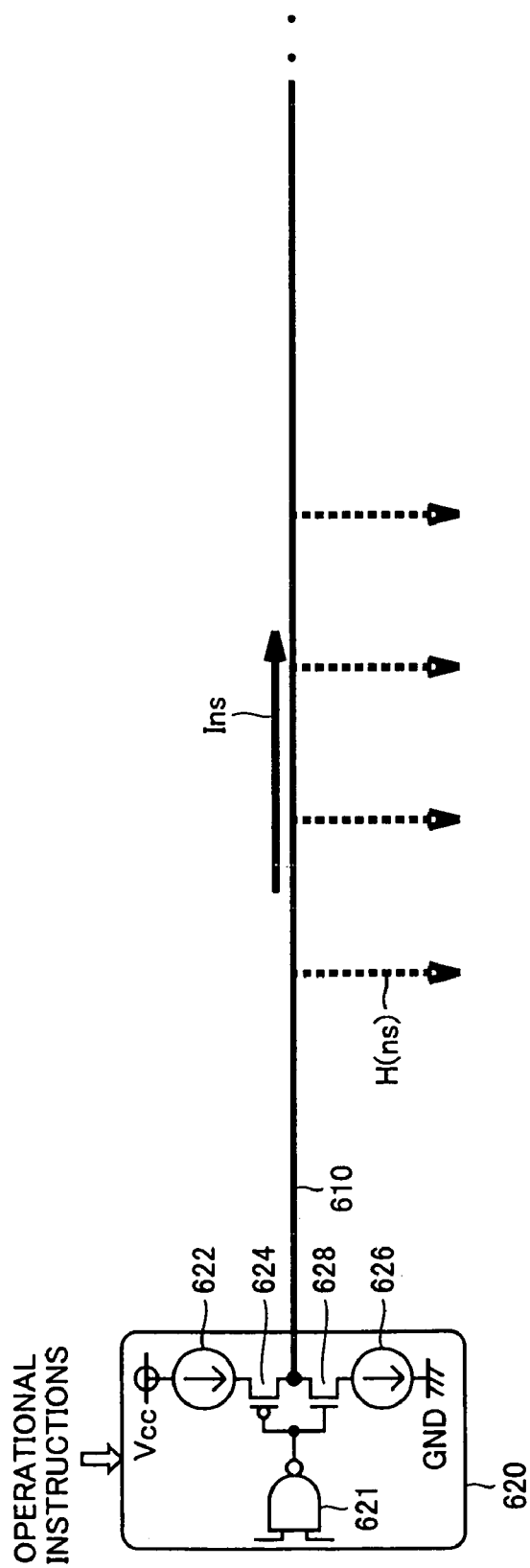
FIG. 25 is a circuit diagram showing the configuration for limiting a current from flowing through a wire that becomes a magnetic noise source.

FIG. 25 shows the configuration for limiting noise current Ins that flows through wire 610. In FIG. 25, internal circuit 620 is shown as a circuit having a function of driving the voltage of wire 610.

With reference to FIG. 25, internal circuit 620 has a logic gate 621, current sources 622 and 626, a P-channel MOS transistor 624 and an N-channel MOS transistor 628.

Current source 622 and P-channel MOS transistor 624 are arranged in series between power supply voltage Vcc and wire 610 while current source 626 and N-channel MOS transistor 628 are arranged in series between ground voltage GND and wire 610. An output of logic gate 621 is provided to the gates of P-channel MOS transistor 624 and N-channel MOS transistor 628, respectively. Accordingly, internal circuit 620 can connect wire 610 to either power supply voltage Vcc or to ground voltage GND in accordance with the output of logic gate 621 at the final stage.

In such a configuration, noise current Ins flowing through wire 610 can be limited in accordance with the amount of current supplied from current sources 622 and 626.

In addition, in the case that wire 610 does not transmits a constant current but, rather, transmits a voltage signal, noise current Ins flowing through wire 610 corresponds to a charging current or a discharging current that occurs at the time of the driving of this voltage signal. In this case, it is also possible to restrict noise current Ins by omitting current sources 622 and 626 and by limiting the current driving ability of P-channel MOS transistor 624 and N-channel MOS transistor 628 so as to reduce the rising/falling rate of the voltage in wire 610. The current driving ability of a transistor can be adjusted through design of the size of the transistor (ratio of gate length to gate width).

Figure 26:
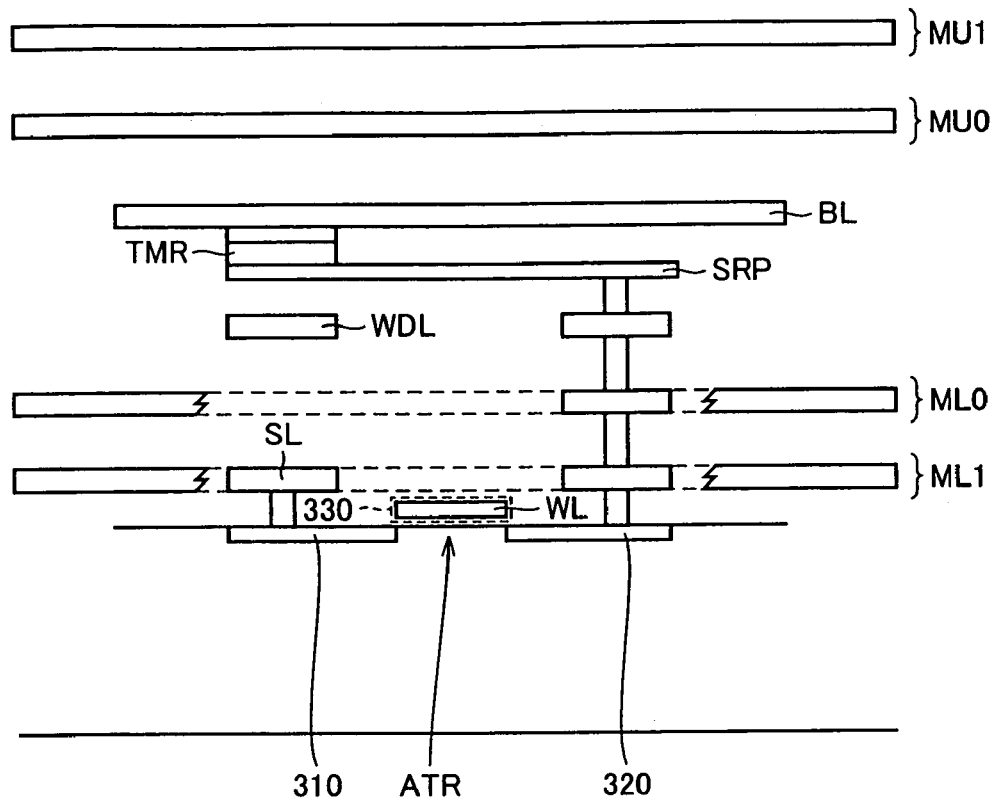
FIG. 26 is a cross sectional view for describing a layout of a group of wires shown in FIG. 24.

FIG. 26 is a cross sectional view for describing a layout of the wire group shown in FIG. 24.

With reference to FIG. 26, normal memory cell MC includes access transistor ATR and tunneling magneto-resistance element TMR as described above. Access transistor ATR has source region 310, drain region 320 and gate region 330 wherein word line WL is formed in gate region 330. Furthermore, drain region 320 is connected to tunneling magneto-resistance element TMR via strap SRP. Bit line BL is provided in a metal wire layer directly above tunneling magneto-resistance element TMR and is electrically coupled to tunneling magneto-resistance element TMR. In addition, write digit line WDL is provided in a metal wire layer directly beneath tunneling magneto-resistance element TMR. Here, though in the first embodiment an example of the configuration wherein source line SL for coupling source region 310 of access transistor ATR with ground voltage GND is formed by extending a diffusion layer, it is possible to provide a configuration wherein source line SL is formed of a metal wire, as shown in FIG. 26.

In addition to this wire group that directly affects the MTJ memory cell, a plurality of wires is provided using other metal wire layers. For example, additional metal wires are provided using metal wire layers ML0, ML1 . . . located in layers beneath write digit line WDL. Alternately, wires used for other purposes can be arranged in metal wire layers MU0, MU1 . . . formed in layers above the bit line.

Here, the relative width of the wire increases the higher or lower is the location of the respective metal wire layers. For example, it is possible to secure a wire width that is broader than that of the metal wire arranged in metal wire layer MU0 for the metal wire formed in metal wire layer MU1, which is the layer above metal wire layer MU0, In the same manner, when metal wire layers ML0 and ML1 are compared, it is possible to secure a wire width that is broader than that of the metal wire arranged in metal wire layer ML0 for the metal wire arranged in metal wire layer ML1.

Figure 27:
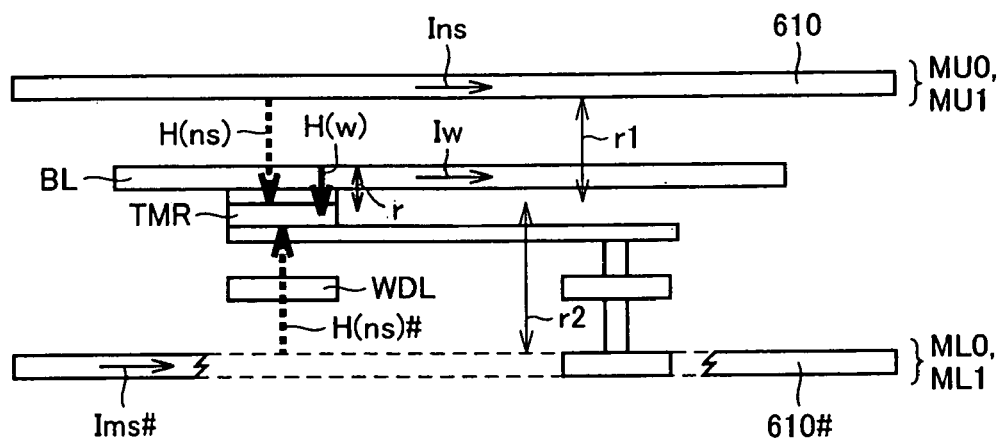
FIGS. 27–30 are first to fourth conceptual diagrams for describing a wire design rule according to a fifth embodiment, respectively.

FIG. 27 is a first conceptual diagram for describing wire design rules according to the fifth embodiment.

With reference to FIG. 27, wire 610 is arranged in metal wire layer MU0 or MU1, which is a layer above bit line BL. The distance between wire 610 and tunneling magneto-resistance element TMR is r1, and magnetic noise H(ns) affects tunneling magneto-resistance element TMR due to noise current Ins flowing through wire 610.

Wire 610# is arranged using metal wire layer ML0 or ML1, which is a layer below write digit line WDL, in the same manner as above. The distance between wire 610# and tunneling magneto-resistance element. TMR is denoted as r2 and magnetic noise H(ns)# affects tunneling magneto-resistance element TMR due to noise current Ins# flowing through wire 610#.

On the other hand, the distance between bit line BL and tunneling magneto-resistance element TMR is denoted as r, while the data write magnetic field that affects tunneling magneto-resistance element TMR due to data write current Iw passing through bit line BL is denoted as H(w).

It is necessary, at least, for data write magnetic field H(w) to be greater than the sum of magnetic noise H(ns) and H(ns)# in order to prevent erroneous data write from occurring in tunneling magneto-resistance element TMR. In order to satisfy such a relationship, it becomes necessary as a wire layout rule for wires 610 and 610#, which are not included in the wire group that directly affects the MTJ memory cells, to satisfy the relationship of Formula (1), wherein distances r1 and r2 are distances between these wires and the tunneling magneto-resistance element and wherein currents I(ns) and I(ns)#, respectively, pass through wires 610 and 610#.

$$(Iw/r) > (Ins/r1) + (Ins\#/r2) \quad (1)$$

Alternately, a predetermined intensity Hnr, which corresponds to an allowance of magnetic noise wherein erroneous data write does not occur, is used so that the wire design rule of Formula (2) is attained.

$$(Ins/r1) + (ns\#/r2) < Hnr \quad (2)$$

Here, predetermined intensity Hnr is set in each MTJ memory cell at a level wherein the magnetic direction of tunneling magneto-resistance element TMR is not switched due to the application of a magnetic field of a predetermined intensity Hnr, even in the case where a normal data write magnetic field is applied to an adjacent MTJ memory cell. That is to say, predetermined intensity Hnr corresponds to a margin for the asteroid curves shown in FIG. 41 in the case where a normal data write magnetic field is applied to an adjacent MTJ memory cell.

Here, data write current Iw as well as noise currents Ins and Ins# flowing through wires 610 and 610# depend on parameters such as wire width, resistivity, film thickness, and the like, of the corresponding wires in Formulas (1) and (2) and they are adjustable by means of the configuration shown in FIG. 25. Accordingly, it becomes possible to implement wire design rules that satisfy the above described Formulas (1) and (2) by means of selection of these wire parameters and positions of the wires, that is to say, of metal wire layers.

Figure 28:
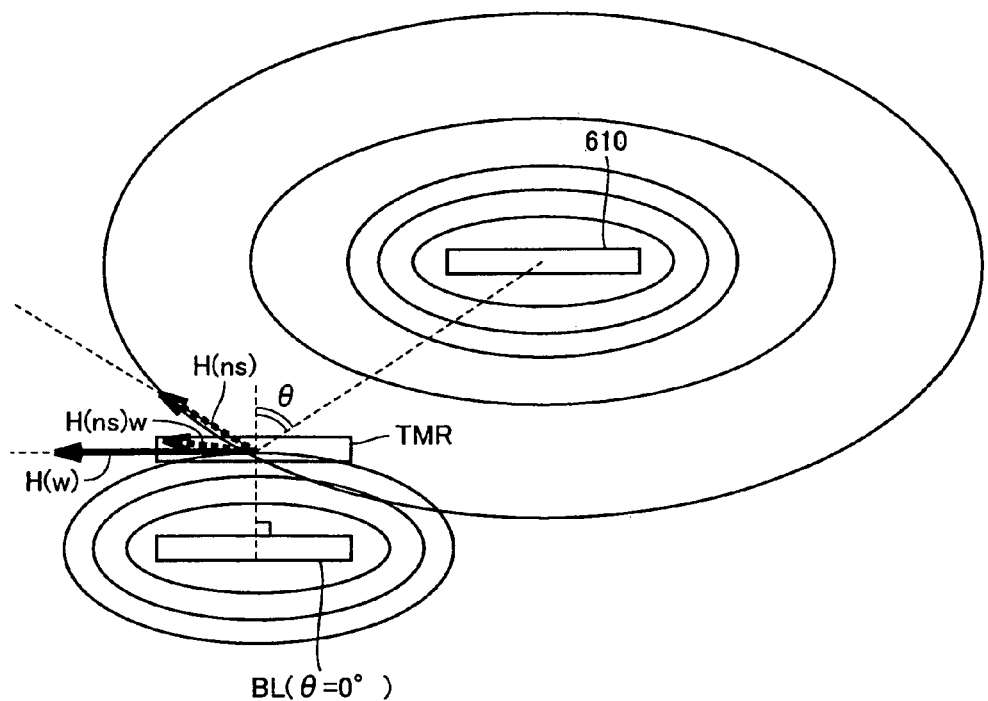

FIG. 28 is a second conceptual diagram for describing the wire design rules according to the fifth embodiment.

With reference to FIG. 28, the positional relationship between wire 610, which becomes a source of noise occurrence, and the MTJ memory cell (tunneling magneto-resistance element TMR) can, further, be included in the wire design rules.

In FIG. 28, an angle θ formed between the line connecting wire 610 and tunneling magneto-resistance element TMR, and the direction of the normal of tunneling magneto-resistance element TMR becomes a parameter indicating relative angular shift between the two in the application of a data write magnetic field. For example, bit line BL for the application of a sufficient data write magnetic field to tunneling magneto-resistance element TMR is arranged directly beneath (i.e., θ=0°) tunneling magneto-resistance element TMR.

When angle θ is a parameter, a component of magnetic noise H(ns), from wire 610, that causes erroneous data write, that is to say, component H(ns)w that works in the easy axis direction is provided as H(ns)w=H(ns)·cos θ. Accordingly, wire 610 arranged in a region above or below the memory cell array is arranged so as to, at least, avoid the region directly above or directly below an MTJ memory cell, that is to say, is arranged so that the above described angle θ≠0° and, thereby, magnetic noise that affects the MTJ memory cell can be reduced.

Formula (3) expressing a wire design parameter can be obtained by expanding the above described Formula (2) taking angle θ into consideration.

$$\Sigma\{H(ns)w\} = \Sigma\{(Ins/rn) \cdot \cos\theta\} < Hnr \quad (3)$$

The risk of the occurrence of the erroneous data write can be evaluated depending on whether or not the total sum of effective magnetic noise H(ns)w from wire 610, which is a noise source, exceeds predetermined intensity Hnr concerning an arbitrary MTJ memory cell (tunneling magneto-resistance element TMR) in accordance with Formula (3).

As described above, Ins indicates a noise current flowing through one wire 610, which becomes a noise source, rn indicates the distance between this wire 610 and tunneling magneto-resistance element TMR and θ indicates the relative angular shift between this wire 610 and tunneling magneto-resistance element TMR in Formula (3).

In addition, the sum of magnetic noise H(ns) and H(ns)w at any one point in time, that is to say, according to the same timing, is evaluated in Formulas (1) to (3). Accordingly, a design wherein wires causing a relatively great amount of magnetic noise, caused by noise currents, are designed to have differing phases (terms) is effective in restricting magnetic noise. Noise currents caused by an internal circuit for data write and by an internal circuit for data read have, for example, differing phases due to the difference in activation periods. That is to say, it is desirable to design wire locations by taking into consideration the timing according to which magnetic noise is caused.

In addition, simultaneously occurring magnetic noise affecting an MTJ memory cell (tunneling magneto-resistance element TMR) can be used for mutual cancellation by adjusting the positional relationship of the wires. Two wires 610, for example, arranged above (or below) an MTJ memory cell allow magnetic noise caused by the respective wires to be mutually canceled at the MTJ memory cell in the case where the noise currents flow through the respective wires in directions opposite to each other. In addition, two wires 610, respectively, arranged above and below an MTJ memory cell allow magnetic noise caused by the respective wires to be mutually canceled at the MTJ memory cell in the case where the noise currents flow through the respective wires in the same direction.

As described above, it is necessary to evaluate the risk of the occurrence of erroneous data write to an MTJ memory cell, taking into consideration the timing according to which magnetic noise occurs and the directions of the magnetic fields affecting the MTJ memory cell in accordance with the above described Formulas (1) to (3).

Here, though a case wherein wires that become noise sources are arranged in the same direction as bit lines BL, that is to say, a case wherein magnetic noise is caused in the direction of the easy axis (EA) of tunneling magneto-resistance element TMR is described with reference to FIGS. 26 to 28, it is also possible to use wire design rules in order to reduce noise in the wire group arranged in the direction of write digit lines WDL, that is to say, in the wire group wherein magnetic noise is caused along the hard axis (HA) of tunneling magneto-resistance element TMR in the same manner as above.

Figure 29:
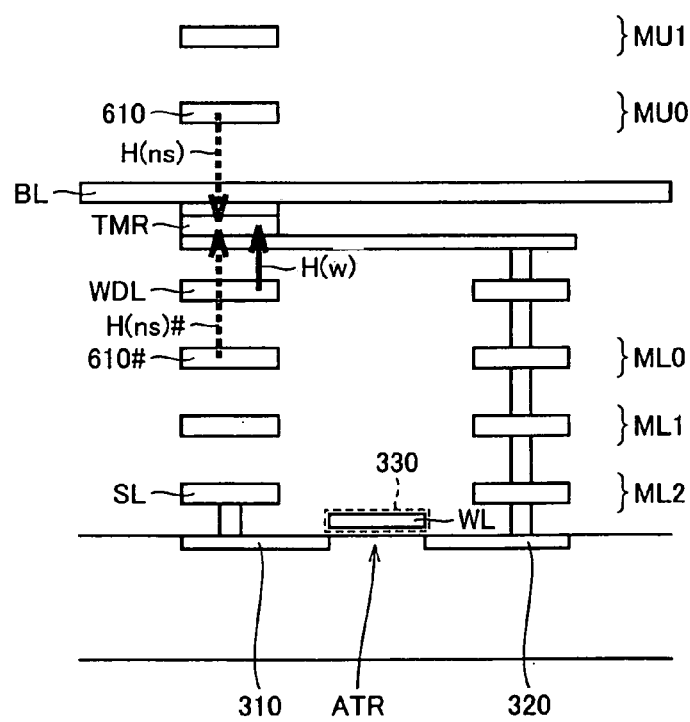
Figure 30:
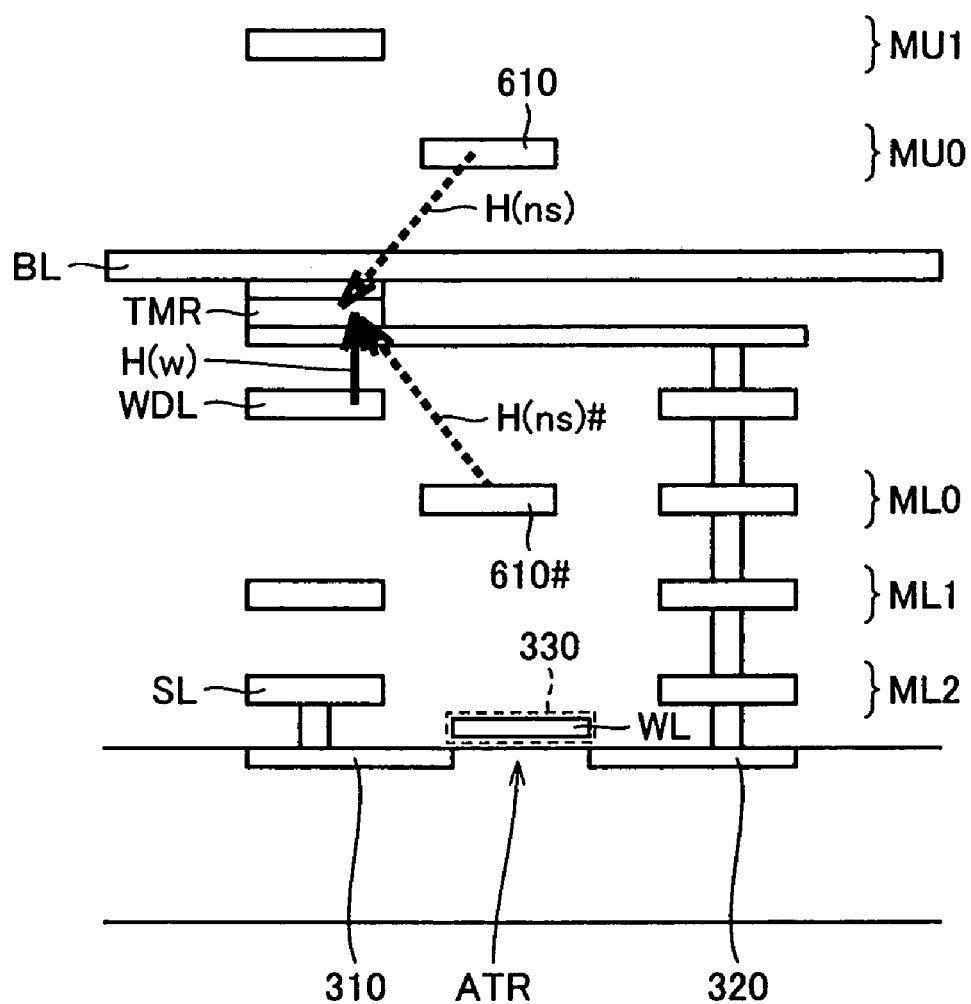

FIGS. 29 and 30 show an example of a configuration in the case where wires 610 and 610# are arranged in the same direction as write digit line WDL.

FIG. 29 shows an example of a configuration wherein wires 610 and 610# are arranged in regions directly above and directly below write digit line WDL while FIG. 30 shows an example of a configuration wherein wires 610 and 610# have a relative angular shift according to write digit line WDL.

In these cases, the wires are designed in the same manner as the descriptions of FIGS. 26 to 28 of Formulas (1) to (3) in regard to magnetic noise H(ns) from wire 610 arranged in a layer above bit line BL and magnetic noise H(ns)# from wire 610# arranged in a layer below write digit line WDL so that the same effects can be obtained.

Modification of Fifth Embodiment

Figure 31:
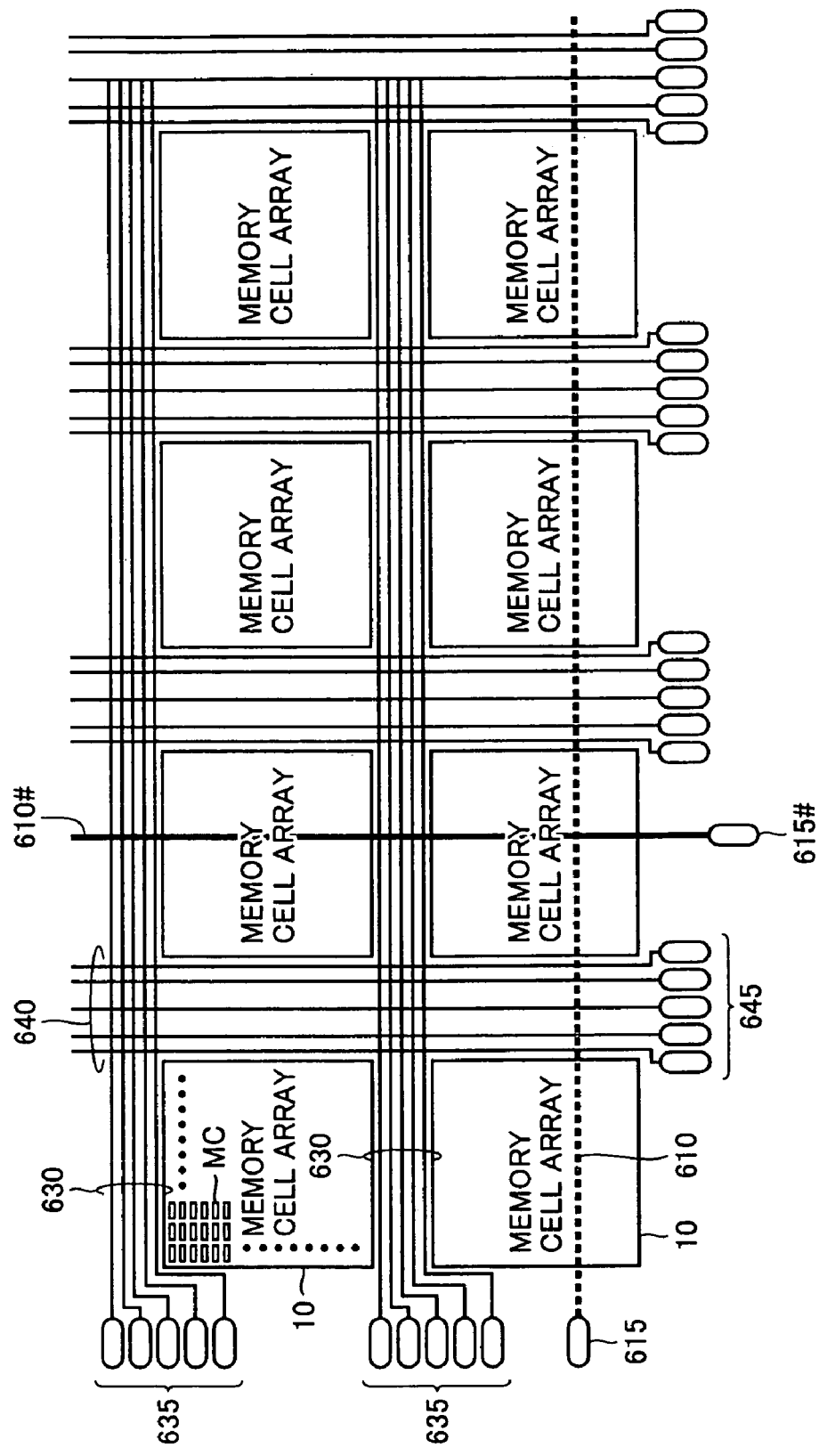
FIG. 31 is a conceptual diagram showing a wire design rule according to a modification of the fifth embodiment.

FIG. 31 is a conceptual diagram showing wire design rules according to a modification of the fifth embodiment.

With reference to FIG. 31, the wires that are not included in the wire group directly affecting the MTJ memory cells are categorized into wire 610 group arranged in regions directly above and directly below the MTJ memory cell array and wire 630 and 640 group arranged in regions other than the regions directly above and directly below the MTJ memory cell array. Wires 610, 610#, 630 and 640, respectively, are driven by signal line drivers 615, 615#, 635 and 645.

Furthermore, wires 610 and 610# arranged in regions directly above and directly below the MTJ memory cell array the wire design rules in regard to amounts of current passing through and the distance according to tunneling magneto-resistance element TMR, as described in the fifth embodiment and, in addition, are formed at least in regions other than regions directly above tunneling magneto-resistance elements TMR (metal wire layer in which bit lines BL are arranged) and other than metal wire layers directly below tunneling magneto-resistance elements TMR (metal wire layer in which write digit lines WDL are arranged), that is to say, are formed in layers below metal wire layer ML0 or in layers above metal wire layer MU0 in FIGS. 21 and 22.

Furthermore, only wires provided corresponding to rows and columns of the MTJ memory cells are arranged as wires 610 and 610#. Wires for shunting to achieve reduction in the resistance of source lines SL as well as upstream wires, such as main word lines, main bit lines, main write digit lines, or the like, in a hierarchical configuration of write digit lines WDL, bit lines BL and write digit lines WDL, for example, are used as wires 610 and 610#.

Other wires, such as wires 630 and 640, not necessarily provided corresponding to rows and columns of the MTJ memory cells are arranged in regions other than regions directly above or directly below the MTJ memory cell array. In addition, wires other than wires for data write (bit lines BL and write digit lines WDL) are arranged so as to avoid the same wire layers as the wires for data write in regions directly above and directly below the memory cell array, regardless of the types of wires.

The negative effects of magnetic noise, which are a cause of erroneous data write, can be restricted from affecting the MTJ memory cells in the MTJ memory cell array by using such wire design rules.

Sixth Embodiment

It is necessary to provide electrical paths, such as signal wires and power supply wires, for making electrical contacts with a plurality of circuit blocks, including an MRAM circuit block, in a system LSI (semiconductor integrated circuit device) provided with these circuit blocks. An example of a layout of such electrical paths wherein magnetic noise affecting the MRAM circuit block is taken into consideration is described in a sixth embodiment.

Figure 32:
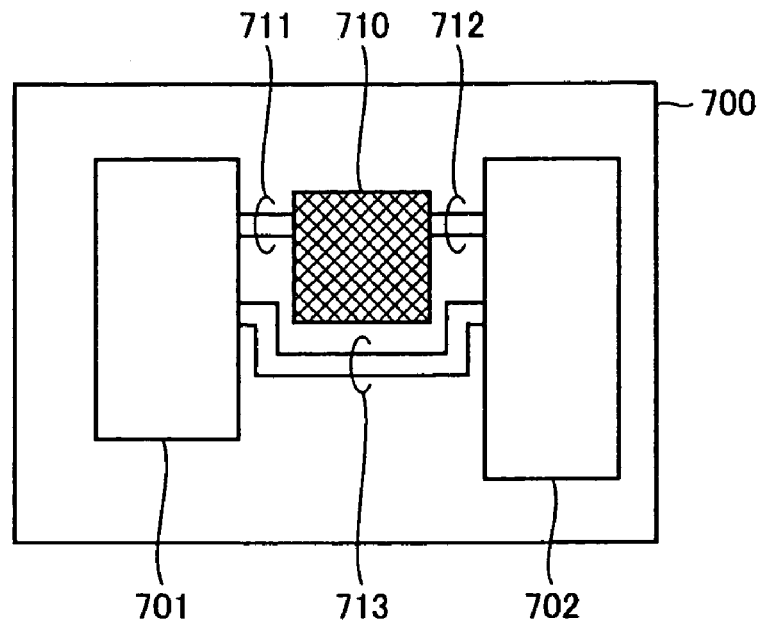
FIG. 32 is a schematic diagram for describing a first example of a system LSI shown as a semiconductor integrated circuit device according to a sixth embodiment.

With reference to FIG. 32, system LSI 700 according to the sixth embodiment is provided with a plurality of circuit blocks 701, 702 and 710. In particular, circuit block 710 is an MRAM circuit block containing MTJ memory cell arrays (not shown).

Wires 711 and 712 are provided as electrical paths between MRAM circuit block 710 and circuit blocks 701 and 702 for transmitting information such as signals and data to and from these circuit blocks. On the other hand, wire 713 provided as an electrical path between circuit blocks 701 and 702 for transmitting information such as signals and data is arranged so as to avoid regions above and below MRAM circuit block 710. In particular, the position of wire 713 is determined taking the position of the MTJ memory cell array in MRAM circuit block 710 into consideration.

In such a configuration, the effects of magnetic noise to MRAM circuit block 710 from wire 713, which becomes a magnetic noise source, can be reduced.

Figure 33:
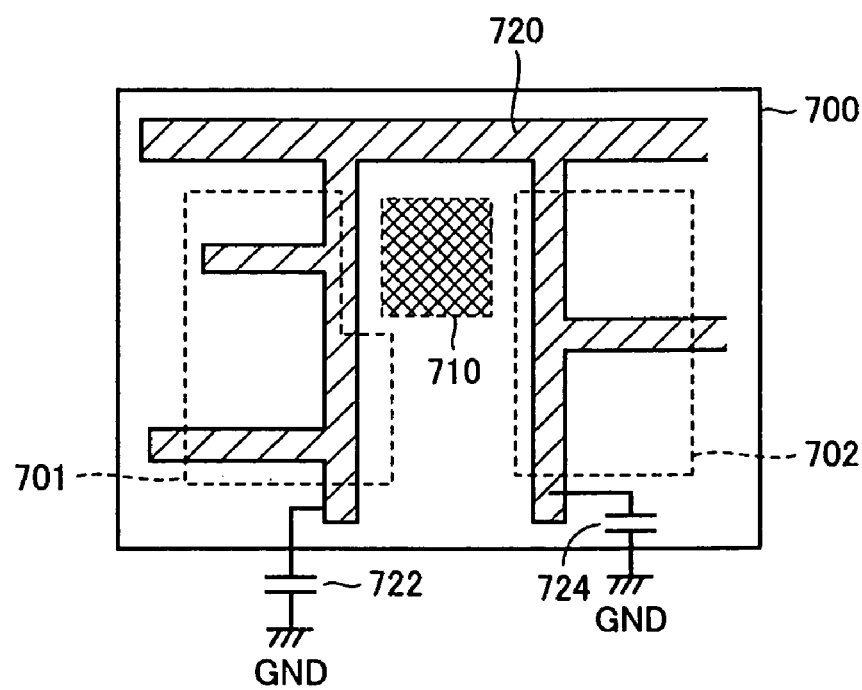
FIG. 33 is a schematic diagram for describing a second example of the system LSI according to the sixth embodiment.

FIG. 33 is a schematic diagram for describing another example of a configuration of a system LSI according to the sixth embodiment. FIG. 33 specifically shows a layout of power supply wires (line) shared by a plurality of circuit blocks.

With reference to FIG. 33, power supply wire (Line) 720, to be shared, is provided for circuit blocks 701 and 702 as well as for MRAM circuit block 710. Capacitors 722 and 724 for restricting the peak current and for stabilizing the level of the power supply voltage are provided between power supply wire 720 and ground voltage GND. The wiring pattern of power supply wire 720 is also designed so as to avoid regions above and below MRAM circuit block 710.

In such a configuration, the effects of magnetic noise from power supply wire 720, which becomes a noise source, on MRAM circuit block 710 can be reduced. It is necessary to provide such a power supply wire in the MRAM circuit block and an example of the layout of a power supply wire in the MRAM circuit block is described with reference to FIG. 34.

Figure 34:
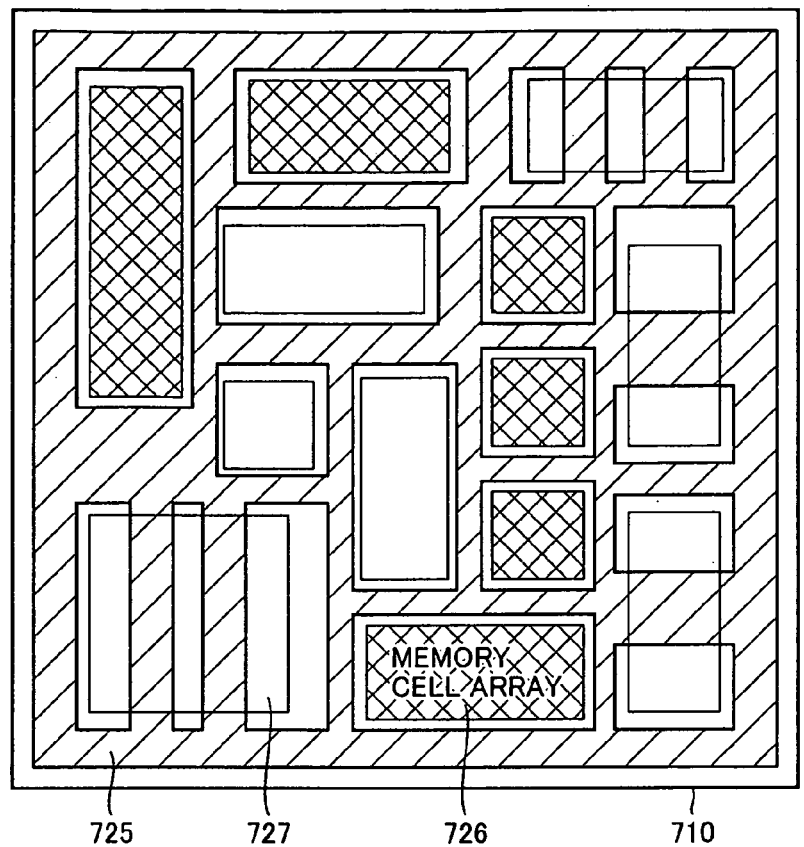
FIG. 34 is a conceptual diagram showing an example of a layout of power supply wires in an MRAM circuit block.

With reference to FIG. 34, MRAM circuit block 710 includes power supply wire (line) 725, a plurality of MTJ memory cell arrays 726 and peripheral circuits 727. Peripheral circuits 727 generally represent control circuit 12, row decoder 13, column decoder 14, write digit line drive circuit 15, bit line drive circuits 20, 21, and the like, that are shown in FIG. 1.

The wiring pattern of power supply wire 725 is designed so as to avoid regions above and below MTJ memory cell array 726. On the other hand, power supply wire 725 may be arranged in regions above and below peripheral circuits 727.

Figure 35:
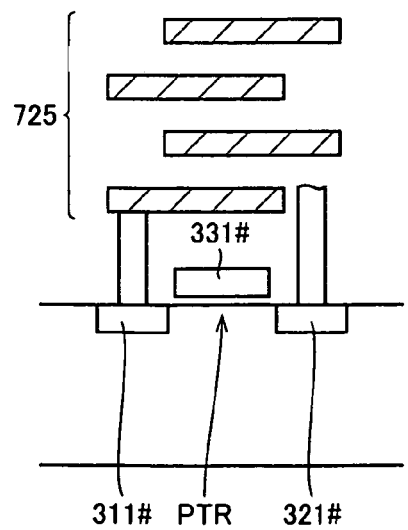
FIG. 35 is a diagram for describing a layout of power supply wires in a peripheral circuit region.

FIG. 35 is a diagram for describing the positions of the power supply wires in a peripheral circuit region.

With reference to FIG. 35, a peripheral circuit transistor PTR forming peripheral circuit 727 has source/drain regions 311# and 321# as well as gate electrode 331#. The wiring pattern of power supply wire 725 may be designed so as to pass through a region above peripheral circuit transistor PTR. Contrarily, the wiring pattern of power supply wire 725 is designed so as to avoid the above described structure in regions above MTJ memory cell array 726.

In such a configuration, the effects of magnetic noise from power supply wire 125, which becomes a noise source, on the MTJ memory cells can be reduced.

Figure 36:
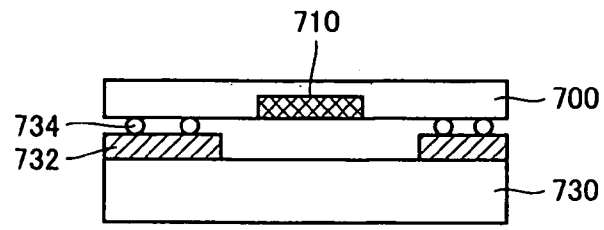
FIGS. 36 and 37 are schematic diagrams for describing a third example of the system LSI according to the sixth embodiment.
Figure 37:
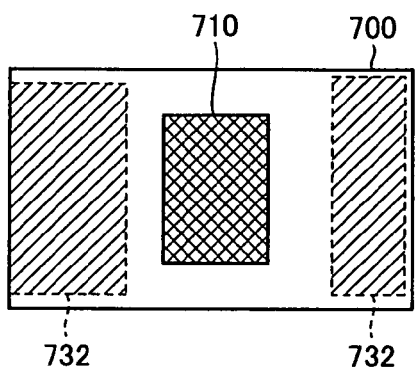

FIGS. 36 and 37 are schematic diagrams for describing the third example of a configuration of a system LSI according to the sixth embodiment.

With reference to FIG. 36, system LSI 700 is mounted on a die (substrate) 730 by means of wireless bonding using bumps 734. An increase in the speed of operation and a reduction in the chip area can be achieved by reducing wire delay by means of wireless bonding.

In such a configuration, bumps 734 electrically couple wiring pattern 732 provided on die 730 and pads (not shown) on system LSI 700. As shown in FIG. 37, which corresponds to the top view of FIG. 36, wiring pattern 732 is provided in positions other than regions below MRAM circuit block 710. Electrical paths for coupling system LSI 700 and die 730 are provided in positions other than regions above and below MRAM circuit block 710 in the above described manner and, thereby, the effects of magnetic noise on MRAM circuit block 710 can be reduced.

Figure 38:
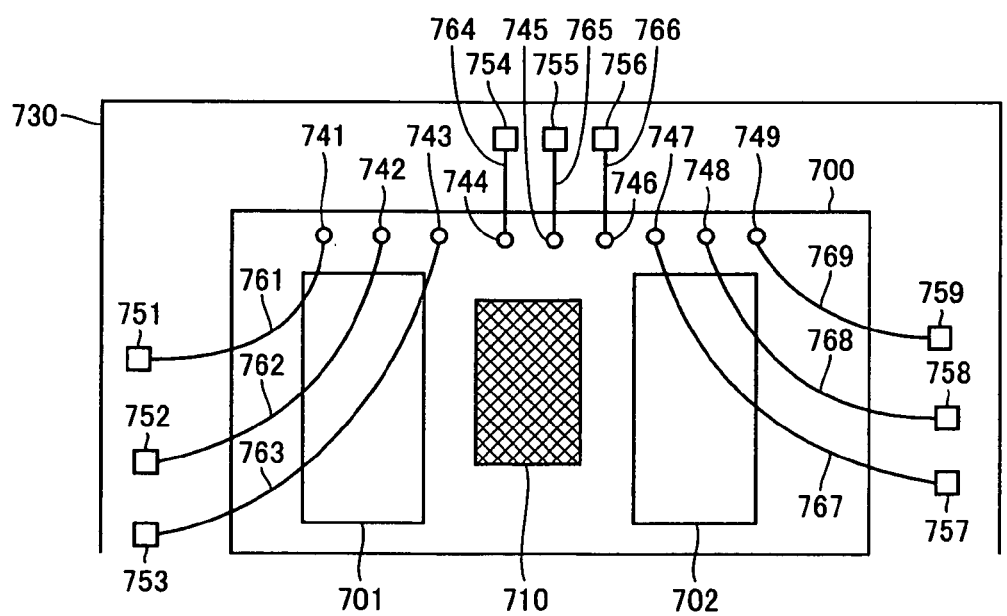
FIG. 38 is a schematic diagram for describing a fourth example of the system LSI according to the sixth embodiment.
Figure 39:
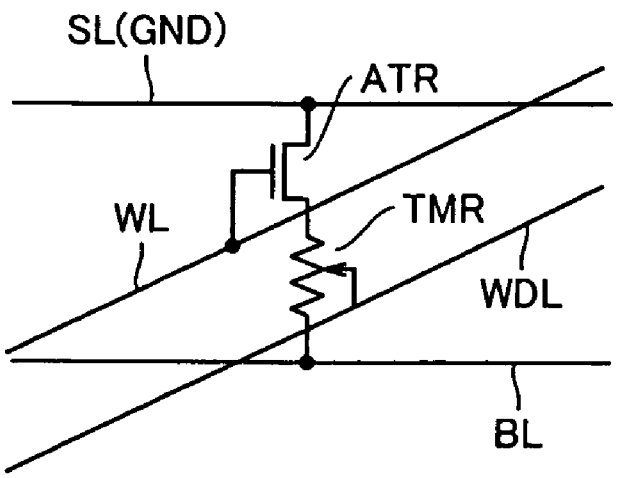
FIG. 39 is a schematic diagram showing the configuration of an MTJ memory cell.
Figure 40:
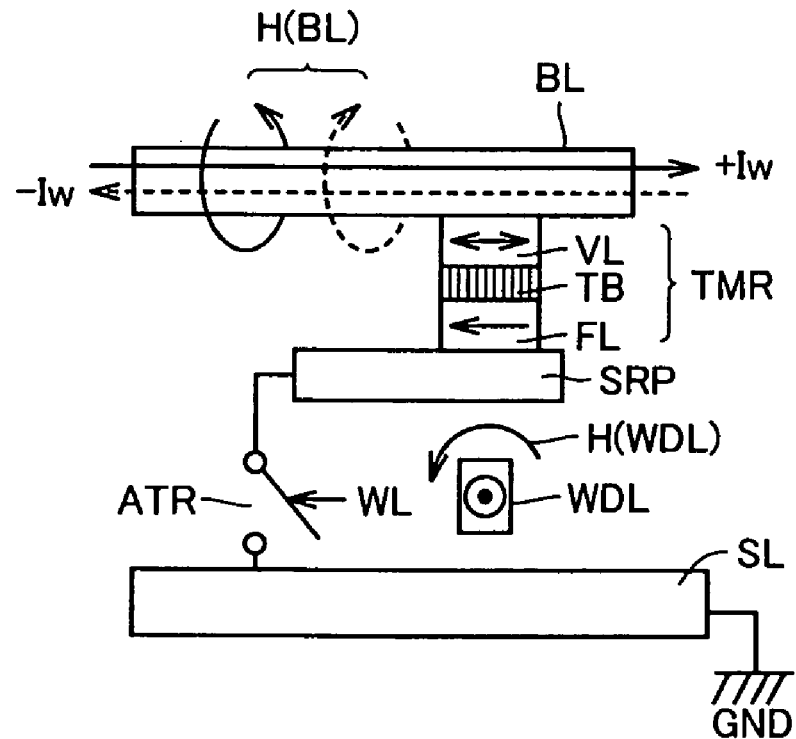
FIG. 40 is a conceptual diagram for describing a data write operation to an MTJ memory cell.
Figure 41:
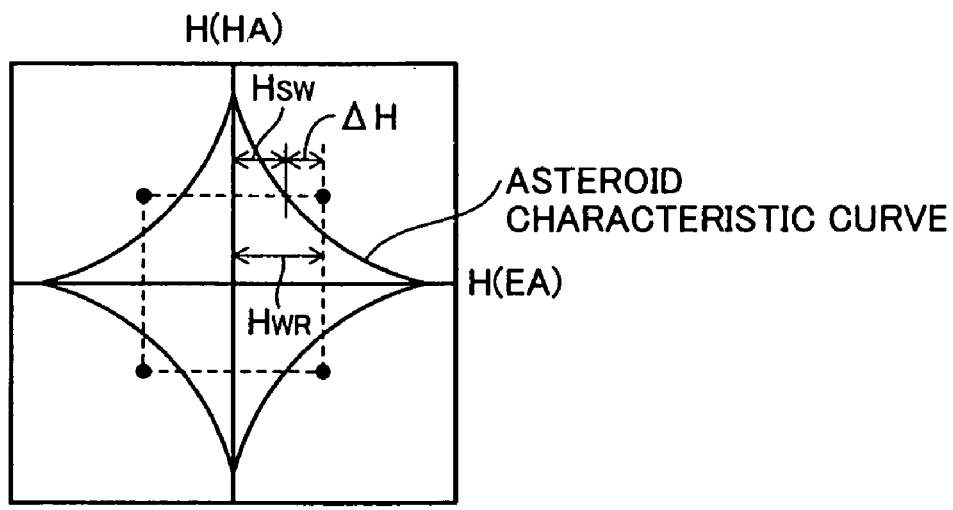
FIG. 41 is a conceptual diagram showing the relationship between the data write current and the condition of magnetization of an MTJ memory cell.

FIG. 38 is a conceptual diagram for describing the fourth example of a configuration of a system LSI according to the sixth embodiment.

With reference to FIG. 38, system LSI 700 is bonded to lead frames 751 to 759 on die 730. That is to say, pads 741 to 749 of system LSI 700 are electrically coupled to lead frames 751 to 759.

At this time, electrical paths 761 to 769, respectively, formed between pads 741 to 749 and lead frames 751 to 759 in order to couple system LSI 700 and die 730 are arranged so as to avoid regions above and below MRAM circuit block 710. On the other hand, electrical paths, such as electrical paths ~761 to 763, 767 and 768 provided in the above described manner, may pass through regions above and below circuit blocks 701 and 702 other than MRAM circuit block 710. Electrical paths 761 to 769 are, in general, formed of metal wires and, therefore, the positions of these metal wires are taken into consideration so as to implement the above described positioning of electrical paths.

In such a configuration, the effects of magnetic noise on MRAM circuit block 710 can be reduced in a system LSI mounted by means of wire bonding in the same manner as in a system LSI mounted by means of wireless bonding, shown in FIGS. 36 and 37.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device comprising:
a plurality of circuit blocks each including a memory cell array in which a plurality of magnetic memory cells is arranged, wherein
each of said magnetic memory cells has a magnetic memory element having a plurality of magnetic layers at least one of which is magnetized in the direction in accordance with storage data, and
said plurality of magnetic memory cells is arranged so that the easy axis of said magnetic memory element in each of said magnetic memory cell is oriented in the same direction relative to said plurality of circuit blocks; and wherein
each of said plurality of circuit blocks includes:
a plurality of first data write lines for selectively applying a data write magnetic field along the hard axis of said magnetic memory elements to said plurality of magnetic memory cells;
a plurality of second data write lines arranged in the direction crossing said plurality of first data write lines for selectively applying a data write magnetic field along said easy axis to said plurality of magnetic memory cells;
a first decoder circuit for making a selection from among said first data write lines; and
a second decoder circuit for making a selection from among said second data write lines, and
each of said plurality of first data write lines and each of said plurality of second data write lines, respectively, are arranged in the same direction relative to said plurality of circuit blocks; and
wherein
said magnetic memory element has a form which is point symmetric but is not line symmetric,
a first write current flowing in different directions in accordance with a level of write data is selectively supplied to said plurality of first data write lines,
a second write current flowing in the fixed direction regardless of said level of write data is selectively supplied to said plurality of second data write lines, and
said first and second decoder circuits are arranged so that the direction of said second write current relative to the direction of said first write current at each of said level of write data is oriented to be the same relative to said plurality of circuit blocks.

2. A semiconductor integrated circuit device comprising:
a plurality of circuit blocks each including a memory cell array in which a plurality of magnetic memory cells is arranged, wherein
each of said magnetic memory cells has a magnetic memory element having a plurality of magnetic layers at least one of which is magnetized in the direction in accordance with storage data, and
said plurality of magnetic memory cells is arranged so that the easy axis of said magnetic memory element in each of said magnetic memory cell is oriented in the same direction relative to said plurality of circuit blocks; and wherein
each of said plurality of circuit blocks includes:
a plurality of first data write lines for selectively applying a data write magnetic field along the hard axis of said magnetic memory elements to said plurality of magnetic memory cells;
a plurality of second data write lines arranged in the direction crossing said plurality of first data write lines for selectively applying a data write magnetic field along said easy axis to said plurality of magnetic memory cells;
a first decoder circuit for making a selection from among said first data write lines; and
a second decoder circuit for making a selection from among said second data write lines, and
each of said plurality of first data write lines and each of said plurality of second data write lines, respectively, are arranged in the same direction relative to said plurality of circuit blocks; and
wherein
said plurality of magnetic memory cells are arranged in a matrix in said memory cell array,
said plurality of first and second data write lines are arranged so as to, respectively, correspond to the rows and columns of said plurality of magnetic memory cells,
a first write current flowing in different directions in accordance with a level of write data is selectively supplied to said plurality of first data write lines,
a second write current flowing in the fixed direction regardless of said level of write data is selectively supplied to said plurality of second data write lines,
said magnetic memory element has a form that is point symmetric but is not line symmetric, and
said plurality of magnetic memory cells are arranged so that magnetic memory cells corresponding to adjacent first data write lines are in the relationship of mutually line symmetric and magnetic memory cells corresponding to same one of said first data write lines are in the same direction.

3. A semiconductor integrated circuit device comprising:
a plurality of circuit blocks each including a memory cell array in which a plurality of magnetic memory cells is arranged, wherein
each of said magnetic memory cells has a magnetic memory element having a plurality of magnetic layers at least one of which is magnetized in the direction in accordance with storage data, and
said plurality of magnetic cells is arranged so that the easy axis of said magnetic memory element in each of said magnetic memory cell is oriented in the same direction relative to said plurality of circuit blocks; and wherein
each of said plurality of circuit blocks includes:
a plurality of first data write lines for selectively applying a data write magnetic field along the hard axis of said magnetic memory elements to said plurality of magnetic memory cells;
a plurality of second data write lines arranged in the direction crossing said plurality of first data write lines for selectively applying a data write magnetic field along said easy axis to said plurality of magnetic memory cells;
a first decoder circuit for making a selection from among said first data write lines; and a second decoder circuit for making a selection from among said second data write lines, and each of said plurality of first data write lines and each of said plurality of second data write lines, respectively, are arranged in the same direction relative to said plurality of circuit blocks; and wherein a first write current flowing in different directions in accordance with a level of write data is selectively supplied to said plurality of first data write lines, a second write current flowing in the fixed direction regardless of said level of write data is selectively supplied to said plurality of second data write lines, said first and second decoder are arranged so that the direction of said second write current relative to the direction of said first write current at each of said level of write data is oriented to be the same relative to said plurality of circuit blocks, and the number of said first data write lines and the number of said second data write lines are specific to said memory cell array of each of said plurality of circuit blocks.

4. A semiconductor integrated circuit device comprising:

a plurality of circuit blocks each including a memory cell array in which a plurality of magnetic memory cells is arranged, wherein each of said magnetic memory cells has a magnetic memory element having a plurality of magnetic layers at least one of which is magnetized in the direction in accordance with storage data, and said plurality of magnetic memory cells is arranged so that the axis of said magnetic memory element in each of said magnetic memory cell is oriented in the same direction relative to said plurality of circuit blocks; and wherein each of said plurality of circuit blocks includes;

a plurality of first data write lines for selectively applying a data write magnetic field along the hard axis of said magnetic memory elements to said plurality of magnetic memory cells;

a plurality of second data write lines arranged in the direction crossing said plurality of first data write lines for selectively applying a data write magnetic field along said easy axis to said plurality of magnetic memory cells;

a first decoder circuit for making a selection from among said first data write lines; and a second decoder circuit for making a selection from among said second data write lines, and each of said plurality of first data write lines and each of said plurality of second data write lines, respectively, are arranged in the same direction relative to said plurality of circuit blocks; and wherein said plurality of magnetic memory cells are arranged in a matrix in said memory cell array, said plurality of first and second data write lines are arranged so as to, respectively, correspond to the rows and columns of said plurality of magnetic memory cells, a first write current flowing in different directions in accordance with a level of write data is selectively supplied to said plurality of first data write lines, a second write current flowing in the fixed direction regardless of said level of write data is selectively supplied to said plurality of second data write lines, said plurality of magnetic memory cells are arranged so that magnetic memory cells corresponding to adjacent first data write lines are in the relationship of mutually line symmetric and magnetic memory cells corresponding to same one of said first data write lines are in the same direction, and the number of said first data write lines and the number of said second data write lines are specific to said memory cell array of each of said plurality of circuit blocks.

5. The semiconductor integrated circuit according to claim 3, wherein said plurality of magnetic memory cells are arranged in a matrix in said memory cell array, and each of said plurality of circuit blocks is different from at least one of other circuit blocks in at least one of a number of rows and a number of columns of said magnetic memory cells included therein.

6. The semiconductor integrated circuit according to claim 4, wherein each of said plurality of circuit blocks is different from at least one of other circuit blocks in at least one of a number of rows and a number of columns of said magnetic memory cells included therein.

* * * * *